United States Patent
Wenzel et al.

(10) Patent No.: US 10,197,632 B2
(45) Date of Patent: Feb. 5, 2019

(54) ELECTRICAL ENERGY STORAGE SYSTEM WITH BATTERY POWER SETPOINT OPTIMIZATION USING PREDICTED VALUES OF A FREQUENCY REGULATION SIGNAL

(71) Applicant: Johnson Controls Technology Company, Plymouth, MI (US)

(72) Inventors: Michael J. Wenzel, Oak Creek, WI (US); Kirk H. Drees, Cedarburg, WI (US)

(73) Assignee: Taurus DES, LLC, Valhalla, NY (US)

( * ) Notice: Subject to any disclaimer, the term of this patent is extended or adjusted under 35 U.S.C. 154(b) by 53 days.

(21) Appl. No.: 15/247,777

(22) Filed: Aug. 25, 2016

(65) Prior Publication Data

US 2017/0102433 A1 Apr. 13, 2017

Related U.S. Application Data

(60) Provisional application No. 62/239,233, filed on Oct. 8, 2015, provisional application No. 62/239,231, filed (Continued)

(51) Int. Cl.
*G01R 31/36* (2006.01)
*G06Q 50/06* (2012.01)
(Continued)

(52) U.S. Cl.
CPC ....... *G01R 31/3651* (2013.01); *G05B 13/048* (2013.01); *G06Q 50/06* (2013.01);
(Continued)

(58) Field of Classification Search
CPC ...... G01R 31/3651; H02M 7/44; H02J 3/383; G05B 13/048
See application file for complete search history.

(56) References Cited

U.S. PATENT DOCUMENTS

| 4,349,869 A | 9/1982 | Prett et al. |
| 4,616,308 A | 10/1986 | Morshedi et al. |

(Continued)

FOREIGN PATENT DOCUMENTS

| CN | 102566435 B | 10/2013 |
| CN | 102891495 | 1/2016 |

(Continued)

OTHER PUBLICATIONS

Search Report for International Application No. PCT/US2016/056178, dated Jan. 25, 2017, 3 pages.
(Continued)

*Primary Examiner* — Robert A Cassity
(74) *Attorney, Agent, or Firm* — Foley & Lardner LLP

(57) ABSTRACT

A frequency response optimization includes a battery that stores and discharges electric power, a power inverter that uses battery power setpoints to control an amount of the electric power stored or discharged from the battery, and a frequency response controller. The frequency response controller receives a regulation signal from an incentive provider, predicts future values of the regulation signal, and uses the predicted values of the regulation signal to generate the battery power setpoints for the power inverter.

20 Claims, 12 Drawing Sheets

Related U.S. Application Data on Oct. 8, 2015, provisional application No. 62/239,131, filed on Oct. 8, 2015, provisional application No. 62/239,246, filed on Oct. 8, 2015, provisional application No. 62/239,249, filed on Oct. 8, 2015, provisional application No. 62/239,245, filed on Oct. 8, 2015.

(51) Int. Cl.

| *H02J 3/32* | (2006.01) |
|---|---|
| *G05B 13/04* | (2006.01) |
| *H02J 3/38* | (2006.01) |
| *H02M 7/44* | (2006.01) |
| *H02J 3/00* | (2006.01) |

(52) U.S. Cl.
CPC ............... *H02J 3/32* (2013.01); *H02J 3/383* (2013.01); *H02M 7/44* (2013.01); *H02J 2003/007* (2013.01); *Y02E 40/76* (2013.01); *Y02E 60/76* (2013.01); *Y04S 10/545* (2013.01); *Y04S 40/22* (2013.01)

(56) References Cited

U.S. PATENT DOCUMENTS

| 5,301,101 | A | | 4/1994 | MacArthur et al. |
|---|---|---|---|---|
| 5,347,446 | A | | 9/1994 | Iino et al. |
| 5,351,184 | A | | 9/1994 | Lu et al. |
| 5,408,406 | A | | 4/1995 | Mathur et al. |
| 5,442,544 | A | | 8/1995 | Jelinek |
| 5,519,605 | A | | 5/1996 | Cawlfield |
| 5,572,420 | A | | 11/1996 | Lu |
| 5,867,384 | A | * | 2/1999 | Drees ............... G05B 5/01 700/42 |
| 6,055,483 | A | | 4/2000 | Lu |
| 6,122,555 | A | | 9/2000 | Lu |
| 6,278,899 | B1 | | 8/2001 | Piche et al. |
| 6,347,254 | B1 | | 2/2002 | Lu |
| 6,459,939 | B1 | | 10/2002 | Hugo |
| 6,757,591 | B2 | | 6/2004 | Kramer |
| 6,807,510 | B1 | | 10/2004 | Backstrom et al. |
| 6,900,556 | B2 | * | 5/2005 | Provanzana ............... H02J 3/28 307/19 |
| 7,050,863 | B2 | | 5/2006 | Mehta et al. |
| 7,050,866 | B2 | | 5/2006 | Martin et al. |
| 7,113,890 | B2 | | 9/2006 | Frerichs et al. |
| 7,152,023 | B2 | | 12/2006 | Das |
| 7,165,399 | B2 | | 1/2007 | Stewart |
| 7,188,779 | B2 | | 3/2007 | Alles |
| 7,197,485 | B2 | | 3/2007 | Fuller |
| 7,203,554 | B2 | | 4/2007 | Fuller |
| 7,266,416 | B2 | | 9/2007 | Gallestey et al. |
| 7,272,454 | B2 | | 9/2007 | Wojsznis et al. |
| 7,275,374 | B2 | | 10/2007 | Stewart et al. |
| 7,328,074 | B2 | | 2/2008 | Das et al. |
| 7,328,577 | B2 | | 2/2008 | Stewart et al. |
| 7,376,471 | B2 | | 5/2008 | Das et al. |
| 7,376,472 | B2 | | 5/2008 | Wojsznis et al. |
| 7,389,773 | B2 | | 6/2008 | Stewart et al. |
| 7,400,933 | B2 | | 7/2008 | Rawlings et al. |
| 7,418,372 | B2 | | 8/2008 | Nishira et al. |
| 7,454,253 | B2 | | 11/2008 | Fan |
| 7,496,413 | B2 | | 2/2009 | Fan et al. |
| 7,577,483 | B2 | | 8/2009 | Fan et al. |
| 7,591,135 | B2 | | 9/2009 | Stewart |
| 7,610,108 | B2 | | 10/2009 | Boe et al. |
| 7,650,195 | B2 | | 1/2010 | Fan et al. |
| 7,664,573 | B2 | | 2/2010 | Ahmed |
| 7,676,283 | B2 | | 3/2010 | Liepold et al. |
| 7,826,909 | B2 | | 11/2010 | Attarwala |
| 7,827,813 | B2 | | 11/2010 | Seem |
| 7,839,027 | B2 | | 11/2010 | Shelton et al. |
| 7,844,352 | B2 | | 11/2010 | Vouzis et al. |
| 7,856,281 | B2 | | 12/2010 | Thiele et al. |
| 7,878,178 | B2 | | 2/2011 | Stewart et al. |
| 7,894,943 | B2 | | 2/2011 | Sloup et al. |
| 7,930,045 | B2 | | 4/2011 | Cheng |
| 7,945,352 | B2 | | 5/2011 | Koc |
| 7,949,416 | B2 | | 5/2011 | Fuller |
| 7,987,005 | B2 | * | 7/2011 | Rund ............... G05B 13/021 700/28 |
| 7,987,145 | B2 | | 7/2011 | Baramov |
| 7,996,140 | B2 | | 8/2011 | Stewart et al. |
| 8,005,575 | B2 | | 8/2011 | Kirchhof |
| 8,032,235 | B2 | | 10/2011 | Sayyar-Rodsari |
| 8,036,758 | B2 | | 10/2011 | Lu et al. |
| 8,046,089 | B2 | | 10/2011 | Renfro et al. |
| 8,060,258 | B2 | | 11/2011 | Butoyi |
| 8,060,290 | B2 | | 11/2011 | Stewart et al. |
| 8,073,659 | B2 | | 12/2011 | Gugaliya et al. |
| 8,078,291 | B2 | | 12/2011 | Pekar et al. |
| 8,096,140 | B2 | | 1/2012 | Seem |
| 8,105,029 | B2 | | 1/2012 | Egedal et al. |
| 8,109,255 | B2 | | 2/2012 | Stewart et al. |
| 8,121,818 | B2 | | 2/2012 | Gorinevsky |
| 8,126,575 | B2 | | 2/2012 | Attarwala |
| 8,145,329 | B2 | | 3/2012 | Pekar et al. |
| 8,180,493 | B1 | | 5/2012 | Laskow |
| 8,185,217 | B2 | | 5/2012 | Thiele |
| 8,200,346 | B2 | | 6/2012 | Thiele |
| 8,295,989 | B2 | | 10/2012 | Rettger et al. |
| 8,489,666 | B1 | | 7/2013 | Nikitin |
| 8,492,926 | B2 | | 7/2013 | Collins et al. |
| 8,495,888 | B2 | | 7/2013 | Seem |
| 8,583,520 | B1 | | 11/2013 | Forbes, Jr. |
| 8,600,561 | B1 | | 12/2013 | Modi et al. |
| 8,600,571 | B2 | | 12/2013 | Dillon et al. |
| 8,843,238 | B2 | | 9/2014 | Wenzel et al. |
| 8,901,411 | B2 | | 12/2014 | Liu et al. |
| 8,914,158 | B2 | | 12/2014 | Geinzer et al. |
| 8,922,056 | B2 | | 12/2014 | Thisted |
| 9,002,532 | B2 | | 4/2015 | Asmus |
| 9,002,761 | B2 | | 4/2015 | Montalvo |
| 9,061,599 | B2 | | 6/2015 | Sisk |
| 9,235,657 | B1 | | 1/2016 | Wenzel et al. |
| 2004/0095237 | A1 | | 5/2004 | Chen et al. |
| 2005/0062289 | A1 | | 3/2005 | Cho et al. |
| 2007/0080675 | A1 | | 4/2007 | Gray et al. |
| 2007/0087756 | A1 | | 4/2007 | Hoffberg |
| 2009/0094173 | A1 | | 4/2009 | Smith et al. |
| 2009/0254396 | A1 | | 10/2009 | Metcalfe |
| 2009/0313083 | A1 | | 12/2009 | Dillon et al. |
| 2009/0319090 | A1 | | 12/2009 | Dillon et al. |
| 2010/0087933 | A1 | | 4/2010 | Cheng |
| 2010/0198420 | A1 | | 8/2010 | Rettger et al. |
| 2010/0198421 | A1 | | 8/2010 | Fahimi et al. |
| 2010/0235004 | A1 | | 9/2010 | Thind |
| 2010/0269854 | A1 | | 10/2010 | Barbieri et al. |
| 2011/0022193 | A1 | | 1/2011 | Panaitescu |
| 2011/0060424 | A1 | | 3/2011 | Havlena |
| 2011/0060475 | A1 | | 3/2011 | Baldwin et al. |
| 2011/0066258 | A1 | | 3/2011 | Torzhkov et al. |
| 2011/0088000 | A1 | | 4/2011 | MacKay |
| 2011/0125293 | A1 | | 5/2011 | Havlena |
| 2011/0184565 | A1 | | 7/2011 | Peterson |
| 2011/0190958 | A1 | | 8/2011 | Hirst |
| 2011/0221276 | A1 | | 9/2011 | Geinzer et al. |
| 2011/0257789 | A1 | | 10/2011 | Stewart et al. |
| 2011/0264289 | A1 | | 10/2011 | Sawyer et al. |
| 2011/0276269 | A1 | | 11/2011 | Hummel |
| 2011/0301723 | A1 | | 12/2011 | Pekar et al. |
| 2012/0010757 | A1 | | 1/2012 | Francino et al. |
| 2012/0059351 | A1 | | 3/2012 | Nordh |
| 2012/0060505 | A1 | | 3/2012 | Fuller et al. |
| 2012/0083930 | A1 | | 4/2012 | Ilic et al. |
| 2012/0109620 | A1 | | 5/2012 | Gaikwad et al. |
| 2012/0116546 | A1 | | 5/2012 | Sayyar-Rodsari |
| 2012/0130555 | A1 | | 5/2012 | Jelinek |
| 2012/0143385 | A1 | | 6/2012 | Goldsmith |
| 2012/0215362 | A1 | | 8/2012 | Stagner |
| 2012/0232701 | A1 | | 9/2012 | Carty et al. |
| 2012/0261990 | A1 | | 10/2012 | Collins et al. |
| 2012/0323396 | A1 | | 12/2012 | Shelton et al. |

(56) References Cited

U.S. PATENT DOCUMENTS

| | | | |
|---|---|---|---|
| 2012/0326511 A1 | 12/2012 | Johnson | |
| 2013/0099565 A1* | 4/2013 | Sachs | H02J 3/46 |
| | | | 307/25 |
| 2013/0138285 A1* | 5/2013 | Bozchalui | G06Q 10/04 |
| | | | 701/22 |
| 2013/0154583 A1 | 6/2013 | Shi et al. | |
| 2013/0184884 A1 | 7/2013 | More et al. | |
| 2013/0204443 A1 | 8/2013 | Steven et al. | |
| 2013/0212410 A1 | 8/2013 | Li et al. | |
| 2013/0300194 A1 | 11/2013 | Palmer et al. | |
| 2013/0345880 A1 | 12/2013 | Asmus | |
| 2014/0037909 A1 | 2/2014 | Hawwa et al. | |
| 2014/0039709 A1 | 2/2014 | Steven et al. | |
| 2014/0049109 A1* | 2/2014 | Kearns | H02J 3/00 |
| | | | 307/52 |
| 2014/0052308 A1* | 2/2014 | Hanafusa | H02J 3/32 |
| | | | 700/295 |
| 2014/0089692 A1 | 3/2014 | Hanafusa | |
| 2014/0100810 A1 | 4/2014 | Nielsen | |
| 2014/0152009 A1 | 6/2014 | Meisner et al. | |
| 2014/0159491 A1 | 6/2014 | Kusunose | |
| 2014/0239722 A1 | 8/2014 | Arai et al. | |
| 2014/0279361 A1 | 9/2014 | Streeter et al. | |
| 2014/0336840 A1 | 11/2014 | Geinzer et al. | |
| 2014/0354239 A1 | 12/2014 | Miyazaki et al. | |
| 2014/0358316 A1 | 12/2014 | Shichiri | |
| 2015/0002105 A1 | 1/2015 | Kelly | |
| 2015/0008884 A1* | 1/2015 | Waki | H02J 3/32 |
| | | | 320/134 |
| 2015/0019034 A1 | 1/2015 | Gonatas | |
| 2015/0021991 A1 | 1/2015 | Wood et al. | |
| 2015/0045962 A1 | 2/2015 | Wenzel et al. | |
| 2015/0046221 A1 | 2/2015 | Narayan et al. | |
| 2015/0084339 A1 | 3/2015 | McDaniel et al. | |
| 2015/0088315 A1 | 3/2015 | Behrangrad | |
| 2015/0094870 A1 | 4/2015 | Fornage et al. | |
| 2015/0094968 A1 | 4/2015 | Jia et al. | |
| 2015/0127425 A1 | 5/2015 | Greene et al. | |
| 2015/0277467 A1 | 10/2015 | Steven et al. | |
| 2015/0283912 A1 | 10/2015 | Shimizu et al. | |
| 2016/0028234 A1* | 1/2016 | Watanabe | G05B 15/02 |
| | | | 700/291 |
| 2016/0047862 A1* | 2/2016 | Shimizu | H02J 3/00 |
| | | | 702/63 |
| 2016/0190810 A1 | 6/2016 | Bhavaraju et al. | |
| 2016/0241042 A1 | 8/2016 | Mammoli et al. | |
| 2016/0254671 A1 | 9/2016 | Cutright et al. | |
| 2016/0261116 A1 | 9/2016 | Barooah | |
| 2016/0315475 A1 | 10/2016 | Carlson et al. | |
| 2017/0060113 A1 | 3/2017 | Kaucic et al. | |
| 2017/0090440 A1 | 3/2017 | Eck et al. | |
| 2017/0104345 A1 | 4/2017 | Wenzel et al. | |

FOREIGN PATENT DOCUMENTS

| | | |
|---|---|---|
| EP | 2506380 | 10/2012 |
| EP | 2549617 | 1/2013 |
| EP | 2660943 | 11/2013 |
| EP | 2773008 | 9/2014 |
| EP | 2871742 | 5/2015 |
| JP | 2014-233096 | 12/2014 |
| WO | WO 02/15365 | 2/2002 |
| WO | WO-2010/042550 | 4/2010 |
| WO | WO-2010/057250 | 5/2010 |
| WO | WO-2010/094012 | 8/2010 |
| WO | WO-2011/080548 | 7/2011 |
| WO | WO-2012/122234 | 9/2012 |
| WO | WO 2013/063581 | 5/2013 |
| WO | WO-2014/016727 | 1/2014 |
| WO | WO 2015/019541 | 2/2015 |
| WO | WO 2015/139061 | 9/2015 |

OTHER PUBLICATIONS

U.S. Appl. No. 13/802,279, filed Mar. 13, 2013, Johnson Controls Technology Company.
Search Report and Written Opinion for International Application No. PCT/US2016/056165, dated Jan. 3, 2017, 13 pages.
Search Report and Written Opinion for International Application No. PCT/US2016/056167, dated Jan. 3, 2017, 12 pages.
Search Report and Written Opinion for International Application No. PCT/US2016/056169, dated Jan. 3, 2017, 12 pages.
Search Report and Written Opinion for International Application No. PCT/US2016/056170, dated Jan. 18, 2017, 12 pages.
Search Report and Written Opinion for International Application No. PCT/US2016/056179, dated Jan. 19, 2017, 10 pages.
Search Report and Written Opinion for International Application No. PCT/US2016/056182, dated Jan. 4, 2017, 13 pages.
Search Report and Written Opinion for International Application No. PCT/US2016/056183, dated Dec. 20, 2016, 13 pages.
Search Report and Written Opinion for International Application No. PCT/US2016/056184, dated Dec. 20, 2016, 13 pages.
Search Report and Written Opinion for International Application No. PCT/US2016/056186, dated Jan. 16, 2017, 10 pages.
Search Report and Written Opinion for International Application No. PCT/US2016/056187, dated Dec. 9, 2016, 12 pages.
Search Report and Written Opinion for International Application No. PCT/US2016/056189, dated Dec. 21, 2016, 11 pages.
Search Report and Written Opinion for International Application No. PCT/US2016/056190, dated Jan. 18, 2017, 10 pages.
Search Report and Written Opinion for International Application No. PCT/US2016/056192, dated Jan. 16, 2017, 11 pages.
Search Report for International Application No. PCT/US2016/056181, dated Jan. 26, 2017, 10 pages.
U.S. Appl. No. 13/802,154, filed Mar. 13, 2013, Johnson Controls Technology Company.
Extended European Search Report for EP Application No. 16154938.1, dated Jun. 23, 2016, 8 pages.
Extended European Search Report for EP Application No. 16154940.7, dated Jun. 30, 2016, 7 pages.
Hoke et al., Active Power Control of Photovoltaic Power Systems, 2013 1st IEEE Conference on Technologies for Sustainability (SusTech), Aug. 1-2, 2013, 8 pages.
Lopez-Martinez et al., Vision-Based System for the Safe Operation of a Solar Power Tower Plant, In Advances in Artificial Intelligence-IBERAMIA 2002, 8th Ibero-American Conference on Artificial Intelligence, Nov. 2002, Springer Berlin Heidelberg, 10 pages.
Sasikala et al., Coordinated Control and Strategy of Solar Photovoltaic Generators with MPPT and Battery Storage in Micro Grids, International Journal of Scientific Engineering and Technology Research, vol. 3, No. 46, Dec. 2014, 7 pages.
SMA Solar Technology AG, PV and Storage: Solutions with Potential-Energy on demand with the Sunny Central Storage, Brochure, Nov. 30, 2002, 8 pages.
U.S. Office Action on U.S. Appl. No. 15/247,784 dated Apr. 19, 2018. 7 pages.
U.S. Office Action on U.S. Appl. No. 15/247,788 dated May 7, 2018. 19 pages.
U.S. Office Action on U.S. Appl. No. 15/247,875 dated Feb. 8, 2018. 27 pages.
U.S. Office Action on U.S. Appl. No. 15/247,881 dated Mar. 8, 2018. 25 pages.
U.S. Office Action on U.S. Appl. No. 15/247,883 dated Mar. 21, 2018. 36 pages.
U.S. Office Action on U.S. Appl. No. 15/247,885 dated Apr. 16, 2018. 33 pages.
U.S. Office Action on U.S. Appl. No. 15/247,886 dated Feb. 9, 2018. 7 pages.
U.S. Office Action on U.S. Appl. No. 15/247,793 dated May 10, 2018. 9 pages.
U.S. Office Action on U.S. Appl. No. 15/247,880 dated May 11, 2018. 12 pages.

* cited by examiner

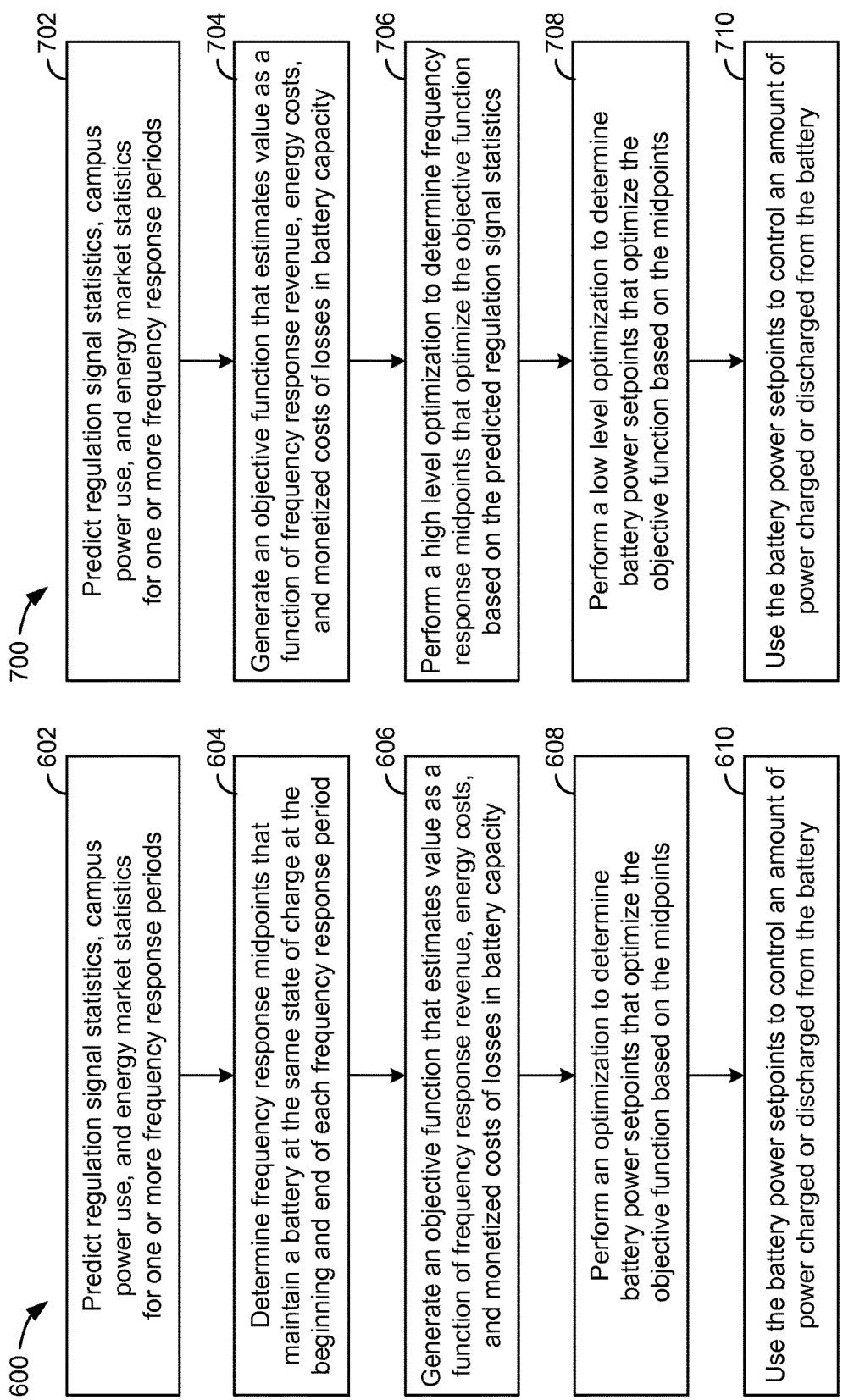

ELECTRICAL ENERGY STORAGE SYSTEM WITH BATTERY POWER SETPOINT OPTIMIZATION USING PREDICTED VALUES OF A FREQUENCY REGULATION SIGNAL

CROSS-REFERENCE TO RELATED PATENT APPLICATIONS

This application claims the benefit of and priority to U.S. Provisional Patent Application No. 62/239,131, U.S. Provisional Patent Application No. 62/239,231, U.S. Provisional Patent Application No. 62/239,233, U.S. Provisional Patent Application No. 62/239,245, U.S. Provisional Patent Application No. 62/239,246, and U.S. Provisional Patent Application No. 62/239,249, each of which has a filing date of Oct. 8, 2015. The entire disclosure of each of these patent applications is incorporated by reference herein.

BACKGROUND

The present disclosure relates generally to frequency response systems configured to add or remove electricity from an energy grid, and more particularly to a frequency response controller that determines optimal power setpoints for a battery power inverter in a frequency response system.

Stationary battery storage has several purposes when integrated with campus electrical distribution. For example, battery storage can be used to participate in a local frequency response program. Battery storage can be used to reduce the energy used during times when electricity is expensive and to reduce the electrical demand of a building to reduce the demand charge incurred.

Some frequency response programs allow participants to set the midpoint of regulation around which they must modify their load in response to a regulation signal. However, it is difficult and challenging to determine an optimal adjustment of the midpoint which allows the battery storage controller to actively participate in the frequency response market while also taking into account the energy and demand charge that will be incurred.

SUMMARY

One implementation of the present disclosure is a frequency response optimization system. The system includes a battery that stores and discharges electric power, a power inverter that uses battery power setpoints to control an amount of the electric power stored or discharged from the battery, and a frequency response controller. The frequency response controller receives a regulation signal from an incentive provider, predicts future values of the regulation signal, and uses the predicted values of the regulation signal to generate the battery power setpoints for the power inverter.

In some embodiments, the frequency response controller uses an autoregressive model to predict the future values of the regulation signal based on a history of past values of the regulation signal.

In some embodiments, the frequency response controller includes a low pass filter that filters the predicted values of the regulation signal. The frequency response controller may use the filtered values of the regulation signal to generate the battery power setpoints.

In some embodiments, the frequency response controller generates an objective function including an estimated amount of frequency response revenue that will result from the battery power setpoints and an estimated cost of battery degradation that will result from the battery power setpoints. In some embodiments, the frequency response controller uses dynamic programming to select scaling coefficients for the regulation signal and adjusts the scaling coefficients to achieve an optimal value for the objective function.

In some embodiments, the frequency response controller calculates a frequency response performance score that will result from the battery power setpoints and uses the frequency response performance score to estimate an amount of frequency response revenue that will result from the battery power setpoints.

In some embodiments, the frequency response controller uses a battery life model to estimate an amount of battery degradation that will result from the battery power setpoints and uses the estimated amount of battery degradation to determine a cost of the battery degradation. In some embodiments, the battery life model includes a plurality of variables that depend on the battery power setpoints. The variables may include at least one of a temperature of the battery, a state of charge of the battery, a depth of discharge of the battery, a power ratio of the battery, and an effort ratio of the battery.

In some embodiments, the frequency response controller comprises includes a high level controller and a low level controller. The high level controller may generate filter parameters based on the predicted values of the regulation signal. The low level controller may use the filter parameters to filter the predicted regulation signal and determine the optimal battery power setpoints using the filtered regulation signal.

In some embodiments, the system includes a campus having a campus power usage and a point of intersection at which the campus power usage combines with the electric power discharged from the battery. The frequency response controller may determine the optimal battery power setpoints based on both the campus power usage and the frequency response signal.

Another implementation of the present disclosure is a method for generating battery power setpoints in a frequency response optimization system. The method includes receiving a frequency regulation signal from an incentive provider, predicting future values of the frequency regulation signal, using the predicted values of the frequency regulation signal to generate battery power setpoints, providing the battery power setpoints to a power inverter, and using the battery power setpoints to control an amount of electric power stored or discharged by the battery in response to the frequency response signal.

In some embodiments, predicting future values of the frequency regulation signal comprises using an autoregressive model to predict the future values of the frequency regulation signal based on a history of past values of the frequency regulation signal.

In some embodiments, the method includes filtering the predicted values of the regulation signal using a low pass filter and using the filtered values of the regulation signal to generate the battery power setpoints.

In some embodiments, the method includes generating an objective function. The objective function may include an estimated amount of frequency response revenue that will result from the battery power setpoints and an estimated cost of battery degradation that will result from the battery power setpoints. In some embodiments, the method includes using dynamic programming to select scaling coefficients for the regulation signal and adjust the scaling coefficients to achieve an optimal value for the objective function.

In some embodiments, the method includes calculating a frequency response performance score that will result from the battery power setpoints and using the frequency response performance score to estimate an amount of frequency response revenue that will result from the battery power setpoints.

In some embodiments, the method includes using a battery life model to estimate an amount of battery degradation that will result from the battery power setpoints and using the estimated amount of battery degradation to determine a cost of the battery degradation. In some embodiments, the battery life model includes a plurality of variables that depend on the battery power setpoints. The variables may include at least one of a temperature of the battery, a state of charge of the battery, a depth of discharge of the battery, a power ratio of the battery, and an effort ratio of the battery.

In some embodiments, the method includes using a high level controller to generate filter parameters based on the predicted values of the regulation signal and using a low level controller to filter the predicted regulation signal based on the filter parameters and determine the optimal battery power setpoints using the filtered regulation signal.

In some embodiments, the frequency regulation system includes a campus having a campus power usage and a point of intersection at which the campus power usage combines with the electric power discharged from the battery. The method may further include determining the optimal battery power setpoints based on both the campus power usage and the frequency response signal.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

FIG. 6 is a flowchart of a process for determining frequency response midpoints and battery power setpoints that maintain the battery at the same state of charge at the beginning and end of each frequency response period, according to an exemplary embodiment.

FIG. 7 is a flowchart of a process for determining optimal frequency response midpoints and battery power setpoints in the presence of demand charges, according to an exemplary embodiment.

DETAILED DESCRIPTION

Frequency Response Optimization

Figure 1:
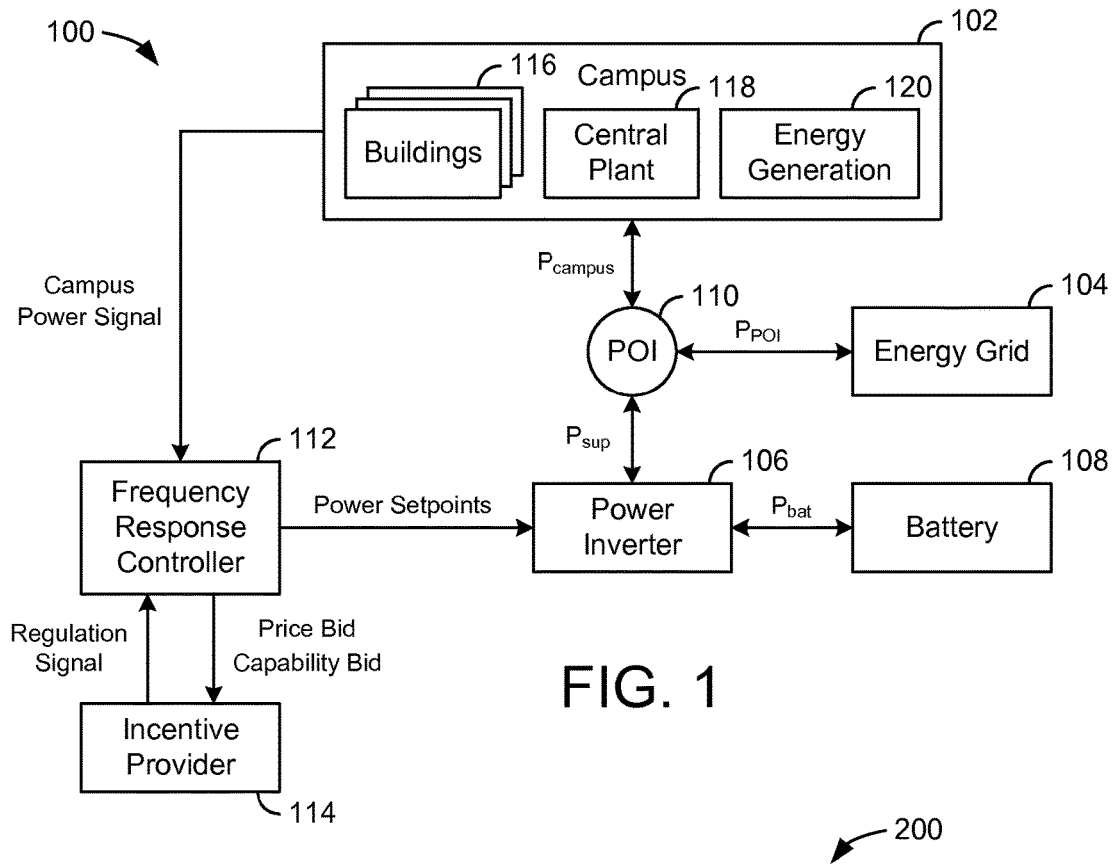
FIG. 1 is a block diagram of a frequency response optimization system, according to an exemplary embodiment.

Referring to FIG. 1, a frequency response optimization system 100 is shown, according to an exemplary embodiment. System 100 is shown to include a campus 102 and an energy grid 104. Campus 102 may include one or more buildings 116 that receive power from energy grid 104. Buildings 116 may include equipment or devices that consume electricity during operation. For example, buildings 116 may include HVAC equipment, lighting equipment, security equipment, communications equipment, vending machines, computers, electronics, elevators, or other types of building equipment. In some embodiments, buildings 116 are served by a building management system (BMS). A BMS is, in general, a system of devices configured to control, monitor, and manage equipment in or around a building or building area. A BMS can include, for example, a HVAC system, a security system, a lighting system, a fire alerting system, and/or any other system that is capable of managing building functions or devices. An exemplary building management system which may be used to monitor and control buildings 116 is described in U.S. patent application Ser. No. 14/717,593, titled "Building Management System for Forecasting Time Series Values of Building Variables" and filed May 20, 2015, the entire disclosure of which is incorporated by reference herein.

In some embodiments, campus 102 includes a central plant 118. Central plant 118 may include one or more subplants that consume resources from utilities (e.g., water, natural gas, electricity, etc.) to satisfy the loads of buildings 116. For example, central plant 118 may include a heater subplant, a heat recovery chiller subplant, a chiller subplant, a cooling tower subplant, a hot thermal energy storage (TES) subplant, and a cold thermal energy storage (TES) subplant, a steam subplant, and/or any other type of subplant configured to serve buildings 116. The subplants may be configured to convert input resources (e.g., electricity, water, natural gas, etc.) into output resources (e.g., cold water, hot water, chilled air, heated air, etc.) that are provided to buildings 116. An exemplary central plant which may be used to satisfy the loads of buildings 116 is described U.S. patent application Ser. No. 14/634,609, titled "High Level Central Plant Optimization" and filed Feb. 27, 2015, the entire disclosure of which is incorporated by reference herein.

In some embodiments, campus 102 includes energy generation 120. Energy generation 120 may be configured to generate energy that can be used by buildings 116, used by central plant 118, and/or provided to energy grid 104. In some embodiments, energy generation 120 generates electricity. For example, energy generation 120 may include an electric power plant, a photovoltaic energy field, or other types of systems or devices that generate electricity. The electricity generated by energy generation 120 can be used internally by campus 102 (e.g., by buildings 116 and/or campus 118) to decrease the amount of electric power that campus 102 receives from outside sources such as energy grid 104 or battery 108. If the amount of electricity generated by energy generation 120 exceeds the electric power demand of campus 102, the excess electric power can be provided to energy grid 104 or stored in battery 108. The power output of campus 102 is shown in FIG. 1 as $P_{campus}$. $P_{campus}$ may be positive if campus 102 is outputting electric power or negative if campus 102 is receiving electric power.

Still referring to FIG. 1, system 100 is shown to include a power inverter 106 and a battery 108. Power inverter 106 may be configured to convert electric power between direct current (DC) and alternating current (AC). For example, battery 108 may be configured to store and output DC power, whereas energy grid 104 and campus 102 may be configured to consume and generate AC power. Power inverter 106 may be used to convert DC power from battery 108 into a sinusoidal AC output synchronized to the grid frequency of energy grid 104. Power inverter 106 may also be used to convert AC power from campus 102 or energy grid 104 into DC power that can be stored in battery 108. The power output of battery 108 is shown as $P_{bat}$. $P_{bat}$ may be positive if battery 108 is providing power to power inverter 106 or negative if battery 108 is receiving power from power inverter 106.

In some instances, power inverter 106 receives a DC power output from battery 108 and converts the DC power output to an AC power output that can be fed into energy grid 104. Power inverter 106 may synchronize the frequency of the AC power output with that of energy grid 104 (e.g., 50 Hz or 60 Hz) using a local oscillator and may limit the voltage of the AC power output to no higher than the grid voltage. In some embodiments, power inverter 106 is a resonant inverter that includes or uses LC circuits to remove the harmonics from a simple square wave in order to achieve a sine wave matching the frequency of energy grid 104. In various embodiments, power inverter 106 may operate using high-frequency transformers, low-frequency transformers, or without transformers. Low-frequency transformers may convert the DC output from battery 108 directly to the AC output provided to energy grid 104. High-frequency transformers may employ a multi-step process that involves converting the DC output to high-frequency AC, then back to DC, and then finally to the AC output provided to energy grid 104.

System 100 is shown to include a point of interconnection (POI) 110. POI 110 is the point at which campus 102, energy grid 104, and power inverter 106 are electrically connected. The power supplied to POI 110 from power inverter 106 is shown as $P_{sup}$. $P_{sup}$ may be defined as $P_{bat}+P_{loss}$, where $P_{batt}$ is the battery power and $P_{loss}$ is the power loss in the battery system (e.g., losses in power inverter 106 and/or battery 108). $P_{sup}$ may be positive is power inverter 106 is providing power to POI 110 or negative if power inverter 106 is receiving power from POI 110. $P_{campus}$ and $P_{sup}$ combine at POI 110 to form $P_{POI}$. $P_{POI}$ may be defined as the power provided to energy grid 104 from POI 110. $P_{POI}$ may be positive if POI 110 is providing power to energy grid 104 or negative if POI 110 is receiving power from energy grid 104.

Still referring to FIG. 1, system 100 is shown to include a frequency response controller 112. Controller 112 may be configured to generate and provide power setpoints to power inverter 106. Power inverter 106 may use the power setpoints to control the amount of power $P_{sup}$ provided to POI 110 or drawn from POI 110. For example, power inverter 106 may be configured to draw power from POI 110 and store the power in battery 108 in response to receiving a negative power setpoint from controller 112. Conversely, power inverter 106 may be configured to draw power from battery 108 and provide the power to POI 110 in response to receiving a positive power setpoint from controller 112. The magnitude of the power setpoint may define the amount of power $P_{sup}$ provided to or from power inverter 106. Controller 112 may be configured to generate and provide power setpoints that optimize the value of operating system 100 over a time horizon.

In some embodiments, frequency response controller 112 uses power inverter 106 and battery 108 to perform frequency regulation for energy grid 104. Frequency regulation is the process of maintaining the stability of the grid frequency (e.g., 60 Hz in the United States). The grid frequency may remain stable and balanced as long as the total electric supply and demand of energy grid 104 are balanced. Any deviation from that balance may result in a deviation of the grid frequency from its desirable value. For example, an increase in demand may cause the grid frequency to decrease, whereas an increase in supply may cause the grid frequency to increase. Frequency response controller 112 may be configured to offset a fluctuation in the grid frequency by causing power inverter 106 to supply energy from battery 108 to energy grid 104 (e.g., to offset a decrease in grid frequency) or store energy from energy grid 104 in battery 108 (e.g., to offset an increase in grid frequency).

In some embodiments, frequency response controller 112 uses power inverter 106 and battery 108 to perform load shifting for campus 102. For example, controller 112 may cause power inverter 106 to store energy in battery 108 when energy prices are low and retrieve energy from battery 108 when energy prices are high in order to reduce the cost of electricity required to power campus 102. Load shifting may also allow system 100 reduce the demand charge incurred. Demand charge is an additional charge imposed by some utility providers based on the maximum power consumption during an applicable demand charge period. For example, a demand charge rate may be specified in terms of dollars per unit of power (e.g., $/kW) and may be multiplied by the peak power usage (e.g., kW) during a demand charge period to calculate the demand charge. Load shifting may allow system 100 to smooth momentary spikes in the electric demand of campus 102 by drawing energy from battery 108 in order to reduce peak power draw from energy grid 104, thereby decreasing the demand charge incurred.

Still referring to FIG. 1, system 100 is shown to include an incentive provider 114. Incentive provider 114 may be a utility (e.g., an electric utility), a regional transmission organization (RTO), an independent system operator (ISO), or any other entity that provides incentives for performing frequency regulation. For example, incentive provider 114 may provide system 100 with monetary incentives for participating in a frequency response program. In order to participate in the frequency response program, system 100 may maintain a reserve capacity of stored energy (e.g., in battery 108) that can be provided to energy grid 104. System 100 may also maintain the capacity to draw energy from energy grid 104 and store the energy in battery 108. Reserving both of these capacities may be accomplished by managing the state of charge of battery 108.

Frequency response controller 112 may provide incentive provider 114 with a price bid and a capability bid. The price bid may include a price per unit power (e.g., $/MW) for reserving or storing power that allows system 100 to participate in a frequency response program offered by incentive provider 114. The price per unit power bid by frequency response controller 112 is referred to herein as the "capability price." The price bid may also include a price for actual performance, referred to herein as the "performance price." The capability bid may define an amount of power (e.g., MW) that system 100 will reserve or store in battery 108 to perform frequency response, referred to herein as the "capability bid."

Incentive provider 114 may provide frequency response controller 112 with a capability clearing price $CP_{cap}$, a performance clearing price $CP_{perf}$, and a regulation award $Reg_{award}$, which correspond to the capability price, the performance price, and the capability bid, respectively. In some embodiments, $CP_{cap}$, $CP_{perf}$, and $Reg_{award}$ are the same as the corresponding bids placed by controller 112. In other embodiments, $CP_{cap}$, $CP_{perf}$, and $Reg_{award}$ may not be the same as the bids placed by controller 112. For example, $CP_{cap}$, $CP_{perf}$, and $Reg_{award}$ may be generated by incentive provider 114 based on bids received from multiple participants in the frequency response program. Controller 112 may use $CP_{cap}$, $CP_{perf}$, and $Reg_{award}$ to perform frequency regulation, described in greater detail below.

Frequency response controller 112 is shown receiving a regulation signal from incentive provider 114. The regulation signal may specify a portion of the regulation award $Reg_{award}$ that frequency response controller 112 is to add or remove from energy grid 104. In some embodiments, the regulation signal is a normalized signal (e.g., between −1 and 1) specifying a proportion of $Reg_{award}$. Positive values of the regulation signal may indicate an amount of power to add to energy grid 104, whereas negative values of the regulation signal may indicate an amount of power to remove from energy grid 104.

Frequency response controller 112 may respond to the regulation signal by generating an optimal power setpoint for power inverter 106. The optimal power setpoint may take into account both the potential revenue from participating in the frequency response program and the costs of participation. Costs of participation may include, for example, a monetized cost of battery degradation as well as the energy and demand charges that will be incurred. The optimization may be performed using sequential quadratic programming, dynamic programming, or any other optimization technique.

In some embodiments, controller 112 uses a battery life model to quantify and monetize battery degradation as a function of the power setpoints provided to power inverter 106. Advantageously, the battery life model allows controller 112 to perform an optimization that weighs the revenue generation potential of participating in the frequency response program against the cost of battery degradation and other costs of participation (e.g., less battery power available for campus 102, increased electricity costs, etc.). An exemplary regulation signal and power response are described in greater detail with reference to FIG. 2.

Figure 2:
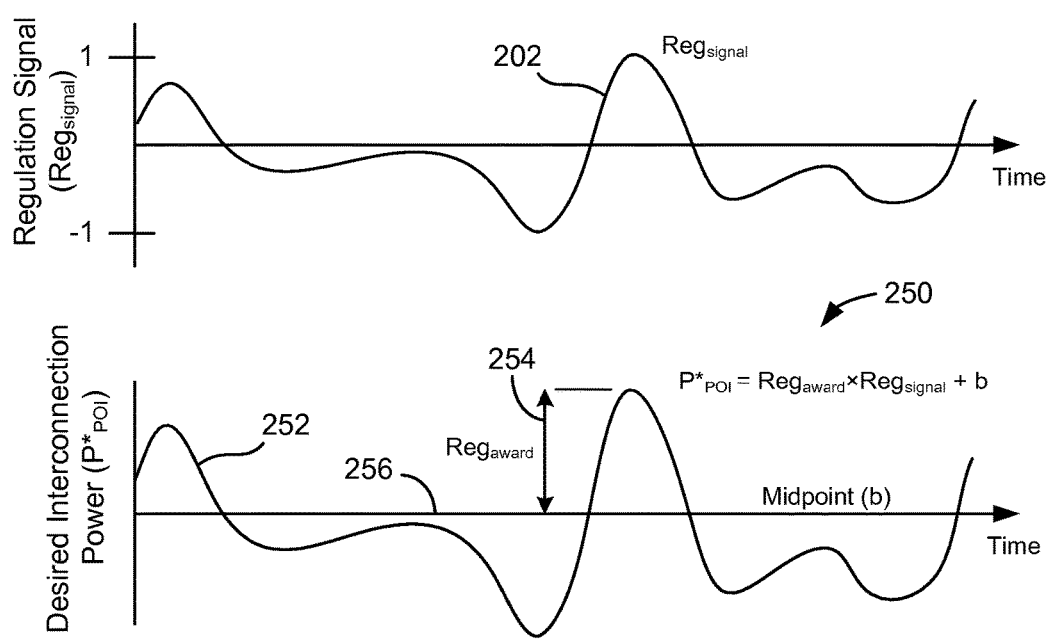
FIG. 2 is a graph of a regulation signal which may be provided to the system of FIG. 1 and a frequency response signal which may be generated by the system of FIG. 1, according to an exemplary embodiment.

Referring now to FIG. 2, a pair of frequency response graphs 200 and 250 are shown, according to an exemplary embodiment. Graph 200 illustrates a regulation signal $Reg_{signal}$ 202 as a function of time. $Reg_{signal}$ 202 is shown as a normalized signal ranging from −1 to 1 (i.e., $-1 \leq Reg_{signal} \leq 1$). $Reg_{signal}$ 202 may be generated by incentive provider 114 and provided to frequency response controller 112. $Reg_{signal}$ 202 may define a proportion of the regulation award $Reg_{award}$ 254 that controller 112 is to add or remove from energy grid 104, relative to a baseline value referred to as the midpoint b 256. For example, if the value of $Reg_{award}$ 254 is 10 MW, a regulation signal value of 0.5 (i.e., $Reg_{signal}$=0.5) may indicate that system 100 is requested to add 5 MW of power at POI 110 relative to midpoint b (e.g., $P_{POI}^*$=10 MW×0.5+b), whereas a regulation signal value of −0.3 may indicate that system 100 is requested to remove 3 MW of power from POI 110 relative to midpoint b (e.g., $P_{POI}^*$=10 MW×0.3+b).

Graph 250 illustrates the desired interconnection power $P_{POI}^*$ 252 as a function of time. $P_{POI}^*$ 252 may be calculated by frequency response controller 112 based on $Reg_{signal}$ 202, $Reg_{award}$ 254, and a midpoint b 256. For example, controller 112 may calculate $P_{POI}^*$ 252 using the following equation:

$$P_{POI}^* = Reg_{award} \times Reg_{signal} + b$$

where $P_{POI}^*$ represents the desired power at POI 110 (e.g., $P_{POI}^* = P_{sup} + P_{campus}$) and b is the midpoint. Midpoint b may be defined (e.g., set or optimized) by controller 112 and may represent the midpoint of regulation around which the load is modified in response to $Reg_{signal}$ 202. Optimal adjustment of midpoint b may allow controller 112 to actively participate in the frequency response market while also taking into account the energy and demand charge that will be incurred.

In order to participate in the frequency response market, controller 112 may perform several tasks. Controller 112 may generate a price bid (e.g., $/MW) that includes the capability price and the performance price. In some embodiments, controller 112 sends the price bid to incentive provider 114 at approximately 15:30 each day and the price bid remains in effect for the entirety of the next day. Prior to beginning a frequency response period, controller 112 may generate the capability bid (e.g., MW) and send the capability bid to incentive provider 114. In some embodiments, controller 112 generates and sends the capability bid to incentive provider 114 approximately 1.5 hours before a frequency response period begins. In an exemplary embodiment, each frequency response period has a duration of one hour; however, it is contemplated that frequency response periods may have any duration.

At the start of each frequency response period, controller 112 may generate the midpoint b around which controller 112 plans to perform frequency regulation. In some embodiments, controller 112 generates a midpoint b that will maintain battery 108 at a constant state of charge (SOC) (i.e. a midpoint that will result in battery 108 having the same SOC at the beginning and end of the frequency response period). In other embodiments, controller 112 generates midpoint b using an optimization procedure that allows the SOC of battery 108 to have different values at the beginning and end of the frequency response period. For example, controller 112 may use the SOC of battery 108 as a constrained variable that depends on midpoint b in order to optimize a value function that takes into account frequency response revenue, energy costs, and the cost of battery degradation. Exemplary processes for calculating and/or optimizing midpoint b under both the constant SOC scenario and the variable SOC scenario are described in greater detail with reference to FIGS. 3-4.

During each frequency response period, controller 112 may periodically generate a power setpoint for power inverter 106. For example, controller 112 may generate a power setpoint for each time step in the frequency response period. In some embodiments, controller 112 generates the power setpoints using the equation:

$$P_{POI}* = Reg_{award} \times Reg_{signal} + b$$

where $P_{POI}* = P_{sup} + P_{campus}$. Positive values of $P_{POI}*$ indicate energy flow from POI 110 to energy grid 104. Positive values of $P_{sup}$ and $P_{campus}$ indicate energy flow to POI 110 from power inverter 106 and campus 102, respectively. In other embodiments, controller 112 generates the power setpoints using the equation:

$$P_{POI}* = Reg_{award} \times Res_{FR} + b$$

where $Res_{FR}$ is an optimal frequency response generated by optimizing a value function (described in greater detail below). Controller 112 may subtract P campus from $P_{POI}*$ to generate the power setpoint for power inverter 106 (i.e., $P_{sup} = P_{POI}* - P_{campus}$) The power setpoint for power inverter 106 indicates the amount of power that power inverter 106 is to add to POI 110 (if the power setpoint is positive) or remove from POI 110 (if the power setpoint is negative).

Frequency Response Controller

Figure 3:
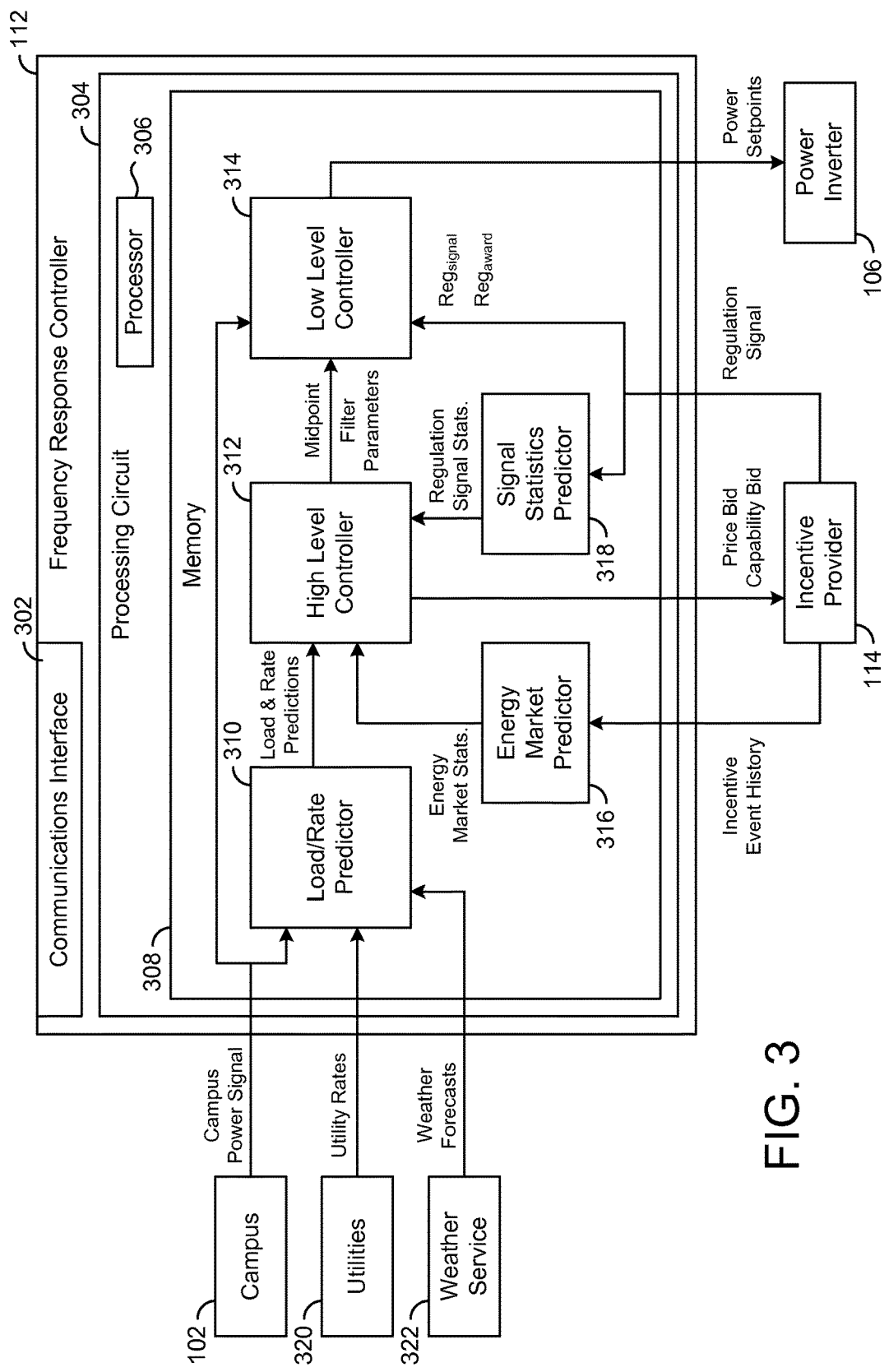
FIG. 3 is a block diagram illustrating the frequency response controller of FIG. 1 in greater detail, according to an exemplary embodiment.

Referring now to FIG. 3, a block diagram illustrating frequency response controller 112 in greater detail is shown, according to an exemplary embodiment. Frequency response controller 112 may be configured to perform an optimization process to generate values for the bid price, the capability bid, and the midpoint b. In some embodiments, frequency response controller 112 generates values for the bids and the midpoint b periodically using a predictive optimization scheme (e.g., once every half hour, once per frequency response period, etc.). Controller 112 may also calculate and update power setpoints for power inverter 106 periodically during each frequency response period (e.g., once every two seconds).

In some embodiments, the interval at which controller 112 generates power setpoints for power inverter 106 is significantly shorter than the interval at which controller 112 generates the bids and the midpoint b. For example, controller 112 may generate values for the bids and the midpoint b every half hour, whereas controller 112 may generate a power setpoint for power inverter 106 every two seconds. The difference in these time scales allows controller 112 to use a cascaded optimization process to generate optimal bids, midpoints b, and power setpoints.

In the cascaded optimization process, a high level controller 312 determines optimal values for the bid price, the capability bid, and the midpoint b by performing a high level optimization. High level controller 312 may select midpoint b to maintain a constant state of charge in battery 108 (i.e., the same state of charge at the beginning and end of each frequency response period) or to vary the state of charge in order to optimize the overall value of operating system 100 (e.g., frequency response revenue minus energy costs and battery degradation costs). High level controller 312 may also determine filter parameters for a signal filter (e.g., a low pass filter) used by a low level controller 314.

Low level controller 314 uses the midpoint b and the filter parameters from high level controller 312 to perform a low level optimization in order to generate the power setpoints for power inverter 106. Advantageously, low level controller 314 may determine how closely to track the desired power $P_{POI}*$ at the point of interconnection 110. For example, the low level optimization performed by low level controller 314 may consider not only frequency response revenue but also the costs of the power setpoints in terms of energy costs and battery degradation. In some instances, low level controller 314 may determine that it is deleterious to battery 108 to follow the regulation exactly and may sacrifice a portion of the frequency response revenue in order to preserve the life of battery 108. The cascaded optimization process is described in greater detail below.

Still referring to FIG. 3, frequency response controller 112 is shown to include a communications interface 302 and a processing circuit 304. Communications interface 302 may include wired or wireless interfaces (e.g., jacks, antennas, transmitters, receivers, transceivers, wire terminals, etc.) for conducting data communications with various systems, devices, or networks. For example, communications interface 302 may include an Ethernet card and port for sending and receiving data via an Ethernet-based communications network and/or a WiFi transceiver for communicating via a wireless communications network. Communications interface 302 may be configured to communicate via local area networks or wide area networks (e.g., the Internet, a building WAN, etc.) and may use a variety of communications protocols (e.g., BACnet, IP, LON, etc.).

Communications interface 302 may be a network interface configured to facilitate electronic data communications between frequency response controller 112 and various external systems or devices (e.g., campus 102, energy grid 104, power inverter 106, incentive provider 114, utilities 320, weather service 322, etc.). For example, frequency response controller 112 may receive inputs from incentive provider 114 indicating an incentive event history (e.g., past clearing prices, mileage ratios, participation requirements, etc.) and a regulation signal. Controller 112 may receive a campus power signal from campus 102, utility rates from utilities 320, and weather forecasts from weather service 322 via communications interface 302. Controller 112 may provide a price bid and a capability bid to incentive provider 114 and may provide power setpoints to power inverter 106 via communications interface 302.

Still referring to FIG. 3, processing circuit 304 is shown to include a processor 306 and memory 308. Processor 306 may be a general purpose or specific purpose processor, an application specific integrated circuit (ASIC), one or more field programmable gate arrays (FPGAs), a group of processing components, or other suitable processing components. Processor 306 may be configured to execute computer code or instructions stored in memory 308 or received from other computer readable media (e.g., CDROM, network storage, a remote server, etc.).

Memory 308 may include one or more devices (e.g., memory units, memory devices, storage devices, etc.) for storing data and/or computer code for completing and/or facilitating the various processes described in the present disclosure. Memory 308 may include random access memory (RAM), read-only memory (ROM), hard drive storage, temporary storage, non-volatile memory, flash memory, optical memory, or any other suitable memory for storing software objects and/or computer instructions. Memory 308 may include database components, object code components, script components, or any other type of information structure for supporting the various activities and information structures described in the present disclosure. Memory 308 may be communicably connected to processor 306 via processing circuit 304 and may include computer code for executing (e.g., by processor 306) one or more processes described herein.

Still referring to FIG. 3, frequency response controller 112 is shown to include a load/rate predictor 310. Load/rate predictor 310 may be configured to predict the electric load of campus 102 (i.e., $\hat{P}_{campus}$) for each time step k (e.g., k=1 . . . n) within an optimization window. Load/rate predictor 310 is shown receiving weather forecasts from a weather service 322. In some embodiments, load/rate predictor 310 predicts $\hat{P}_{campus}$ as a function of the weather forecasts. In some embodiments, load/rate predictor 310 uses feedback from campus 102 to predict $\hat{P}_{campus}$. Feedback from campus 102 may include various types of sensory inputs (e.g., temperature, flow, humidity, enthalpy, etc.) or other data relating to buildings 116, central plant 118, and/or energy generation 120 (e.g., inputs from a HVAC system, a lighting control system, a security system, a water system, a PV energy system, etc.). Load/rate predictor 310 may predict one or more different types of loads for campus 102. For example, load/rate predictor 310 may predict a hot water load, a cold water load, and/or an electric load for each time step k within the optimization window.

In some embodiments, load/rate predictor 310 receives a measured electric load and/or previous measured load data from campus 102. For example, load/rate predictor 310 is shown receiving a campus power signal from campus 102. The campus power signal may indicate the measured electric load of campus 102. Load/rate predictor 310 may predict one or more statistics of the campus power signal including, for example, a mean campus power $\mu_{campus}$ and a standard deviation of the campus power $\sigma_{campus}$. Load/rate predictor 310 may predict P as a function of a given weather forecast ($\hat{\phi}_w$), a day type (day), the time of day (t), and previous measured load data ($Y_{k-1}$). Such a relationship is expressed in the following equation:

$$P_{campus} = f(\hat{\phi}_w, \text{day}, t | Y_{k-1})$$

In some embodiments, load/rate predictor 310 uses a deterministic plus stochastic model trained from historical load data to predict $\hat{P}_{campus}$. Load/rate predictor 310 may use any of a variety of prediction methods to predict $\hat{P}_{campus}$ (e.g., linear regression for the deterministic portion and an AR model for the stochastic portion). In some embodiments, load/rate predictor 310 makes load/rate predictions using the techniques described in U.S. patent application Ser. No. 14/717,593, titled "Building Management System for Forecasting Time Series Values of Building Variables" and filed May 20, 2015.

Load/rate predictor 310 is shown receiving utility rates from utilities 320. Utility rates may indicate a cost or price per unit of a resource (e.g., electricity, natural gas, water, etc.) provided by utilities 320 at each time step k in the optimization window. In some embodiments, the utility rates are time-variable rates. For example, the price of electricity may be higher at certain times of day or days of the week (e.g., during high demand periods) and lower at other times of day or days of the week (e.g., during low demand periods). The utility rates may define various time periods and a cost per unit of a resource during each time period. Utility rates may be actual rates received from utilities 320 or predicted utility rates estimated by load/rate predictor 310.

In some embodiments, the utility rates include demand charges for one or more resources provided by utilities 320. A demand charge may define a separate cost imposed by utilities 320 based on the maximum usage of a particular resource (e.g., maximum energy consumption) during a demand charge period. The utility rates may define various demand charge periods and one or more demand charges associated with each demand charge period. In some instances, demand charge periods may overlap partially or completely with each other and/or with the prediction window. Advantageously, frequency response controller 112 may be configured to account for demand charges in the high level optimization process performed by high level controller 312. Utilities 320 may be defined by time-variable (e.g., hourly) prices, a maximum service level (e.g., a maximum rate of consumption allowed by the physical infrastructure or by contract) and, in the case of electricity, a demand charge or a charge for the peak rate of consumption within a certain period. Load/rate predictor 310 may store the predicted campus power $\hat{P}_{campus}$ and the utility rates in memory 308 and/or provide the predicted campus power $\hat{P}_{campus}$ and the utility rates to high level controller 312.

Still referring to FIG. 3, frequency response controller 112 is shown to include an energy market predictor 316 and a signal statistics predictor 318. Energy market predictor 316 may be configured to predict energy market statistics relating to the frequency response program. For example, energy market predictor 316 may predict the values of one or more variables that can be used to estimate frequency response revenue. In some embodiments, the frequency response revenue is defined by the following equation:

$$\text{Rev} = PS(CP_{cap} + MR \cdot CP_{perf})\text{Reg}_{award}$$

where Rev is the frequency response revenue, $CP_{cap}$ is the capability clearing price, MR is the mileage ratio, and $CP_{perf}$ is the performance clearing price. PS is a performance score based on how closely the frequency response provided by controller 112 tracks the regulation signal. Energy market predictor 316 may be configured to predict the capability clearing price $CP_{cap}$, the performance clearing price $CP_{perf}$, the mileage ratio MR, and/or other energy market statistics that can be used to estimate frequency response revenue. Energy market predictor 316 may store the energy market statistics in memory 308 and/or provide the energy market statistics to high level controller 312.

Signal statistics predictor 318 may be configured to predict one or more statistics of the regulation signal provided by incentive provider 114. For example, signal statistics predictor 318 may be configured to predict the mean $\mu_{FR}$, standard deviation $\sigma_{FR}$, and/or other statistics of the regulation signal. The regulation signal statistics may be based on previous values of the regulation signal (e.g., a historical mean, a historical standard deviation, etc.) or predicted values of the regulation signal (e.g., a predicted mean, a predicted standard deviation, etc.).

In some embodiments, signal statistics predictor 318 uses a deterministic plus stochastic model trained from historical regulation signal data to predict future values of the regulation signal. For example, signal statistics predictor 318 may use linear regression to predict a deterministic portion of the regulation signal and an AR model to predict a stochastic portion of the regulation signal. In some embodiments, signal statistics predictor 318 predicts the regulation signal using the techniques described in U.S. patent application Ser. No. 14/717,593, titled "Building Management System for Forecasting Time Series Values of Building Variables" and filed May 20, 2015. Signal statistics predictor 318 may use the predicted values of the regulation signal to calculate the regulation signal statistics. Signal statistics predictor 318 may store the regulation signal statistics in memory 308 and/or provide the regulation signal statistics to high level controller 312.

Still referring to FIG. 3, frequency response controller 112 is shown to include a high level controller 312. High level controller 312 may be configured to generate values for the midpoint b and the capability bid $Reg_{award}$. In some embodiments, high level controller 312 determines a midpoint b that will cause battery 108 to have the same state of charge (SOC) at the beginning and end of each frequency response period. In other embodiments, high level controller 312 performs an optimization process to generate midpoint b and $Reg_{award}$. For example, high level controller 312 may generate midpoint b using an optimization procedure that allows the SOC of battery 108 to vary and/or have different values at the beginning and end of the frequency response period. High level controller 312 may use the SOC of battery 108 as a constrained variable that depends on midpoint b in order to optimize a value function that takes into account frequency response revenue, energy costs, and the cost of battery degradation. Both of these embodiments are described in greater detail with reference to FIG. 4.

High level controller 312 may determine midpoint b by equating the desired power $P_{POI}^*$ at POI 110 with the actual power at POI 110 as shown in the following equation:

$$(Reg_{signal})(Reg_{award}) + b = P_{bat} + P_{loss} + P_{campus}$$

where the left side of the equation $(Reg_{signal})(Reg_{award}) + b$ is the desired power $P_{POI}^*$ at POI and the right side of the equation is the actual power at POI 110. Integrating over the frequency response period results in the following equation:

$$\int_{period} ((Reg_{signal})(Reg_{award}) + b) dt = \int_{period} (P_{bat} + P_{loss} + P_{campus}) dt$$

For embodiments in which the SOC of battery 108 is maintained at the same value at the beginning and end of the frequency response period, the integral of the battery power $P_{bat}$ over the frequency response period is zero (i.e., $\int P_{bat} dt = 0$). Accordingly, the previous equation can be rewritten as follows:

$$b = \int_{period} P_{loss} dt + \int_{period} P_{campus} dt - Reg_{award} \int_{period} Reg_{signal} dt$$

where the term $\int P_{bat} dt$ has been omitted because $\int P_{bat} dt = 0$. This is ideal behavior if the only goal is to maximize frequency response revenue. Keeping the SOC of battery 108 at a constant value (and near 50%) will allow system 100 to participate in the frequency market during all hours of the day.

High level controller 312 may use the estimated values of the campus power signal received from campus 102 to predict the value of $\int P_{campus} dt$ over the frequency response period. Similarly, high level controller 312 may use the estimated values of the regulation signal from incentive provider 114 to predict the value of $\int Reg_{signal} dt$ over the frequency response period. High level controller 312 may estimate the value of $\int P_{loss} dt$ using a Thevinin equivalent circuit model of battery 108 (described in greater detail with reference to FIG. 4). This allows high level controller 312 to estimate the integral $\int P_{loss} dt$ as a function of other variables such as $Reg_{award}$, $Reg_{signal}$, $P_{campus}$, and midpoint b.

After substituting known and estimated values, the preceding equation can be rewritten as follows:

$$\frac{1}{4P_{max}} [E\{P_{campus}^2\} + Reg_{award}^2 E\{Reg_{signal}^2\} - 2Reg_{award} E\{Reg_{signal}\} E\{P_{campus}\}] \Delta t +$$
$$[Reg_{award} E\{Reg_{signal}\} - E\{P_{campus}\}] \Delta t +$$
$$\frac{b}{2P_{max}} [Reg_{award} E\{Reg_{signal}\} - E\{P_{campus}\}] \Delta t +$$
$$b\Delta t + \frac{b^2}{4P_{max}} \Delta t = 0$$

where the notation E{ } indicates that the variable within the brackets { } is ergodic and can be approximated by the estimated mean of the variable. For example, the term $E\{Reg_{signal}\}$ can be approximated by the estimated mean of the regulation signal $\mu_{FR}$ and the term $E\{P_{campus}\}$ can be approximated by the estimated mean of the campus power signal $\mu_{campus}$. High level controller 312 may solve the equation for midpoint b to determine the midpoint b that maintains battery 108 at a constant state of charge.

For embodiments in which the SOC of battery 108 is treated as a variable, the SOC of battery 108 may be allowed to have different values at the beginning and end of the frequency response period. Accordingly, the integral of the battery power $P_{bat}$ over the frequency response period can be expressed as $-\Delta SOC \cdot C_{des}$ as shown in the following equation:

$$\int_{period} P_{bat} dt = -\Delta SOC \cdot C_{des}$$

where $\Delta SOC$ is the change in the SOC of battery 108 over the frequency response period and $C_{des}$ is the design capacity of battery 108. The SOC of battery 108 may be a normalized variable (i.e., $0 \leq SOC \leq 1$) such that the term $SOC \cdot C_{des}$ represents the amount of energy stored in battery 108 for a given state of charge. The SOC is shown as a negative value because drawing energy from battery 108 (i.e., a positive $P_{bat}$) decreases the SOC of battery 108. The equation for midpoint b becomes:

$$b = \int_{period} P_{loss} dt + \int_{period} P_{campus} dt + \int_{period} P_{bat} dt - Reg_{award} \int_{period} Reg_{signal} dt$$

After substituting known and estimated values, the preceding equation can be rewritten as follows:

$$\frac{1}{4P_{max}} [E\{P_{campus}^2\} + Reg_{award}^2 E\{Reg_{signal}^2\} -$$
$$2Reg_{award} E\{Reg_{signal}\} E\{P_{campus}\}] \Delta t +$$

-continued $$[Reg_{award}E\{Reg_{signal}\} + E\{P_{campus}\}]\Delta t + \Delta SOC \cdot C_{des} +$$
$$\frac{b}{2P_{max}}[Reg_{award}E\{Reg_{signal}\} - E\{P_{campus}\}]\Delta t + b\Delta t + \frac{b_2}{4P_{max}}\Delta t = 0$$

High level controller 312 may solve the equation for midpoint b in terms of ΔSOC High level controller 312 may perform an optimization to find optimal midpoints b for each frequency response period within an optimization window (e.g., each hour for the next day) given the electrical costs over the optimization window. Optimal midpoints b may be the midpoints that maximize an objective function that includes both frequency response revenue and costs of electricity and battery degradation. For example, an objective function J can be written as:

$$J = \sum_{k=1}^{h} Rev(Reg_{award,k}) + \sum_{k=1}^{h} c_k b_k + \min_{period} (P_{campus,k} + b_k) - \sum_{k=1}^{h} \lambda_{bat,k}$$

where $Rev(Reg_{award,k})$ is the frequency response revenue at time step k, $c_k b_k$ is the cost of electricity purchased at time step k, the min( ) term is the demand charge based on the maximum rate of electricity consumption during the applicable demand charge period, and $\lambda_{bat,k}$ is the monetized cost battery degradation at time step k. The electricity cost is expressed as a positive value because drawing power from energy grid 104 is represented as a negative number and therefore will result in negative value (i.e., a cost) in the objective function. The demand charge is expressed as a minimum for the same reason (i.e., the most negative power value represents maximum power draw from energy grid 104).

High level controller 312 may estimate the frequency response revenue $Rev(Reg_{award,k})$ as a function of the midpoints b. In some embodiments, high level controller 312 estimates frequency response revenue using the following equation:

$$Rev(Reg_{award}) = Reg_{award}(CP_{cap} + MR \cdot CP_{perf})$$

where $CP_{cap}$, MR, and $CP_{perf}$ are the energy market statistics received from energy market predictor 316 and $Reg_{award}$ is a function of the midpoint b. For example, high level controller 312 may place a bid that is as large as possible for a given midpoint, as shown in the following equation:

$$Reg_{award} = P_{limit} - |b|$$

where $P_{limit}$ is the power rating of power inverter 106. Advantageously, selecting $Reg_{award}$ as a function of midpoint b allows high level controller 312 to predict the frequency response revenue that will result from a given midpoint b.

High level controller 312 may estimate the cost of battery degradation $\lambda_{bat}$ as a function of the midpoints b. For example, high level controller 312 may use a battery life model to predict a loss in battery capacity that will result from a set of midpoints b, power outputs, and/or other variables that can be manipulated by controller 112. In some embodiments, the battery life model expresses the loss in battery capacity $C_{loss,add}$ as a sum of multiple piecewise linear functions, as shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state of charge, DOD is the depth of discharge, PR is the average power ratio $$\left(\text{e.g., } PR = \text{avg}\left(\frac{P}{P_{des}}\right)\right),$$

and ER is the average effort ratio $$\left(\text{e.g., } ER = \text{avg}\left(\frac{\Delta P}{P_{des}}\right)\right)$$

of battery 108. Each of these terms is described in greater detail with reference to FIG. 4. Advantageously, several of the terms in the battery life model depend on the midpoints b and power setpoints selected by controller 112. This allows high level controller 312 to predict a loss in battery capacity that will result from a given set of control outputs. High level controller 312 may monetize the loss in battery capacity and include the monetized cost of battery degradation $\lambda_{bat}$ in the objective function J.

In some embodiments, high level controller 312 generates a set of filter parameters for low level controller 314. The filter parameters may be used by low level controller 314 as part of a low-pass filter that removes high frequency components from the regulation signal. In some embodiments, high level controller 312 generates a set of filter parameters that transform the regulation signal into an optimal frequency response signal $Res_{FR}$. For example, high level controller 312 may perform a second optimization process to determine an optimal frequency response $Res_{FR}$ based on the optimized values for $Reg_{award}$ and midpoint b.

In some embodiments, high level controller 312 determines the optimal frequency response $Res_{FR}$ by optimizing value function J with the frequency response revenue Rev ($Reg_{award}$) defined as follows:

$$Rev(Reg_{award}) = PS \cdot Reg_{award}(CP_{cap} + MR \cdot CP_{perf})$$

and with the frequency response $Res_{FR}$ substituted for the regulation signal in the battery life model. The performance score PS may be based on several factors that indicate how well the optimal frequency response $Res_{FR}$ tracks the regulation signal. Closely tracking the regulation signal may result in higher performance scores, thereby increasing the frequency response revenue. However, closely tracking the regulation signal may also increase the cost of battery degradation $\lambda_{bat}$. The optimized frequency response $Res_{FR}$ represents an optimal tradeoff between decreased frequency response revenue and increased battery life. High level controller 312 may use the optimized frequency response $Res_{FR}$ to generate a set of filter parameters for low level controller 314. These and other features of high level controller 312 are described in greater detail with reference to FIG. 4.

Still referring to FIG. 3, frequency response controller 112 is shown to include a low level controller 314. Low level controller 314 is shown receiving the midpoints b and the filter parameters from high level controller 312. Low level controller 314 may also receive the campus power signal from campus 102 and the regulation signal from incentive provider 114. Low level controller 314 may use the regulation signal to predict future values of the regulation signal and may filter the predicted regulation signal using the filter parameters provided by high level controller 312.

Low level controller 314 may use the filtered regulation signal to determine optimal power setpoints for power inverter 106. For example, low level controller 314 may use the filtered regulation signal to calculate the desired interconnection power $P_{POI}^*$ using the following equation:

$$P_{POI}^* = Reg_{award} \cdot Reg_{filter} + b$$

where $Reg_{filter}$ is the filtered regulation signal. Low level controller 314 may subtract the campus power $P_{campus}$ from the desired interconnection power $P_{POI}^*$ to calculate the optimal power setpoints $P_{SP}$ for power inverter 106, as shown in the following equation:

$$P_{SP} = P_{POI}^* - P_{campus}$$

In some embodiments, low level controller 314 performs an optimization to determine how closely to track $P_{POI}^*$. For example, low level controller 314 may determine an optimal frequency response $Res_{FR}$ by optimizing value function J with the frequency response revenue $Rev(Reg_{award})$ defined as follows:

$$Rev(Reg_{award}) = PS \cdot Reg_{award}(CP_{cap} + MR \cdot CP_{perf})$$

and with the frequency response $Res_{FR}$ substituted for the regulation signal in the battery life model. Low level controller 314 may use the optimal frequency response $Res_{FR}$ in place of the filtered frequency response $Reg_{filter}$ to calculate the desired interconnection power $P_{POI}^*$ and power setpoints $P_{SP}$ as previously described. These and other features of low level controller 314 are described in greater detail with reference to FIG. 5.

High Level Controller

Figure 4:
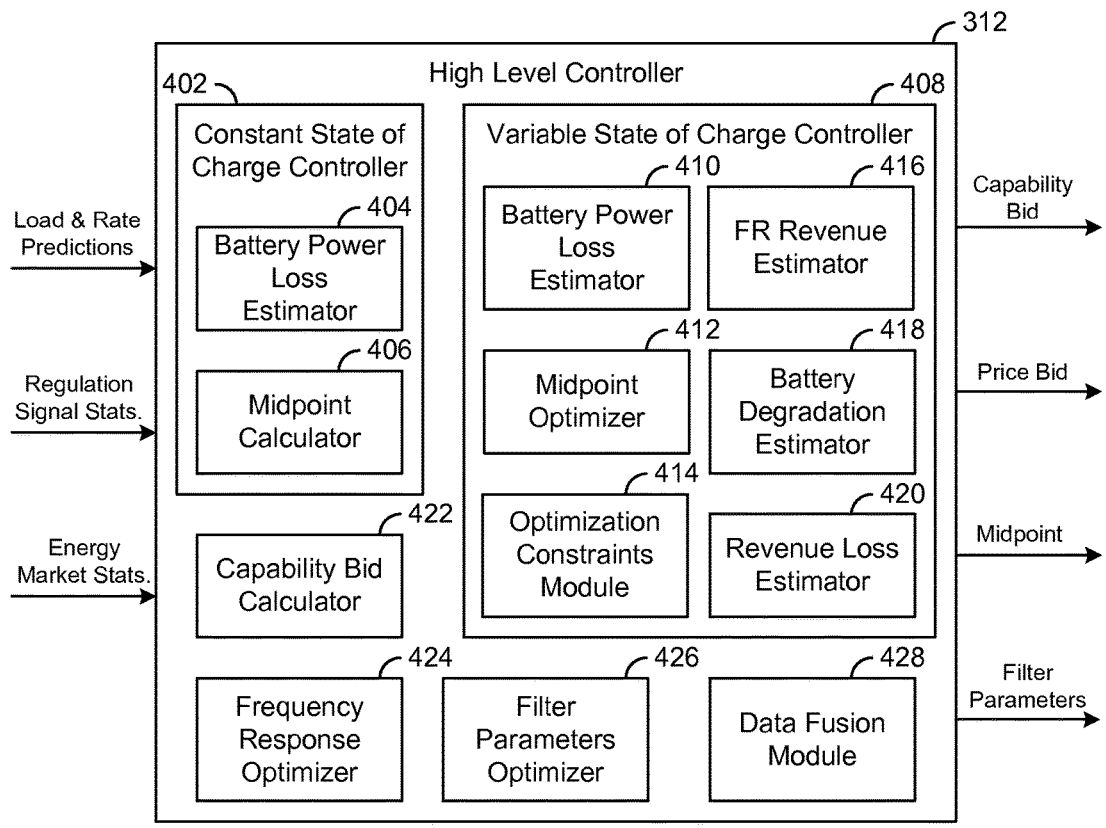
FIG. 4 is a block diagram illustrating the high level controller of FIG. 3 in greater detail, according to an exemplary embodiment.

Referring now to FIG. 4, a block diagram illustrating high level controller 312 in greater detail is shown, according to an exemplary embodiment. High level controller 312 is shown to include a constant state of charge (SOC) controller 402 and a variable SOC controller 408. Constant SOC controller 402 may be configured to generate a midpoint b that results in battery 108 having the same SOC at the beginning and the end of each frequency response period. In other words, constant SOC controller 408 may determine a midpoint b that maintains battery 108 at a predetermined SOC at the beginning of each frequency response period. Variable SOC controller 408 may generate midpoint b using an optimization procedure that allows the SOC of battery 108 to have different values at the beginning and end of the frequency response period. In other words, variable SOC controller 408 may determine a midpoint b that results in a net change in the SOC of battery 108 over the duration of the frequency response period.

Constant State of Charge Controller

Constant SOC controller 402 may determine midpoint b by equating the desired power $P_{POI}^*$ at POI 110 with the actual power at POI 110 as shown in the following equation:

$$(Reg_{signal})(Reg_{award}) + b = P_{bad} + P_{loss} + P_{campus}$$

where the left side of the equation $(Reg_{signal})(Reg_{award}) + b$ is the desired power $P_{POI}^*$ at POI 110 and the right side of the equation is the actual power at POI 110. Integrating over the frequency response period results in the following equation:

$$\int_{period} ((Reg_{signal})(Reg_{award}) + b) dt = \int_{period} (P_{bat} + P_{loss} + P_{campus}) dt$$

Since the SOC of battery 108 is maintained at the same value at the beginning and end of the frequency response period, the integral of the battery power $P_{bat}$ over the frequency response period is zero (i.e., $\int P_{bat} dt = 0$). Accordingly, the previous equation can be rewritten as follows:

$$b = \int_{period} P_{loss} dt + \int_{period} P_{campus} dt - Reg_{award} \int_{period} Reg_{signal} dt$$

where the term $\int P_{bat} dt$ has been omitted because $\int P_{bat} dt = 0$. This is ideal behavior if the only goal is to maximize frequency response revenue. Keeping the SOC of battery 108 at a constant value (and near 50%) will allow system 100 to participate in the frequency market during all hours of the day.

Constant SOC controller 402 may use the estimated values of the campus power signal received from campus 102 to predict the value of $\int P_{campus} dt$ over the frequency response period. Similarly, constant SOC controller 402 may use the estimated values of the regulation signal from incentive provider 114 to predict the value of $\int Reg_{signal} dt$ over the frequency response period. $Reg_{award}$ can be expressed as a function of midpoint b as previously described (e.g., $Reg_{award} = P_{limit} - |b|$). Therefore, the only remaining term in the equation for midpoint b is the expected battery power loss $\int P_{loss}$.

Constant SOC controller 402 is shown to include a battery power loss estimator 404. Battery power loss estimator 404 may estimate the value of $\int P_{loss} dt$ using a Thevinin equivalent circuit model of battery 108. For example, battery power loss estimator 404 may model battery 108 as a voltage source in series with a resistor. The voltage source has an open circuit voltage of $V_{OC}$ and the resistor has a resistance of $R_{TH}$. An electric current I flows from the voltage source through the resistor.

To find the battery power loss in terms of the supplied power $P_{sup}$, battery power loss estimator 404 may identify the supplied power $P_{sup}$ as a function of the current I, the open circuit voltage $V_{OC}$, and the resistance $R_{TH}$ as shown in the following equation:

$$P_{sup} = V_{OC} I - I^2 R_{TH}$$

which can be rewritten as:

$$\frac{I^2}{I_{SC}} - I + \frac{P'}{4} = 0$$

with the following substitutions:

$$I_{SC} = \frac{V_{OC}}{R_{TH}}, \quad P' = \frac{P}{P_{max}}, \quad P_{max} = \frac{V_{OC}^2}{4R_{TH}}$$

where P is the supplied power and $P_{max}$ is the maximum possible power transfer.

Battery power loss estimator 404 may solve for the current I as follows:

$$I = \frac{I_{SC}}{2}\left(1 - \sqrt{1 - P'}\right)$$

which can be converted into an expression for power loss $P_{loss}$ in terms of the supplied power P and the maximum possible power transfer $P_{max}$ as shown in the following equation:

$$P_{loss} = P_{max}(1 - \sqrt{1-P'})^2$$

Battery power loss estimator 404 may simplify the previous equation by approximating the expression $(1-\sqrt{1-P'})$ as a linear function about P'=0. This results in the following approximation for $P_{loss}$:

$$P_{loss} \approx P_{max}\left(\frac{P'}{2}\right)^2$$

which is a good approximation for powers up to one-fifth of the maximum power.

Battery power loss estimator 404 may calculate the expected value of $\int P_{loss} dt$ over the frequency response period as follows:

$$\int_{period} P_{loss} dt = \int_{period} -P_{max}\left(\frac{Reg_{award}Reg_{signal} + b - P_{campus}}{2P_{max}}\right)^2 dt =$$

$$\frac{1}{4P_{max}}\left[2Reg_{award}\int_{period} P_{campus}Reg_{signal} dt - \int_{period} P_{campus}^2 dt - Reg_{award}^2\int_{period} Reg_{signal}^2 dt\right] +$$

$$\frac{b}{2P_{max}}\left[\int_{period} P_{campus}^2 dt - Reg_{award}\int_{period} Reg_{signal} dt\right] - \frac{b^2}{4P_{max}}\Delta t =$$

$$\frac{1}{4P_{max}}[E\{P_{campus}^2\} + Reg_{award}^2 E\{Reg_{signal}^2\} -$$

$$2Reg_{award}E\{Reg_{signal}\}E\{P_{campus}\}]\Delta t -$$

$$\frac{b}{2P_{max}}[Reg_{award}E\{Reg_{signal}\} - E\{P_{campus}\}]\Delta t - \frac{b^2}{4P_{max}}\Delta t$$

where the notation E{ } indicates that the variable within the brackets { } is ergodic and can be approximated by the estimated mean of the variable. This formulation allows battery power loss estimator 404 to estimate $\int P_{loss} dt$ as a function of other variables such as $Reg_{award}$, $Reg_{signal}$, $P_{campus}$, midpoint b, and $P_{max}$.

Constant SOC controller 402 is shown to include a midpoint calculator 406. Midpoint calculator 406 may be configured to calculate midpoint b by substituting the previous expression for $\int P_{loss} dt$ into the equation for midpoint b. After substituting known and estimated values, the equation for midpoint b can be rewritten as follows:

$$\frac{1}{4P_{max}}[E\{P_{campus}^2\} +$$

$$Reg_{award}^2 E\{Reg_{signal}^2\} - 2Reg_{award}E\{Reg_{signal}\}E\{P_{campus}\}]$$

$$\Delta t + [Reg_{award}E\{Reg_{signal}\} - E\{P_{campus}\}]\Delta t +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

Midpoint calculator 406 may solve the equation for midpoint b to determine the midpoint b that maintains battery 108 at a constant state of charge.

Variable State of Charge Controller

Variable SOC controller 408 may determine optimal midpoints b by allowing the SOC of battery 108 to have different values at the beginning and end of a frequency response period. For embodiments in which the SOC of battery 108 is allowed to vary, the integral of the battery power $P_{bat}$ over the frequency response period can be expressed as $-\Delta SOC \cdot C_{des}$ as shown in the following equation:

$$\int_{period} P_{bat} dt = -\Delta SOC \cdot C_{des}$$

where $\Delta SOC$ is the change in the SOC of battery 108 over the frequency response period and $C_{des}$ is the design capacity of battery 108. The SOC of battery 108 may be a normalized variable (i.e., $0 \leq SOC \leq 1$) such that the term $SOC \cdot C_{des}$ represents the amount of energy stored in battery 108 for a given state of charge. The SOC is shown as a negative value because drawing energy from battery 108 (i.e., a positive $P_{bat}$) decreases the SOC of battery 108. The equation for midpoint b becomes:

$$b = \int_{period} P_{loss} dt + \int_{period} P_{campus} dt +$$

$$\int_{period} P_{bat} dt - Reg_{award}\int_{period} Reg_{signal} dt$$

Variable SOC controller 408 is shown to include a battery power loss estimator 410 and a midpoint optimizer 412. Battery power loss estimator 410 may be the same or similar to battery power loss estimator 404. Midpoint optimizer 412 may be configured to establish a relationship between the midpoint b and the SOC of battery 108. For example, after substituting known and estimated values, the equation for midpoint b can be written as follows:

$$\frac{1}{4P_{max}}[E\{P_{campus}^2\} + Reg_{award}^2 +$$

$$E\{Reg_{signal}^2\} - 2Reg_{award}E\{Reg_{signal}\}E\{P_{campus}\}]\Delta$$

$$t + [Reg_{award}E\{Reg_{signal}\} + E\{P_{campus}\}]\Delta t + \Delta SOC \cdot C_{des} +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

Advantageously, the previous equation defines a relationship between midpoint b and the change in SOC of battery 108. Midpoint optimizer 412 may use this equation to determine the impact that different values of midpoint b have on the SOC in order to determine optimal midpoints b. This equation can also be used by midpoint optimizer 412 during optimization to translate constraints on the SOC in terms of midpoint b. For example, the SOC of battery 108 may be constrained between zero and 1 (e.g., $0 \leq SOC \leq 1$) since battery 108 cannot be charged in excess of its maximum capacity or depleted below zero. Midpoint optimizer 412 may use the relationship between $\Delta SOC$ and midpoint b to constrain the optimization of midpoint b to midpoint values that satisfy the capacity constraint.

Midpoint optimizer 412 may perform an optimization to find optimal midpoints b for each frequency response period within the optimization window (e.g., each hour for the next day) given the electrical costs over the optimization window. Optimal midpoints b may be the midpoints that maximize an objective function that includes both frequency response revenue and costs of electricity and battery degradation. For example, an objective function J can be written as:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where $Rev(Reg_{award,k})$ is the frequency response revenue at time step k, $c_k b_k$ is the cost of electricity purchased at time step k, the min( ) term is the demand charge based on the maximum rate of electricity consumption during the applicable demand charge period, and $\lambda_{bat,k}$ is the monetized cost battery degradation at time step k. Midpoint optimizer 412 may use input from frequency response revenue estimator 416 (e.g., a revenue model) to determine a relationship between midpoint b and $Rev(Reg_{award,k})$ Similarly, midpoint optimizer 412 may use input from battery degradation estimator 418 and/or revenue loss estimator 420 to determine a relationship between midpoint b and the monetized cost of battery degradation $\lambda_{bat,k}$.

Still referring to FIG. 4, variable SOC controller 408 is shown to include an optimization constraints module 414. Optimization constraints module 414 may provide one or more constraints on the optimization performed by midpoint optimizer 412. The optimization constraints may be specified in terms of midpoint b or other variables that are related to midpoint b. For example, optimization constraints module 414 may implement an optimization constraint specifying that the expected SOC of battery 108 at the end of each frequency response period is between zero and one, as shown in the following equation:

$$0 \leq SOC_0 + \sum_{i=1}^{j} \Delta SOC_i \leq 1 \; \forall \; j = 1 \ldots h$$

where $SOC_0$ is the SOC of battery 108 at the beginning of the optimization window, $\Delta SOC_i$ is the change in SOC during frequency response period i, and h is the total number of frequency response periods within the optimization window.

In some embodiments, optimization constraints module 414 implements an optimization constraint on midpoint b so that the power at POI 110 does not exceed the power rating of power inverter 106. Such a constraint is shown in the following equation:

$$-P_{limit} \leq b_k + P_{campus,max}^{(\rho)} \leq P_{limit}$$

where $P_{limit}$ is the power rating of power inverter 106 and $P_{campus,max}^{(\rho)}$ is the maximum value of $P_{campus}$ at confidence level $\rho$. This constraint could also be implemented by identifying the probability that the sum of $b_k$ and $P_{campus,max}$ exceeds the power inverter power rating (e.g., using a probability density function for $P_{campus,max}$) and limiting that probability to less than or equal to $1-\rho$.

In some embodiments, optimization constraints module 414 implements an optimization constraint to ensure (with a given probability) that the actual SOC of battery 108 remains between zero and one at each time step during the applicable frequency response period. This constraint is different from the first optimization constraint which placed bounds on the expected SOC of battery 108 at the end of each optimization period. The expected SOC of battery 108 can be determined deterministically, whereas the actual SOC of battery 108 is dependent on the campus power $P_{campus}$ and the actual value of the regulation signal $Reg_{signal}$ at each time step during the optimization period. In other words, for any value of $Reg_{award}>0$, there is a chance that battery 108 becomes fully depleted or fully charged while maintaining the desired power $P_{POI}^*$ at POI 110.

Optimization constraints module 414 may implement the constraint on the actual SOC of battery 108 by approximating the battery power $P_{bat}$ (a random process) as a wide-sense stationary, correlated normally distributed process. Thus, the SOC of battery 108 can be considered as a random walk. Determining if the SOC would violate the constraint is an example of a gambler's ruin problem. For example, consider a random walk described by the following equation:

$$y_{k+1}=y_k+x_k, P(x_k=1)=p, P(x_k=-1)=1-p$$

The probability P that $y_k$ (starting at state z) will reach zero in less than n moves is given by the following equation:

$$P = 2a^{-1}(2p)^{\frac{n-z}{2}}[2(1-p)]^{\frac{n+z}{2}} \sum_{v=1}^{\frac{a}{2}} \cos^{n-1}\left(\frac{\pi v}{a}\right) \sin\left(\frac{\pi v}{a}\right) \sin\left(\frac{\pi z v}{a}\right)$$

In some embodiments, each frequency response period includes approximately n=1800 time steps (e.g., one time step every two seconds for an hour). Therefore, the central limit theorem applies and it is possible to convert the autocorrelated random process for $P_{bat}$ and the limits on the SOC of battery 108 into an uncorrelated random process of 1 or −1 with a limit of zero.

In some embodiments, optimization constraints module 414 converts the battery power $P_{bat}$ into an uncorrelated normal process driven by the regulation signal $Reg_{signal}$. For example, consider the original battery power described by the following equation:

$$x_{k+1}=\alpha x_k+e_k, x_k \sim N(\mu,\sigma), e_k \sim N(\mu_e,\sigma_e)$$

where the signal x represents the battery power $P_{bat}$, $\alpha$ is an autocorrelation parameter, and e is a driving signal. In some embodiments, e represents the regulation signal $Reg_{signal}$. If the power of the signal x is known, then the power of signal e is also known, as shown in the following equations:

$$\mu(1-\alpha)=\mu_e$$

$$E\{x_k^2\}(1-\alpha)^2-2\alpha\mu\mu_e=E\{e_k^2\}$$

$$E\{x_k^2\}(1-\alpha^2)-2\mu^2\alpha(1-\alpha)=E\{e_k^2\},$$

Additionally, the impulse response of the difference equation for $x_{k+1}$ is:

$$h_k=\alpha^k k \geq 0$$

Using convolution, $x_k$ can be expressed as follows:

$$x_k = \sum_{i=1}^{k} \alpha^{k-i} e_{i-1}$$

$$x_3 = \alpha^2 e_0 + \alpha^1 e_1 + e_2$$

$$x_q = \alpha^{q-1} e_0 + \alpha^{q-2} e_1 + \ldots + \alpha e_{q-2} + e_{q-1}$$

A random walk driven by signal $x_k$ can be defined as follows:

$$y_k = \sum_{j=1}^{k} x_j = \sum_{j=1}^{k} \sum_{i=1}^{j} \alpha^{j-1} e_{i-1}$$

which for large values of j can be approximated using the infinite sum of a geometric series in terms of the uncorrelated signal e rather than x:

$$y_k = \sum_{j=1}^{k} x_j \approx \sum_{j=1}^{k} \frac{1}{1-\alpha} e_j = \sum_{j=1}^{k} x'_j \quad k \gg 1$$

Thus, the autocorrelated driving signal $x_k$ of the random walk can be converted into an uncorrelated driving signal $x_k'$ with mean and power given by:

$$E\{x_k'\} = \mu, \quad E\{(x_k' - \mu)^2\} = \frac{1+\alpha}{1-\alpha}\sigma^2, \quad E\{x_k'^2\} = \frac{1+\alpha}{1-\alpha}\sigma^2 + \mu^2,$$

$$\sigma_{x'}^2 = \frac{1+\alpha}{1-\alpha}\sigma^2$$

where $x_k'$ represents the regulation signal $\text{Reg}_{signal}$. Advantageously, this allows optimization constraints module 414 to define the probability of ruin in terms of the regulation signal $\text{Reg}_{signal}$.

In some embodiments, optimization constraints module 414 determines a probability p that the random walk driven by the sequence of −1 and 1 will take the value of 1. In order to ensure that the random walk driven by the sequence of −1 and 1 will behave the same as the random walk driven by $x_k'$, optimization constraints module 414 may select p such that the ratio of the mean to the standard deviation is the same for both driving functions, as shown in the following equations:

$$\frac{mean}{stdev} = \frac{\mu}{\sqrt{\frac{1+\alpha}{1-\alpha}\sigma}} = \tilde{\mu} = \frac{2p-1}{\sqrt{4p(1-p)}}$$

$$p = \frac{1}{2} \pm \frac{1}{2}\sqrt{1 - \left(\frac{1}{\tilde{\mu}^2 + 1}\right)}$$

where $\tilde{\mu}$ is the ratio of the mean to the standard deviation of the driving signal (e.g., $\text{Reg}_{signal}$) and $\mu$ is the change in state-of-charge over the frequency response period divided by the number of time steps within the frequency response period (i.e., $$\mu = \frac{\Delta SOC}{n}\bigg).$$

For embodiments in which each frequency response period has a duration of one hour (i.e., 3600 seconds) and the interval between time steps is two seconds, the number of time steps per frequency response period is 1800 (i.e., n=1800). In the equation for p, the plus is used when $\tilde{\mu}$ is greater than zero, whereas the minus is used when $\tilde{\mu}$ is less than zero. Optimization constraints module 414 may also ensure that both driving functions have the same number of standard deviations away from zero (or ruin) to ensure that both random walks have the same behavior, as shown in the following equation:

$$z = \frac{SOC \cdot C_{des}\sqrt{4p(1-p)}}{\sqrt{\frac{1+\alpha}{1-\alpha}\sigma}}$$

Advantageously, the equations for ρ and z allow optimization constraints module 414 to define the probability of ruin P (i.e., the probability of battery 108 fully depleting or reaching a fully charged state) within N time steps (n=1 . . . N) as a function of variables that are known to high level controller 312 and/or manipulated by high level controller 312. For example, the equation for ρ defines ρ as a function of the mean and standard deviation of the regulation signal $\text{Reg}_{signal}$, which may be estimated by signal statistics predictor 318. The equation for z defines z as a function of the SOC of battery 108 and the parameters of the regulation signal $\text{Reg}_{signal}$.

Optimization constraints module 414 may use one or more of the previous equations to place constraints on $\Delta SOC \cdot C_{des}$ and $\text{Reg}_{award}$ given the current SOC of battery 108. For example, optimization constraints module 414 may use the mean and standard deviation of the regulation signal $\text{Reg}_{signal}$ to calculate ρ. Optimization constraints module 414 may then use p in combination with the SOC of battery 108 to calculate z. Optimization constraints module 414 may use p and z as inputs to the equation for the probability of ruin P. This allows optimization constraints module 414 to define the probability or ruin P as a function of the SOC of battery 108 and the estimated statistics of the regulation signal $\text{Reg}_{signal}$. Optimization constraints module 414 may impose constraints on the SOC of battery 108 to ensure that the probability of ruin P within N time steps does not exceed a threshold value. These constraints may be expressed as limitations on the variables $\Delta SOC \cdot C_{des}$ and/or $\text{Reg}_{award}$, which are related to midpoint b as previously described.

In some embodiments, optimization constraints module 414 uses the equation for the probability of ruin P to define boundaries on the combination of variables ρ and z. The boundaries represent thresholds when the probability of ruin P in less than N steps is greater than a critical value $P_{cr}$ (e.g., $P_{cr}=0.001$). For example, optimization constraints module 414 may generate boundaries that correspond to a threshold probability of battery 108 fully depleting or reaching a fully charged state during a frequency response period (e.g., in N=1800 steps).

In some embodiments, optimization constraints module 414 constrains the probability of ruin P to less than the threshold value, which imposes limits on potential combinations of the variables ρ and z. Since the variables ρ and z are related to the SOC of battery 108 and the statistics of the regulation signal, the constraints may impose limitations on $\Delta SOC \cdot C_{des}$ and $\text{Reg}_{award}$ given the current SOC of battery 108. These constraints may also impose limitations on midpoint b since the variables $\Delta SOC \cdot C_{des}$ and $\text{Reg}_{award}$ are related to midpoint b. For example, optimization constraints module 414 may set constraints on the maximum bid $\text{Reg}_{award}$ given a desired change in the SOC for battery 108. In other embodiments, optimization constraints module 414 penalizes the objective function J given the bid $\text{Reg}_{award}$ and the change in SOC.

Still referring to FIG. 4, variable SOC controller 408 is shown to include a frequency response (FR) revenue estimator 416. FR revenue estimator 416 may be configured to estimate the frequency response revenue that will result from a given midpoint b (e.g., a midpoint provided by midpoint optimizer 412). The estimated frequency response revenue may be used as the term Rev(Reg$_{award,k}$) in the objective function J. Midpoint optimizer 412 may use the estimated frequency response revenue along with other terms in the objective function J to determine an optimal midpoint b.

In some embodiments, FR revenue estimator 416 uses a revenue model to predict frequency response revenue. An exemplary revenue model which may be used by FR revenue estimator 416 is shown in the following equation:

$$\text{Rev}(\text{Reg}_{award}) = \text{Reg}_{award}(\text{CP}_{cap} + \text{MR} \cdot \text{CP}_{perf})$$

where $\text{CP}_{cap}$, MR, and $\text{CP}_{perf}$ are the energy market statistics received from energy market predictor 316 and $\text{Reg}_{award}$ is a function of the midpoint b. For example, capability bid calculator 422 may calculate $\text{Reg}_{award}$ using the following equation:

$$\text{Reg}_{award} = P_{limit} - |b|$$

where $P_{limit}$ is the power rating of power inverter 106.

As shown above, the equation for frequency response revenue used by FR revenue estimator 416 does not include a performance score (or assumes a performance score of 1.0). This results in FR revenue estimator 416 estimating a maximum possible frequency response revenue that can be achieved for a given midpoint b (i.e., if the actual frequency response of controller 112 were to follow the regulation signal exactly). However, it is contemplated that the actual frequency response may be adjusted by low level controller 314 in order to preserve the life of battery 108. When the actual frequency response differs from the regulation signal, the equation for frequency response revenue can be adjusted to include a performance score. The resulting value function J may then be optimized by low level controller 314 to determine an optimal frequency response output which considers both frequency response revenue and the costs of battery degradation, as described with reference to FIG. 5.

Still referring to FIG. 4, variable SOC controller 408 is shown to include a battery degradation estimator 418. Battery degradation estimator 418 may estimate the cost of battery degradation that will result from a given midpoint b (e.g., a midpoint provided by midpoint optimizer 412). The estimated battery degradation may be used as the term $\lambda_{bat}$ in the objective function J. Midpoint optimizer 412 may use the estimated battery degradation along with other terms in the objective function J to determine an optimal midpoint b.

In some embodiments, battery degradation estimator 418 uses a battery life model to predict a loss in battery capacity that will result from a set of midpoints b, power outputs, and/or other variables that can be manipulated by controller 112. The battery life model may define the loss in battery capacity $C_{loss,add}$ as a sum of multiple piecewise linear functions, as shown in the following equation:

$$C_{loss,add} = f_1(T_{cell}) + f_2(\text{SOC}) + f_3(\text{DOD}) + f_4(\text{PR}) + f_5(\text{ER}) - C_{loss,nom}$$

where $T_{cell}$ is the cell temperature, SOC is the state of charge, DOD is the depth of discharge, PR is the average power ratio (e.g., $$PR = avg\left(\frac{P_{avg}}{P_{des}}\right)),$$

and ER is the average effort ratio (e.g., $$ER = avg\left(\frac{\Delta P_{bat}}{P_{des}}\right)$$

of battery 108. $C_{loss,nom}$ is the nominal loss in battery capacity that is expected to occur over time. Therefore, $C_{loss,add}$ represents the additional loss in battery capacity degradation in excess of the nominal value $C_{loss,nom}$.

Battery degradation estimator 418 may define the terms in the battery life model as functions of one or more variables that have known values (e.g., estimated or measured values) and/or variables that can be manipulated by high level controller 312. For example, battery degradation estimator 418 may define the terms in the battery life model as functions of the regulation signal statistics (e.g., the mean and standard deviation of $\text{Reg}_{signal}$), the campus power signal statistics (e.g., the mean and standard deviation of $P_{campus}$), $\text{Reg}_{award}$, midpoint b, the SOC of battery 108, and/or other variables that have known or controlled values.

In some embodiments, battery degradation estimator 418 measures the cell temperature $T_{cell}$ using a temperature sensor configured to measure the temperature of battery 108. In other embodiments, battery degradation estimator 418 estimates or predicts the cell temperature $T_{cell}$ based on a history of measured temperature values. For example, battery degradation estimator 418 may use a predictive model to estimate the cell temperature $T_{cell}$ as a function of the battery power $P_{bat}$, the ambient temperature, and/or other variables that can be measured, estimated, or controlled by high level controller 312.

Battery degradation estimator 418 may define the variable SOC in the battery life model as the SOC of battery 108 at the end of the frequency response period. The SOC of battery 108 may be measured or estimated based on the control decisions made by controller 112. For example, battery degradation estimator 418 may use a predictive model to estimate or predict the SOC of battery 108 at the end of the frequency response period as a function of the battery power $P_{bat}$, the midpoint b, and/or other variables that can be measured, estimated, or controlled by high level controller 312.

Battery degradation estimator 418 may define the average power ratio PR as the ratio of the average power output of battery 108 (i.e., $P_{avg}$) to the design power $P_{des}$ (e.g., $$PR = \frac{P_{avg}}{P_{des}}).$$

The average power output of battery 108 can be defined using the following equation:

$$P_{avg} = E\{|\text{Reg}_{award}\text{Reg}_{signal} + b - P_{loss} - P_{campus}|\}$$

where the expression ($\text{Reg}_{award}\text{Reg}_{signal} + b - P_{loss} - P_{campus}$) represents the battery power $P_{bat}$. The expected value of $P_{avg}$ is given by:

$$P_{avg} = \sigma_{bat}\sqrt{\frac{2}{\pi}}\exp\left(\frac{-\mu_{bat}^2}{2\sigma_{bat}^2}\right) + \text{erf}\left(\frac{-\mu_{bat}}{\sqrt{2\sigma_{bat}^2}}\right)$$

where $\mu_{bat}$ and $\sigma_{bat}^2$ are the mean and variance of the battery power $P_{bat}$. The variables $\mu_{bat}$ and $\sigma_{bat}^2$ may be defined as follows:

$$\mu_{bat} = \text{Reg}_{award} E\{\text{Reg}_{signal}\} + b - E\{P_{loss}\} - E\{P_{campus}\}$$

$$\sigma_{bat}^2 = \text{Reg}_{award}^2 \sigma_{FR}^2 + \sigma_{campus}^2$$

where $\sigma_{FR}^2$ is the variance of $\text{Reg}_{signal}$ and the contribution of the battery power loss to the variance $\sigma_{bat}^2$ is neglected.

Battery degradation estimator 418 may define the average effort ratio ER as the ratio of the average change in battery power $\Delta P_{avg}$ to the design power $P_{des}$ (i.e., $$ER = \frac{\Delta P_{avg}}{P_{des}}\right).$$

The average change in battery power can be defined using the following equation:

$$\Delta P_{avg} = E\{P_{bat,k} - P_{bat,k-1}\}$$

$$\Delta P_{avg} = E\{|\text{Reg}_{award}(\text{Reg}_{signal,k} - \text{Reg}_{signal,k-1}) - (P_{loss,k} - P_{loss,k-1}) - (P_{campus,k} - P_{campus,k-1})|\}$$

To make this calculation more tractable, the contribution due to the battery power loss can be neglected. Additionally, the campus power $P_{campus}$ and the regulation signal $\text{Reg}_{signal}$ can be assumed to be uncorrelated, but autocorrelated with first order autocorrelation parameters of $\alpha_{campus}$ and $\alpha$, respectively. The argument inside the absolute value in the equation for $\Delta P_{avg}$ has a mean of zero and a variance given by:

$$\sigma_{diff}^2 = E\{[\text{Reg}_{award}(\text{Reg}_{signal,k} - \text{Reg}_{signal,k-1}) - (P_{campus,k} - P_{campus,k-1})]^2\}$$

$$= E\{\text{Reg}_{award}^2(\text{Reg}_{signal,k} - \text{Reg}_{signal,k-1})^2 - (P_{campus,k} - P_{campus,k-1})^2\}$$

$$= 2\text{Reg}_{award}^2(1-\alpha)\sigma_{FR}^2 + 2(1-\alpha_{campus})\sigma_{campus}^2$$

Battery degradation estimator 418 may define the depth of discharge DOD as the maximum state of charge minus the minimum state of charge of battery 108 over the frequency response period, as shown in the following equation:

$$\text{DOD} = \text{SOC}_{max} - \text{SOC}_{min}$$

The SOC of battery 108 can be viewed as a constant slope with a zero mean random walk added to it, as previously described. An uncorrelated normal random walk with a driving signal that has zero mean has an expected range given by:

$$E\{\text{max} - \text{min}\} = 2\sigma\sqrt{\frac{2N}{\pi}}$$

where $E\{\text{max}-\text{min}\}$ represent the depth of discharge DOD and can be adjusted for the autocorrelation of the driving signal as follows:

$$E\{\text{max}-\text{min}\} = 2\sigma_{bat}\sqrt{\frac{1+\alpha_{bat}}{1-\alpha_{bat}}}\sqrt{\frac{2N}{\pi}}$$

$$\sigma_{bat}^2 = \text{Reg}_{award}^2 \sigma_{FR}^2 + \sigma_{campus}^2$$

$$\alpha_{bat} = \frac{\text{Reg}_{award}^2 \alpha \sigma_{FR}^2 + \alpha_{campus}\sigma_{campus}^2}{\text{Reg}_{award}^2 \sigma_{FR}^2 + \sigma_{campus}^2}$$

If the SOC of battery 108 is expected to change (i.e., is not zero mean), the following equation may be used to define the depth of discharge:

$$E\{\text{max}-\text{min}\} = \begin{cases} R_0 + c \cdot \Delta SOC \cdot \exp\left\{-\alpha\frac{R_0 - \Delta SOC}{\sigma_{bat}}\right\} & \Delta SOC < R_0 \\ \Delta SOC + c \cdot R_0 \cdot \exp\left\{-\alpha\frac{\Delta SOC - R_0}{\sigma_{bat}}\right\} & \Delta SOC > R_0 \end{cases}$$

where $R_0$ is the expected range with zero expected change in the state of charge. Battery degradation estimator 418 may use the previous equations to establish a relationship between the capacity loss $C_{loss,add}$ and the control outputs provided by controller 112.

Still referring to FIG. 4, variable SOC controller 408 is shown to include a revenue loss estimator 420. Revenue loss estimator 420 may be configured to estimate an amount of potential revenue that will be lost as a result of the battery capacity loss $C_{loss,add}$. In some embodiments, revenue loss estimator 420 converts battery capacity loss $C_{loss,add}$ into lost revenue using the following equation:

$$R_{loss} = (\text{CP}_{cap} + \text{MR} \cdot \text{CP}_{perf}) C_{loss,add} P_{des}$$

where $R_{loss}$ is the lost revenue over the duration of the frequency response period.

Revenue loss estimator 420 may determine a present value of the revenue loss $R_{loss}$ using the following equation:

$$\lambda_{bat} = \left[\frac{1 - \left(1 + \frac{i}{n}\right)^{-n}}{\frac{i}{n}}\right] R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours). Revenue loss estimator 420 may provide the present value of the revenue loss $\lambda_{bat}$ to midpoint optimizer 412 for use in the objective function J.

Midpoint optimizer 412 may use the inputs from optimization constraints module 414, FR revenue estimator 416, battery degradation estimator 418, and revenue loss estimator 420 to define the terms in objective function J. Midpoint optimizer 412 may determine values for midpoint b that optimize objective function J. In various embodiments, midpoint optimizer 412 may use sequential quadratic programming, dynamic programming, or any other optimization technique.

Still referring to FIG. 4, high level controller 312 is shown to include a capability bid calculator 422. Capability bid calculator 422 may be configured to generate a capability bid $\text{Reg}_{award}$ based on the midpoint b generated by constant SOC controller 402 and/or variable SOC controller 408. In some embodiments, capability bid calculator 422 generates a capability bid that is as large as possible for a given midpoint, as shown in the following equation:

$$Reg_{award} = P_{limit} - |b|$$

where $P_{limit}$ is the power rating of power inverter 106. Capability bid calculator 422 may provide the capability bid to incentive provider 114 and to frequency response optimizer 424 for use in generating an optimal frequency response.

Filter Parameters Optimization

Still referring to FIG. 4, high level controller 312 is shown to include a frequency response optimizer 424 and a filter parameters optimizer 426. Filter parameters optimizer 426 may be configured to generate a set of filter parameters for low level controller 314. The filter parameters may be used by low level controller 314 as part of a low-pass filter that removes high frequency components from the regulation signal $Reg_{signal}$. In some embodiments, filter parameters optimizer 426 generates a set of filter parameters that transform the regulation signal $Reg_{signal}$ into an optimal frequency response signal $Res_{FR}$. Frequency response optimizer 424 may perform a second optimization process to determine the optimal frequency response $Res_{FR}$ based on the values for $Reg_{award}$ and midpoint b. In the second optimization, the values for $Reg_{award}$ and midpoint b may be fixed at the values previously determined during the first optimization.

In some embodiments, frequency response optimizer 424 determines the optimal frequency response $Res_{FR}$ by optimizing value function J shown in the following equation:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where the frequency response revenue $Rev(Reg_{award})$ is defined as follows:

$$Rev(Reg_{award}) = PS \cdot Reg_{award}(CP_{cap} + MR \cdot CP_{perf})$$

and the frequency response $Res_{FR}$ is substituted for the regulation signal $Reg_{signal}$ in the battery life model used to calculate $\lambda_{bat,k}$. The performance score PS may be based on several factors that indicate how well the optimal frequency response $Res_{FR}$ tracks the regulation signal $Reg_{signal}$.

The frequency response $Res_{FR}$ may affect both Rev ($Reg_{award}$) and the monetized cost of battery degradation $\lambda_{bat}$. Closely tracking the regulation signal may result in higher performance scores, thereby increasing the frequency response revenue. However, closely tracking the regulation signal may also increase the cost of battery degradation $\lambda_{bat}$. The optimized frequency response $Res_{FR}$ represents an optimal tradeoff between decreased frequency response revenue and increased battery life (i.e., the frequency response that maximizes value J).

In some embodiments, the performance score PS is a composite weighting of an accuracy score, a delay score, and a precision score. Frequency response optimizer 424 may calculate the performance score PS using the performance score model shown in the following equation:

$$PS = \tfrac{1}{3} PS_{acc} + \tfrac{1}{3} PS_{delay} + \tfrac{1}{3} PS_{prec}$$

where $PS_{acc}$ is the accuracy score, $PS_{delay}$ is the delay score, and $PS_{prec}$ is the precision score. In some embodiments, each term in the precision score is assigned an equal weighting (e.g., 1/3). In other embodiments, some terms may be weighted higher than others.

The accuracy score $PS_{acc}$ may be the maximum correlation between the regulation signal $Reg_{signal}$ and the optimal frequency response $Res_{FR}$. Frequency response optimizer 424 may calculate the accuracy score $PS_{acc}$ using the following equation:

$$PS_{acc} = \max_{\delta} r_{Reg, Res(\delta)}$$

where $\delta$ is a time delay between zero and $\delta_{max}$ (e.g., between zero and five minutes).

The delay score $PS_{delay}$ may be based on the time delay 6 between the regulation signal $Reg_{signal}$ and the optimal frequency response $Res_{FR}$. Frequency response optimizer 424 may calculate the delay score $PS_{delay}$ using the following equation:

$$PS_{delay} = \left| \frac{\delta[s] - \delta_{max}}{\delta_{max}} \right|$$

where $\delta[s]$ is the time delay of the frequency response $Res_{FR}$ relative to the regulation signal $Reg_{signal}$ and $\delta_{max}$ is the maximum allowable delay (e.g., 5 minutes or 300 seconds).

The precision score $PS_{prec}$ may be based on a difference between the frequency response $Res_{FR}$ and the regulation signal $Reg_{signal}$. Frequency response optimizer 424 may calculate the precision score $PS_{prec}$ using the following equation:

$$PS_{prec} = 1 - \frac{\sum |Res_{FR} - Reg_{signal}|}{\sum |Reg_{signal}|}$$

Frequency response optimizer 424 may use the estimated performance score and the estimated battery degradation to define the terms in objective function J. Frequency response optimizer 424 may determine values for frequency response $Res_{FR}$ that optimize objective function J. In various embodiments, frequency response optimizer 424 may use sequential quadratic programming, dynamic programming, or any other optimization technique.

Filter parameters optimizer 426 may use the optimized frequency response $Res_{FR}$ to generate a set of filter parameters for low level controller 314. In some embodiments, the filter parameters are used by low level controller 314 to translate an incoming regulation signal into a frequency response signal. Low level controller 314 is described in greater detail with reference to FIG. 5.

Figure 17:
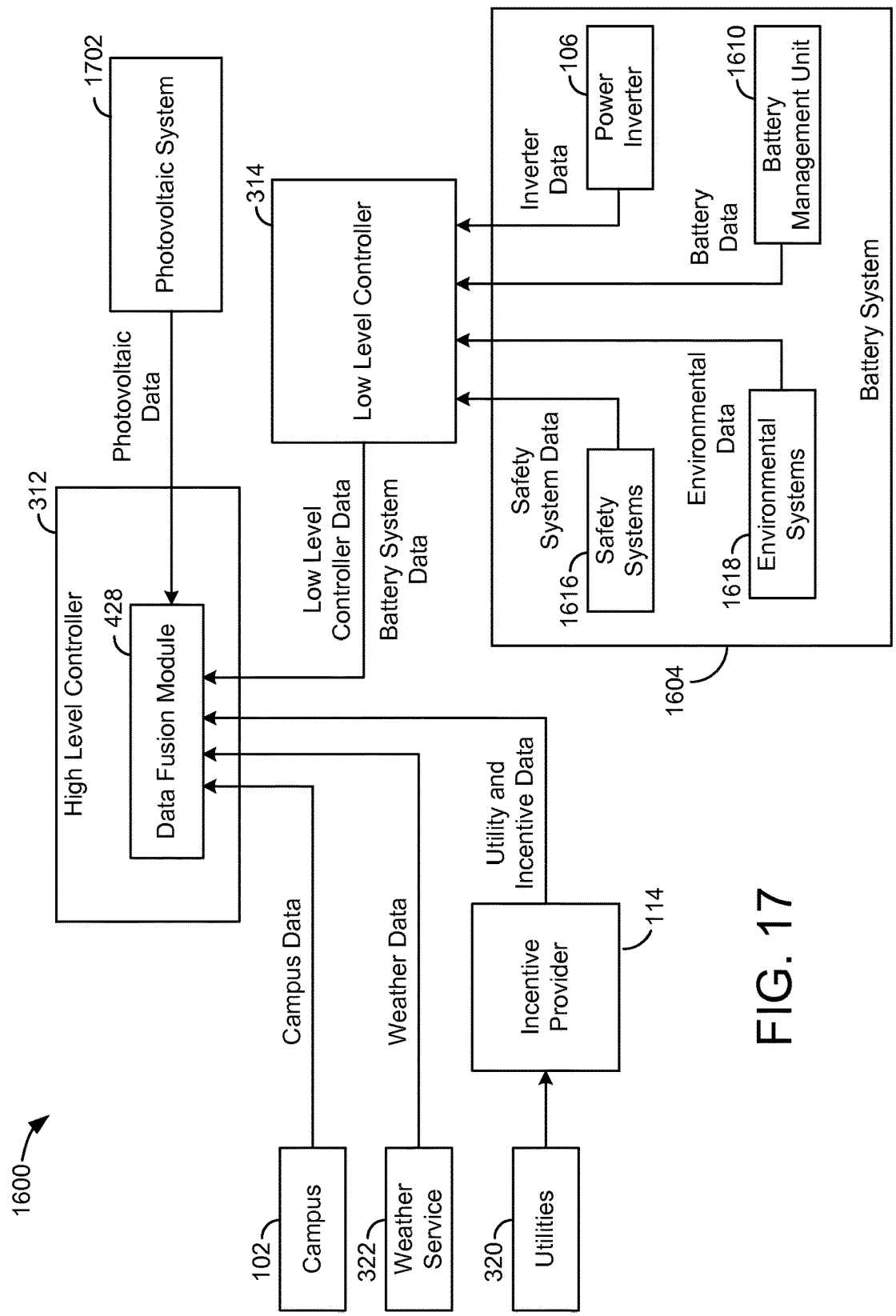
FIG. 17 is a block diagram illustrating data flow into a data fusion module of the frequency response control system of FIG. 16, according to an exemplary embodiment.

Still referring to FIG. 4, high level controller 312 is shown to include a data fusion module 428. Data fusion module 428 is configured to aggregate data received from external systems and devices for processing by high level controller 312. For example, data fusion module 428 may store and aggregate external data such as the campus power signal, utility rates, incentive event history and/or weather forecasts as shown in FIG. 17. Further, data fusion module 428 may store and aggregate data from low level controller 314. For example, data fusion module 428 may receive data such as battery SOC, battery temperature, battery system temperature data, security device status data, battery voltage data, battery current data and/or any other data provided by battery system 1604. Data fusion module 428 is described in greater detail with reference to FIG. 17.

Low Level Controller

Figure 5:
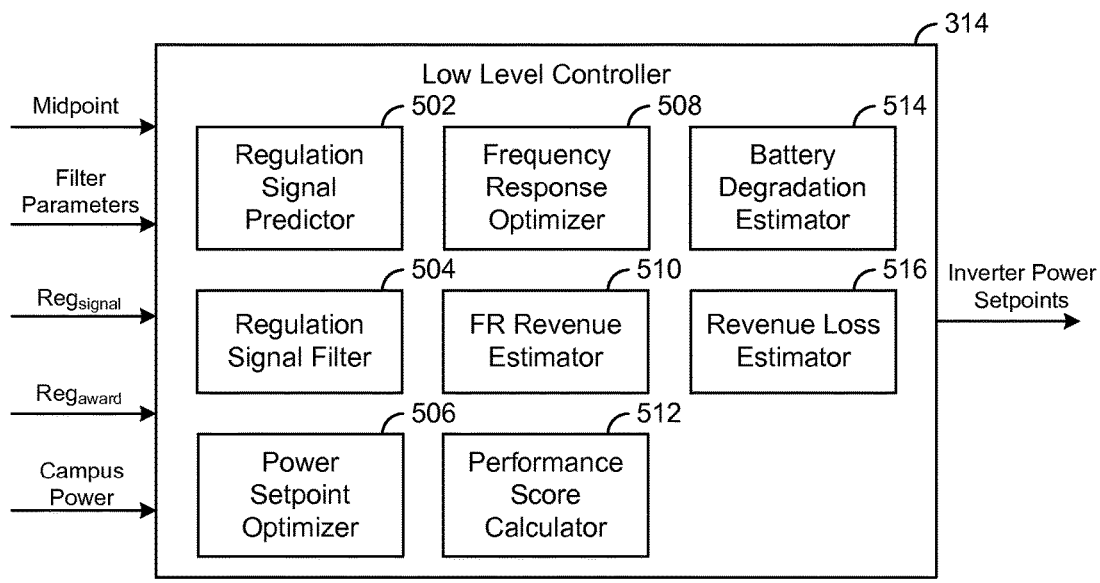
FIG. 5 is a block diagram illustrating the low level controller of FIG. 3 in greater detail, according to an exemplary embodiment.

Referring now to FIG. 5, a block diagram illustrating low level controller 314 in greater detail is shown, according to an exemplary embodiment. Low level controller 314 may receive the midpoints b and the filter parameters from high level controller 312. Low level controller 314 may also receive the campus power signal from campus 102 and the regulation signal $\text{Reg}_{signal}$ and the regulation award $\text{Reg}_{award}$ from incentive provider 114. Low level controller 314 may be configured to predict and filter the regulation signal $\text{Reg}_{signal}$, estimate frequency response revenue, estimate battery degradation, and determine optimal battery power setpoints. These features are described briefly in the following paragraphs and in greater detail with reference to FIGS. 8-10.

Predicting and Filtering the Regulation Signal

Low level controller 314 is shown to include a regulation signal predictor 502. Regulation signal predictor 502 may use a history of past and current values for the regulation signal $\text{Reg}_{signal}$ to predict future values of the regulation signal. In some embodiments, regulation signal predictor 502 uses a deterministic plus stochastic model trained from historical regulation signal data to predict future values of the regulation signal $\text{Reg}_{signal}$. For example, regulation signal predictor 502 may use linear regression to predict a deterministic portion of the regulation signal $\text{Reg}_{signal}$ and an AR model to predict a stochastic portion of the regulation signal $\text{Reg}_{signal}$. In some embodiments, regulation signal predictor 502 predicts the regulation signal $\text{Reg}_{signal}$ using the techniques described in U.S. patent application Ser. No. 14/717,593, titled "Building Management System for Forecasting Time Series Values of Building Variables" and filed May 20, 2015.

Low level controller 314 is shown to include a regulation signal filter 504. Regulation signal filter 504 may filter the incoming regulation signal $\text{Reg}_{signal}$ and/or the predicted regulation signal using the filter parameters provided by high level controller 312. In some embodiments, regulation signal filter 504 is a low pass filter configured to remove high frequency components from the regulation signal $\text{Reg}_{signal}$. Regulation signal filter 504 may provide the filtered regulation signal to power setpoint optimizer 506.

Determining Optimal Power Setpoints

Power setpoint optimizer 506 may be configured to determine optimal power setpoints for power inverter 106 based on the filtered regulation signal. In some embodiments, power setpoint optimizer 506 uses the filtered regulation signal as the optimal frequency response. For example, low level controller 314 may use the filtered regulation signal to calculate the desired interconnection power $P_{POI}^*$ using the following equation:

$$P_{POI}^* = \text{Reg}_{award} \cdot \text{Reg}_{filter} + b$$

where $\text{Reg}_{filter}$ is the filtered regulation signal. Power setpoint optimizer 506 may subtract the campus power $P_{campus}$ from the desired interconnection power $P_{POI}^*$ to calculate the optimal power setpoints $P_{SP}$ for power inverter 106, as shown in the following equation:

$$P_{SP} = P_{POI}^* - P_{campus}$$

In other embodiments, low level controller 314 performs an optimization to determine how closely to track $P_{POI}^*$. For example, low level controller 314 is shown to include a frequency response optimizer 508. Frequency response optimizer 508 may determine an optimal frequency response $\text{Res}_{FR}$ by optimizing value function J shown in the following equation:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where the frequency response $\text{Res}_{FR}$ affects both $\text{Rev}(\text{Reg}_{award})$ and the monetized cost of battery degradation $\lambda_{bat}$. The frequency response $\text{Res}_{FR}$ may affect both Rev ($\text{Reg}_{award}$) and the monetized cost of battery degradation $\lambda_{bat}$. The optimized frequency response $\text{Res}_{FR}$ represents an optimal tradeoff between decreased frequency response revenue and increased battery life (i.e., the frequency response that maximizes value J). The values of $\text{Rev}(\text{Reg}_{award})$ and $\lambda_{bat,k}$ may be calculated by FR revenue estimator 510, performance score calculator 512, battery degradation estimator 514, and revenue loss estimator 516.

Estimating Frequency Response Revenue

Still referring to FIG. 5, low level controller 314 is shown to include a FR revenue estimator 510. FR revenue estimator 510 may estimate a frequency response revenue that will result from the frequency response $\text{Res}_{FR}$. In some embodiments, FR revenue estimator 510 estimates the frequency response revenue using the following equation:

$$\text{Rev}(\text{Reg}_{award}) = \text{PS} \cdot \text{Reg}_{award}(\text{CP}_{cap} + \text{MR} \cdot \text{CP}_{perf})$$

where $\text{Reg}_{award}$, $\text{CP}_{cap}$, MR, and $\text{CP}_{perf}$ are provided as known inputs and PS is the performance score.

Low level controller 314 is shown to include a performance score calculator 512. Performance score calculator 512 may calculate the performance score PS used in the revenue function. The performance score PS may be based on several factors that indicate how well the optimal frequency response $\text{Res}_{FR}$ tracks the regulation signal $\text{Reg}_{signal}$. In some embodiments, the performance score PS is a composite weighting of an accuracy score, a delay score, and a precision score. Performance score calculator 512 may calculate the performance score PS using the performance score model shown in the following equation:

$$\text{PS} = \tfrac{1}{3}\text{PS}_{acc} + \tfrac{1}{3}\text{PS}_{delay} + \tfrac{1}{3}\text{PS}_{prec}$$

where $\text{PS}_{acc}$ is the accuracy score, $\text{PS}_{delay}$ is the delay score, and $\text{PS}_{prec}$ is the precision score. In some embodiments, each term in the precision score is assigned an equal weighting (e.g., 1/3). In other embodiments, some terms may be weighted higher than others. Each of the terms in the performance score model may be calculated as previously described with reference to FIG. 4.

Estimating Battery Degradation

Still referring to FIG. 5, low level controller 314 is shown to include a battery degradation estimator 514. Battery degradation estimator 514 may be the same or similar to battery degradation estimator 418, with the exception that battery degradation estimator 514 predicts the battery degradation that will result from the frequency response $\text{Res}_{FR}$ rather than the original regulation signal $\text{Reg}_{signal}$. The estimated battery degradation may be used as the term $\lambda_{batt}$ in the objective function J. Frequency response optimizer 508 may use the estimated battery degradation along with other terms in the objective function J to determine an optimal frequency response $\text{Res}_{FR}$.

In some embodiments, battery degradation estimator 514 uses a battery life model to predict a loss in battery capacity that will result from the frequency response $\text{Res}_{FR}$. The battery life model may define the loss in battery capacity $C_{loss,add}$ as a sum of multiple piecewise linear functions, as shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state of charge, DOD is the depth of discharge, PR is the average power ratio $$\left(\text{e.g., } PR = avg\left(\frac{P_{avg}}{P_{des}}\right)\right),$$

and ER is the average effort ratio $$\left(\text{e.g., } ER = avg\left(\frac{\Delta P_{bat}}{P_{des}}\right)\right)$$

of battery 108. $C_{loss,nom}$ is the nominal loss in battery capacity that is expected to occur over time. Therefore, $C_{loss,add}$ represents the additional loss in battery capacity degradation in excess of the nominal value $C_{loss,nom}$. The terms in the battery life model may be calculated as described with reference to FIG. 4, with the exception that the frequency response $Res_{FR}$ is used in place of the regulation signal $Reg_{signal}$.

Still referring to FIG. 5, low level controller 314 is shown to include a revenue loss estimator 516. Revenue loss estimator 516 may be the same or similar to revenue loss estimator 420, as described with reference to FIG. 4. For example, revenue loss estimator 516 may be configured to estimate an amount of potential revenue that will be lost as a result of the battery capacity loss $C_{loss,add}$. In some embodiments, revenue loss estimator 516 converts battery capacity loss $C_{loss,add}$ into lost revenue using the following equation:

$$R_{loss} = (CP_{cap} + MR \cdot CP_{perf}) C_{loss,add} P_{des}$$

where $R_{loss}$ is the lost revenue over the duration of the frequency response period.

Revenue loss estimator 420 may determine a present value of the revenue loss $R_{loss}$ using the following equation:

$$\lambda_{bat} = \left[\frac{1 - \left(1 + \frac{i}{n}\right)^{-n}}{\frac{i}{n}}\right] R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours). Revenue loss estimator 420 may provide the present value of the revenue loss $\lambda_{bat}$ to frequency response optimizer 508 for use in the objective function J.

Frequency response optimizer 508 may use the estimated performance score and the estimated battery degradation to define the terms in objective function J. Frequency response optimizer 508 may determine values for frequency response $Res_{FR}$ that optimize objective function J. In various embodiments, frequency response optimizer 508 may use sequential quadratic programming, dynamic programming, or any other optimization technique.

Frequency Response Optimization Processes

Referring now to FIG. 6, a flowchart of a process 600 for determining optimal battery power setpoints in a frequency response optimization system is shown, according to an exemplary embodiment. Process 600 may be performed by one or more components of frequency response optimization system 100, as described with reference to FIGS. 1-5.

Process 600 is shown to include predicting regulation signal statistics, campus power use, and energy market statistics for one or more frequency response periods (step 602). The regulation signal statistics may include a mean and a standard deviation of the regulation signal $Reg_{signal}$. Predicting the campus power use may include predicting the electric power consumption of the campus (e.g., $P_{campus}$) over the duration of the frequency response periods. In some embodiments, predicting campus power use includes predicting statistics of the campus power use (e.g., mean, standard deviation, etc.). Predicting energy market statistics may include predicting energy prices such as electricity rates and demand charges. Predicting energy market statistics may also include predicting frequency response statistics such as clearing capability price $CP_{cap}$, clearing performance price $CP_{perf}$, and mileage ratio MR.

Process 600 is shown to include determining frequency response midpoints that maintain a battery at the same state of charge at the beginning and end of each frequency response period (step 604). Step 604 may be performed by constant state of charge controller 402. In some embodiments, step 604 includes determining expected values for the regulation signal $Reg_{signal}$, campus power use $P_{campus}$, regulation award $Reg_{award}$, battery power loss $P_{loss}$, and maximum battery power $P_{max}$. The expected value of the regulation award $Reg_{award}$ may be assumed to be the difference between the midpoint b and the power inverter power limit $P_{limit}$ (e.g., $Reg_{award} = P_{limit} - |b|$). The midpoint b which maintains the battery at the same state of charge at the beginning and end of each frequency response period can be determined by solving the following equation:

$$\frac{1}{4P_{max}}[E\{P_{campus}^2\} + $$
$$Reg_{award}^2 E\{Reg_{signal}^2\} - 2Reg_{award} E\{Reg_{signal}\} E\{P_{campus}\}]$$
$$\Delta t + [Reg_{award} E\{Reg_{signal}\} - E\{P_{campus}\}]\Delta t + $$
$$\frac{b}{2P_{max}}[Reg_{award} E\{Reg_{signal}\} - E\{P_{campus}\}]\Delta t + b\Delta t + \frac{b^2}{4P_{max}}\Delta t = 0$$

which can be solved for midpoint b.

Process 600 is shown to include generating an objective function that estimates value as a function of frequency response revenue, energy costs, and monetized costs of losses in battery capacity (step 606). An exemplary value function which may be generated in step 606 is shown in the following equation:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where $Rev(Reg_{award,k})$ is the frequency response revenue, $c_k b_k$ is the cost per unit of electricity, the min( ) term is the demand charge, and $\lambda_{bat,k}$ is the monetized cost of battery degradation.

The frequency response revenue may be determined using the following equation:

$$Rev(Reg_{award}) = PS \cdot Reg_{award}(CP_{cap} + MR \cdot CP_{perf})$$

where $\text{Reg}_{award}$, $\text{CP}_{cap}$, MR, and $\text{CP}_{perf}$ are provided as known inputs and PS is the performance score. In some embodiments, the performance score PS is a composite weighting of an accuracy score, a delay score, and a precision score. The performance score PS may be calculated using the performance score model shown in the following equation:

$$PS = \tfrac{1}{3}PS_{acc} + \tfrac{1}{3}PS_{delay} + \tfrac{1}{3}PS_{prec}$$

where $PS_{acc}$ is the accuracy score, $PS_{delay}$ is the delay score, and $PS_{prec}$ is the precision score. In some embodiments, each term in the precision score is assigned an equal weighting (e.g., ⅓). In other embodiments, some terms may be weighted higher than others. Each of the terms in the performance score model may be calculated as previously described with reference to FIG. 4.

The cost of battery degradation may be determined using a battery life model. An exemplary battery life model which may be used to determine battery degradation is shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state of charge, DOD is the depth of discharge, PR is the average power ratio $$\left(\text{e.g., } PR = avg\left(\frac{P_{avg}}{P_{des}}\right)\right),$$

and ER is the average effort ratio $$\left(\text{e.g., } ER = avg\left(\frac{\Delta P_{bat}}{P_{des}}\right)\right)$$

of battery 108. The terms in the battery life model may be calculated as described with reference to FIGS. 4-5, using the frequency response $\text{Res}_{FR}$ as the optimization variable.

The battery capacity loss $C_{loss,add}$ can be converted into lost revenue using the following equation:

$$R_{loss} = (CP_{cap} + MR \cdot CP_{perf}) C_{loss,add} P_{des}$$

where $R_{loss}$ is the lost revenue over the duration of the frequency response period. The present value of the revenue loss $R_{loss}$ can be calculated as follows:

$$\lambda_{bat} = \left[\frac{1 - \left(1 + \frac{i}{n}\right)^{-n}}{\frac{i}{n}}\right] R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours).

Still referring to FIG. 6, process 600 is shown to include performing an optimization to determine battery power setpoints that optimize the objective function based on the midpoints (step 608). Step 608 may be performed by low level controller 314, as described with reference to FIG. 5. Step 608 may include using the objective function to determine the optimal frequency response $\text{Res}_{FR}$. The optimal frequency response may be the frequency response which maximizes J. The optimal frequency response $\text{Res}_{FR}$ can be used to calculate the desired interconnection power $P_{POI}^*$ using the following equation:

$$P_{POI}^* = \text{Reg}_{award} \cdot \text{Res}_{FR} + b$$

Step 608 may include subtracting the campus power $P_{campus}$ from the desired interconnection power $P_{POI}^*$ to calculate the optimal battery power setpoints $P_{SP}$, as shown in the following equation:

$$P_{SP} = P_{POI}^* - P_{campus}$$

Process 600 is shown to include using the battery power setpoints to control an amount of power charged or discharged from the battery (step 610). Step 610 may include providing the battery power setpoints to a battery power inverter (e.g., power inverter 106). The power inverter may use the battery power setpoints to an amount of power drawn from the battery or stored in the battery during each of a plurality of time steps. Power drawn from the battery may be used to power the campus or provided to an energy grid.

Referring now to FIG. 7, a flowchart of a process 700 for determining optimal battery power setpoints in a frequency response optimization system is shown, according to an exemplary embodiment. Process 700 may be performed by one or more components of frequency response optimization system 100, as described with reference to FIGS. 1-5.

Process 700 is shown to include predicting regulation signal statistics, campus power use, and energy market statistics for one or more frequency response periods (step 702). The regulation signal statistics may include a mean and a standard deviation of the regulation signal $\text{Reg}_{signal}$. Predicting the campus power use may include predicting the electric power consumption of the campus (e.g., $P_{campus}$) over the duration of the frequency response periods. In some embodiments, predicting campus power use includes predicting statistics of the campus power use (e.g., mean, standard deviation, etc.). Predicting energy market statistics may include predicting energy prices such as electricity rates and demand charges. Predicting energy market statistics may also include predicting frequency response statistics such as clearing capability price $CP_{cap}$, clearing performance price $CP_{perf}$, and mileage ratio MR.

Process 700 is shown to include generating an objective function that estimates value as a function of frequency response revenue, energy costs, and monetized costs of losses in battery capacity (step 704). An exemplary value function which may be generated in step 704 is shown in the following equation:

$$J = \sum_{k=1}^{h} Rev(\text{Reg}_{award,k}) + \sum_{k=1}^{h} c_k b_k + \min_{period}(P_{campus,k} + b_k) - \sum_{k=1}^{h} \lambda_{bat,k}$$

where $Rev(\text{Reg}_{award,k})$ is the frequency response revenue, $c_k b_k$ is the cost per unit of electricity, the min( ) term is the demand charge, and $\lambda_{bat,k}$ is the monetized cost of battery degradation.

The frequency response revenue may be determined using the following equation:

$$Rev(\text{Reg}_{award}) = \text{Reg}_{award}(CP_{cap} + MR \cdot CP_{perf})$$

where $\text{Reg}_{award}$, $CP_{cap}$, MR, and $CP_{perf}$ are provided as known inputs and PS is the performance score.

The cost of battery degradation may be determined using a battery life model. An exemplary battery life model which may be used to determine battery degradation is shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state of charge, DOD is the depth of discharge, PR is the average power ratio $$\left(\text{e.g., } PR = avg\left(\frac{P_{avg}}{P_{des}}\right)\right),$$

and ER the average effort ratio $$\left(\text{e.g., } ER = avg\left(\frac{\Delta P_{bat}}{P_{des}}\right)\right)$$

of battery 108. The terms in the battery life model may be calculated as described with reference to FIGS. 4-5, using the midpoint b as the optimization variable.

The battery capacity loss $C_{loss,add}$ can be converted into lost revenue using the following equation:

$$R_{loss} = (CP_{cap} + MR \cdot CP_{perf}) C_{loss,add} P_{des}$$

where $R_{loss}$ is the lost revenue over the duration of the frequency response period. The present value of the revenue loss $R_{loss}$ can be calculated as follows:

$$\frac{1}{4P_{max}}[E\{P_{campus}^2\} + Reg_{award}^2 E\{Reg_{signal}^2\} - 2Reg_{award}E\{Reg_{signal}\}E\{P_{campus}\}]\Delta t + [Reg_{award}E\{Reg_{signal}\} - E\{P_{campus}\}]\Delta t + \frac{b}{2P_{max}}[Reg_{award}E\{Reg_{signal}\} - E\{P_{campus}\}]\Delta t + b\Delta t + \frac{b^2}{4P_{max}}\Delta t = 0$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours).

Process 700 is shown to include performing a high level optimization to determine frequency response midpoints that optimize the objective function based on the predicted regulation signal statistics (step 706). Step 706 may be performed by variable state of charge controller 408. Step 706 may include determining a set of midpoints b that maximize the objective function J. The optimization may be subject to optimization constraints. For example, step 706 may include implementing optimization constraints that keep the state of charge of the battery between threshold values (e.g., between 0 and 1) and/or constraints that prevent sum of the midpoint b and the campus power $P_{campus}$ from exceeding the power inverter rating $P_{limit}$, as described with respect to optimization constraints module 414.

In some embodiments, step 706 includes determining expected values for the regulation signal $Reg_{signal}$, campus power use $P_{campus}$, regulation award $Reg_{award}$, battery power loss $P_{loss}$, and maximum battery power $P_{max}$. The expected value of the regulation award Re a may be assumed to be the difference between the midpoint b and the power inverter power limit $P_{limit}$ (e.g., $Reg_{award} = P_{limit} - |b|$). The midpoint b can be expressed in terms of the change in the state of charge of the battery by solving the following equation:

$$\frac{1}{4P_{max}}[E\{P_{campus}^2\} + Reg_{award}^2 + E\{Reg_{signal}^2\} - 2Reg_{award}E\{Reg_{signal}\}E\{P_{campus}\}]\Delta t + [Reg_{award}E\{Reg_{signal}\} + E\{P_{campus}\}]\Delta t + \Delta SOC \cdot C_{des} + \frac{b}{2P_{max}}[Reg_{award}E\{Reg_{signal}\} - E\{P_{campus}\}]\Delta t + b\Delta t + \frac{b^2}{4P_{max}}\Delta t = 0$$

This relationship between midpoint b and the change in the SOC may be used to translate constraints on the SOC of the battery into constraints on midpoint b. The optimization problem can then be solved to determine optimal values for midpoint b.

Still referring to FIG. 7, process 700 is shown to include performing a low level optimization to determine battery power setpoints that optimize the objective function based on the midpoints (step 708). Step 708 may be performed by low level controller 314, as described with reference to FIG. 5. Step 708 may include using the objective function to determine the optimal frequency response $Res_{FR}$. The optimal frequency response may be the frequency response which maximizes J. The optimal frequency response $Res_{FR}$ can be used to calculate the desired interconnection power $P_{POI}^*$ using the following equation:

$$P_{POI}^* = Reg_{award} \cdot Res_{FR} + b$$

Step 708 may include subtracting the campus power $P_{campus}$ from the desired interconnection power $P_{POI}^*$ to calculate the optimal battery power setpoints $P_{SP}$, as shown in the following equation:

$$P_{SP} = P_{POI}^* - P_{campus}$$

Process 700 is shown to include using the battery power setpoints to control an amount of power charged or discharged from the battery (step 710). Step 710 may include providing the battery power setpoints to a battery power inverter (e.g., power inverter 106). The power inverter may use the battery power setpoints to an amount of power drawn from the battery or stored in the battery during each of a plurality of time steps. Power drawn from the battery may be used to power the campus or provided to an energy grid.

Low Level Controller

Figure 8:
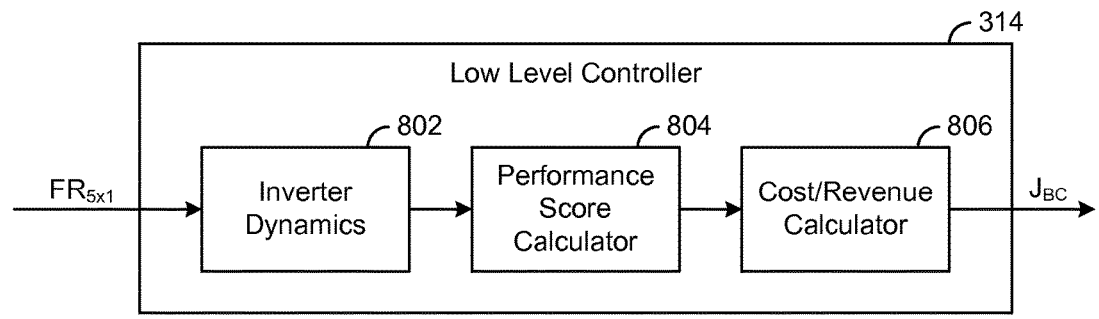
FIG. 8 is another block diagram illustrating the low level controller of FIG. 3 in greater detail in which the low level controller is shown as a baseline controller without cost optimization, according to an exemplary embodiment.
Figure 9:
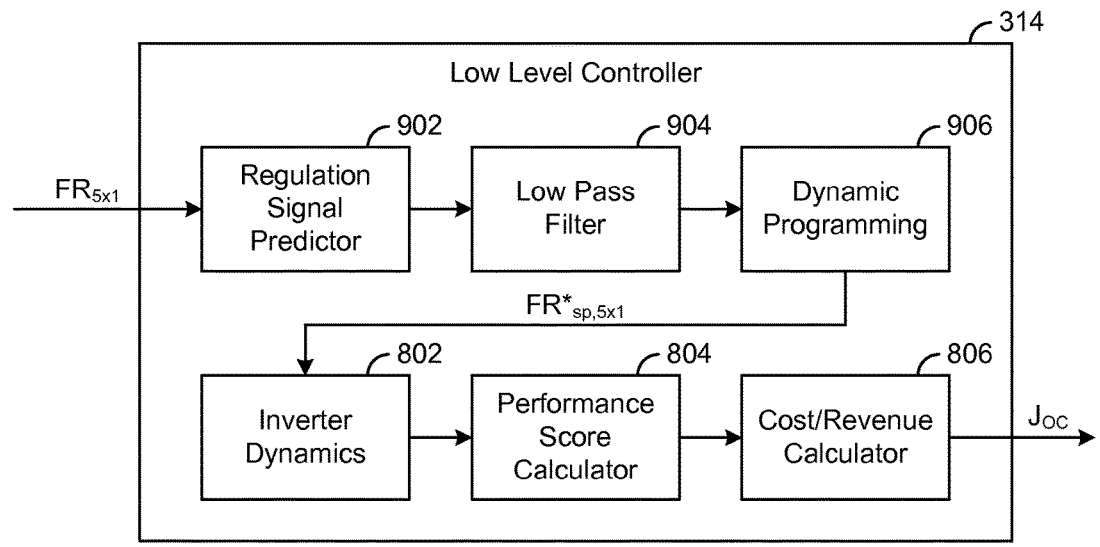
FIG. 9 is another block diagram illustrating the low level controller of FIG. 3 in greater detail in which the low level controller is shown as an optimal controller with cost optimization, according to an exemplary embodiment.
Figure 10:
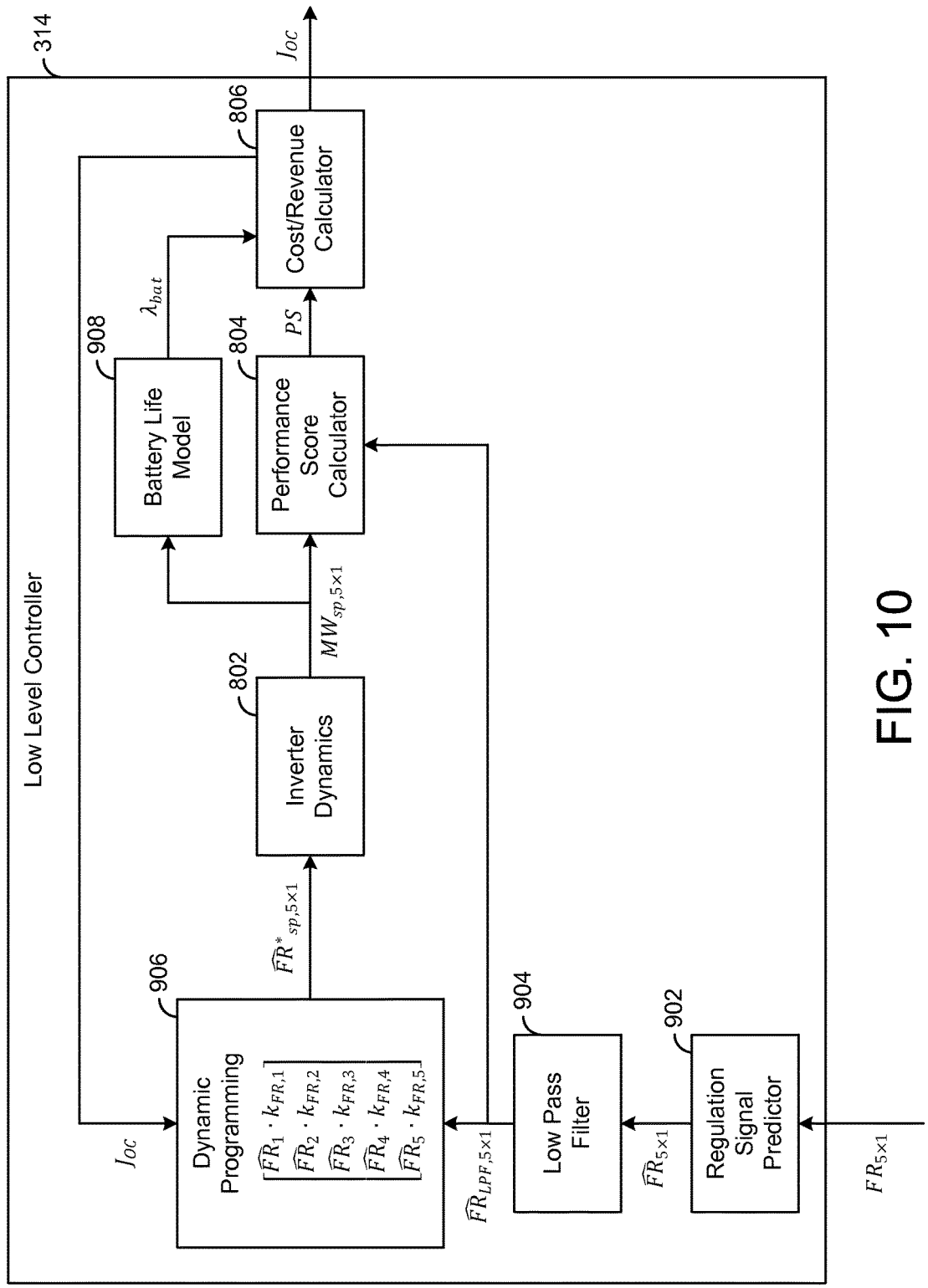
FIG. 10 is another block diagram illustrating the embodiment of the low level controller shown in FIG. 9, according to an exemplary embodiment.

Referring now to FIGS. 8-10, several block diagrams illustrating low level controller 314 in greater detail are shown, according to various exemplary embodiments. In FIG. 8, low level controller 314 is shown as a baseline controller without cost optimization. In FIG. 9, low level controller 314 is shown as an optimal controller with cost optimization. FIG. 10 illustrates the embodiment shown in FIG. 9 in greater detail. In each of FIGS. 8-10, low level controller 314 is shown receiving an input $FR_{5\times1}$, which represents a five-sample block of the frequency regulation signal. For embodiments in which the frequency regulation signal is sampled at two-second intervals, the five-sample block represents ten seconds of the frequency regulation signal.

Referring particularly to FIG. 8, a block diagram illustrating low level controller 314 as a baseline controller is shown, according to an exemplary embodiment. Low level controller 314 is shown to include inverter dynamics 802, a performance score calculator 804, and a cost/revenue calculator 806. Inverter dynamics 802 may receive the frequency regulation signal $FR_{5\times1}$ and convert the frequency regulation signal $FR_{5\times1}$ into a power setpoint $MW_k$ for the battery power inverter. In some embodiments, inverter dynamics 802 converts the frequency regulation signal $FR_{5\times1}$ into a power setpoint $MW_k$ using the following equation:

$$MW_k = MW_{k-1}e^{-\frac{\Delta t}{\tau}} + \left(1 - e^{-\frac{\Delta t}{\tau}}\right)FR_{k-1}$$

where $MW_k$ and $MW_{k-1}$ are the current and previous values of the power signal MW, $\Delta t$ is the interval between samples of the frequency regulation signal and/or power signal (e.g., 2 seconds), and $\tau$ is a time constant (e.g., 0.2 seconds).

Performance score calculator 804 may calculate the performance score PS based on the values of the power signal $MW_k$. In some embodiments, the performance score PS is a composite weighting of an accuracy score, a delay score, and a precision score. Performance score calculator 804 may calculate the performance score PS using the performance score model shown in the following equation:

$$PS = \tfrac{1}{3}PS_{acc} + \tfrac{1}{3}PS_{delay} + \tfrac{1}{3}PS_{prec}$$

where $PS_{acc}$ is the accuracy score, $PS_{delay}$ is the delay score, and $PS_{prec}$ is the precision score. In some embodiments, each term in the precision score is assigned an equal weighting (e.g., ⅓). In other embodiments, some terms may be weighted higher than others.

The accuracy score $PS_{acc}$ may be the maximum correlation between the regulation signal $Reg_{signal}$ and the optimal frequency response $Res_{FR}$. Performance score calculator 804 may calculate the accuracy score $PS_{acc}$ using the following equation:

$$PS_{acc} = \max_{\delta} r_{Reg,Res(\delta)}$$

where $\delta$ is a time delay between zero and $\delta_{max}$ (e.g., between zero and five minutes).

The delay score $PS_{delay}$ may be based on the time delay δ between the regulation signal $Reg_{signal}$ and the optimal frequency response $Res_{FR}$. Performance score calculator 804 may calculate the delay score $PS_{delay}$ using the following equation:

$$PS_{delay} = \left|\frac{\delta[s] - \delta_{max}}{\delta_{max}}\right|$$

where $\delta[s]$ is the time delay of the frequency response $Res_{FR}$ relative to the regulation signal $Reg_{signal}$ and $\delta_{max}$ is the maximum allowable delay (e.g., 5 minutes or 300 seconds).

The precision score $PS_{prec}$ may be based on a difference between the frequency response $Res_{FR}$ and the regulation signal $Reg_{signal}$. Performance score calculator 804 may calculate the precision score $PS_{prec}$ using the following equation:

$$PS_{prec} = 1 - \frac{\Sigma|Res_{FR} - Reg_{signal}|}{\Sigma|Reg_{signal}|}$$

Cost/revenue calculator 806 may calculate the revenue $J_{BC}$ (baseline controller revenue) resulting from operating the performance score PS. In some embodiments, cost/revenue calculator 806 calculates revenue $J_{BC}$ using the following equation:

$$J_{BC} = PS \cdot Reg_{award}(CP_{cap} + MR \cdot CP_{perf})$$

In the embodiment shown in FIG. 8, low level controller 314 does not consider battery degradation costs and therefore $J_{BC}$ does not include a cost associated with battery degradation.

Referring now to FIG. 9, a block diagram illustrating low level controller 314 as an optimal controller is shown, according to an exemplary embodiment. Low level controller 314 is shown to include inverter dynamics 802, performance score calculator 804, and cost/revenue calculator 806, which may be the same or similar as described with reference to FIG. 8. However, in the embodiment shown in FIG. 9, cost/revenue calculator 806 calculates an optimized revenue $J_{OC}$ which considers battery degradation costs $\lambda_{bat}$. For example, cost/revenue calculator 806 may calculate revenue $J_{OC}$ using the following equation:

$$J_{OC} = PS \cdot Reg_{award}(CP_{cap} + MR \cdot CP_{perf}) - \lambda_{bat}$$

where $\lambda_{bat}$ is the cost of battery degradation. The difference between $J_{BC}$ and $J_{OC}$ represents the cost (or foregone revenue) resulting from different control decisions made by low level controller 314 in the interest of protecting the battery, as shown in the following equation:

$$\text{Cost to Protect Battery} = J_{BC} - J_{OC}$$

In the embodiment shown in FIG. 9, inverter dynamics 802 is shown receiving an optimal regulation signal $\widetilde{FR}^*_{sp,5\times1}$ rather than the original regulation signal $FR_{5\times1}$. Low level controller 314 may be configured to generate the optimal regulation signal $\widetilde{FR}^*_{sp,5\times1}$ by processing the original regulation signal $FR_{5\times1}$ with regulation signal predictor 902, low pass filter 904, and dynamic programming 906.

Regulation signal predictor 902 may use the original samples of the regulation signal $FR_{5\times1}$ to predict future values of the regulation signal $\widetilde{FR}_{5\times1}$. In some embodiments, regulation signal predictor 902 predicts the regulation signal $\widetilde{FR}_{5\times1}$ using an autoregressive (AR) model. For example, regulation signal predictor 902 may generate a 5$^{th}$ order AR model of the form:

$$A(z)FR_{5\times1} = e(t)$$

where $A(z)$ is of the form:

$$A(z) = 1 + A_1 z^{-1} + A_2 z^{-2} + A_3 z^{-3} + A_4 z^{-4} + A_5 z^{-5}$$

where the values of $A_1$-$A_5$ are based on the original frequency response signal $FR_{5\times1}$. In an exemplary embodiment $A_1$-$A_5$ have the following values:
$A_1 = -0.97522$
$A_2 = -0.37687$
$A_3 = -0.30623$
$A_4 = -0.19011$
$A_5 = 0.23978$ In other embodiments, regulation signal predictor 902 uses a deterministic plus stochastic model trained from historical regulation signal data to predict future values of the regulation signal $\widetilde{FR}_{5\times1}$. For example, regulation signal predictor 902 may use linear regression to predict a deterministic portion of the regulation signal $\widetilde{FR}_{5\times1}$ and an AR model to predict a stochastic portion of the regulation signal $\widetilde{FR}_{5\times1}$. In some embodiments, regulation signal predictor 902 predicts the regulation signal $\widetilde{FR}_{5\times1}$ using the techniques described in U.S. patent application Ser. No.

14/717,593, titled "Building Management System for Forecasting Time Series Values of Building Variables" and filed May 20, 2015.

Low pass filter 904 may filter the predicted regulation signal $\tilde{FR}_{5\times1}$ using the filter parameters provided by high level controller 312 to remove high frequency components from the predicted regulation signal $\tilde{FR}_{5\times1}$. In some embodiments, low pass filter 904 generates a filtered predicted regulation signal $\tilde{FR}_{LPF,5\times1}$ using the following equation:

$$\tilde{FR}_{LPF,k+1} = \alpha \tilde{FR}_{LPF,k} + (1-\alpha)(\tilde{k}\tilde{FR}_k)$$

where $\alpha$ and $\tilde{k}$ are the filter parameters received from high level controller 312. In an exemplary embodiment, $\alpha=0.5$ and $\tilde{k}=1$.

Dynamic programming 906 may be configured to use the filtered data points in $\tilde{FR}_{LPF,5\times1}$ to determine the scaling coefficients $k_{5\times1}$ that maximize the value function $J_{OC}$. For example, dynamic programming 906 may be configured to vary the scaling coefficients $k_{5\times1}$ over a range of states (e.g., $k_{5\times1}=[0.7:0.1:1.3]$) and calculate the battery degradation cost $\lambda_{batt}$, performance score PS, and value $J_{OC}$ that results from different values of $k_{5\times1}$. Dynamic programming 906 may find the scaling coefficients $k_{5\times1}$ that result in the maximum value $J_{OC}$.

Referring now to FIG. 10, another block diagram of low level controller 314 is shown, according to an exemplary embodiment. FIG. 10 illustrates the embodiment shown in FIG. 9 in greater detail. Regulation signal predictor 902 is shown receiving the regulation signal $FR_{5\times1}$ and using the regulation signal $FR_{5\times1}$ to generate a predicted regulation signal $\tilde{FR}_{5\times1}$. In some embodiments, regulation signal predictor 902 divides the regulation signal into 50-sample blocks and performs the prediction on the individual 50-sample blocks to generate the predicted regulation signals $\tilde{FR}_{5\times1}$.

Low pass filter 904 may filter individual 5-sample blocks (i.e., ten seconds of predicted regulation signal data) to generate the filtered regulation signal values $\tilde{FR}_{LPF,5\times1}$. Low pass filter 904 provides the filtered values $\tilde{FR}_{LPF,5\times1}$ to dynamic programming 906. Dynamic programming 906 may multiply the filtered values $\tilde{FR}_{LPF,5\times1}$ scaling coefficients $k_{FR,5\times1}$ to generate the optimal frequency response $\tilde{FR}^*_{sp,5\times1}$. In some embodiments, dynamic programming 906 performs element-by-element multiplication as shown in the following equation:

$$\tilde{FR}^*_{sp,5\times1} = \begin{bmatrix} \tilde{FR}_1 \cdot k_{FR,1} \\ \tilde{FR}_2 \cdot k_{FR,2} \\ \tilde{FR}_3 \cdot k_{FR,3} \\ \tilde{FR}_4 \cdot k_{FR,4} \\ \tilde{FR}_5 \cdot k_{FR,5} \end{bmatrix}$$

where the values for the scaling coefficients $k_{FR,5\times1}$ are determined using an optimization process. For example, dynamic programming 906 is shown receiving the revenue $J_{OC}$ from cost/revenue calculator 806. Dynamic programming 906 may select values of $k_{FR,5\times1}$ that optimize (e.g., maximize) the revenue value $J_{OC}$.

The optimal frequency response $\tilde{FR}^*_{sp,5\times1}$ is provided to inverter dynamics 802 which converts the frequency response $\tilde{FR}^*_{sp,5\times1}$ into battery power setpoints $MW_{sp,5\times1}$. The battery power setpoints $MW_{sp,5\times1}$ may be provided as inputs to both performance score calculator 804 and battery life model 908. Performance score calculator 804 uses the battery power setpoints $MW_{sp,5\times1}$ to determine a resultant performance score PS. Battery life model 908 uses the battery power setpoints $MW_{sp,5\times1}$ to estimate a battery degradation cost $\lambda_{bat}$, as previously described.

Both the performance score PS and the battery degradation cost $\lambda_{bat}$ may be provided as inputs to cost/revenue calculator 806. Cost/revenue calculator 806 may use the performance score PS and the battery degradation cost $\lambda_{bat}$ to estimate amount of revenue $J_{OC}$ that will result from the battery power setpoints $MW_{sp,5\times1}$. In some embodiments, cost/revenue calculator 806 estimates revenue $J_{OC}$ using the following equation:

$$J_{OC} = PS \cdot Reg_{award}(CP_{cap} + MR \cdot CP_{perf}) - \lambda_{bat}$$

The revenue $J_{OC}$ may be provided as a feedback to dynamic programming 906 for use in optimizing the scaling coefficients $k_{FR,5\times1}$.

Figure 11:
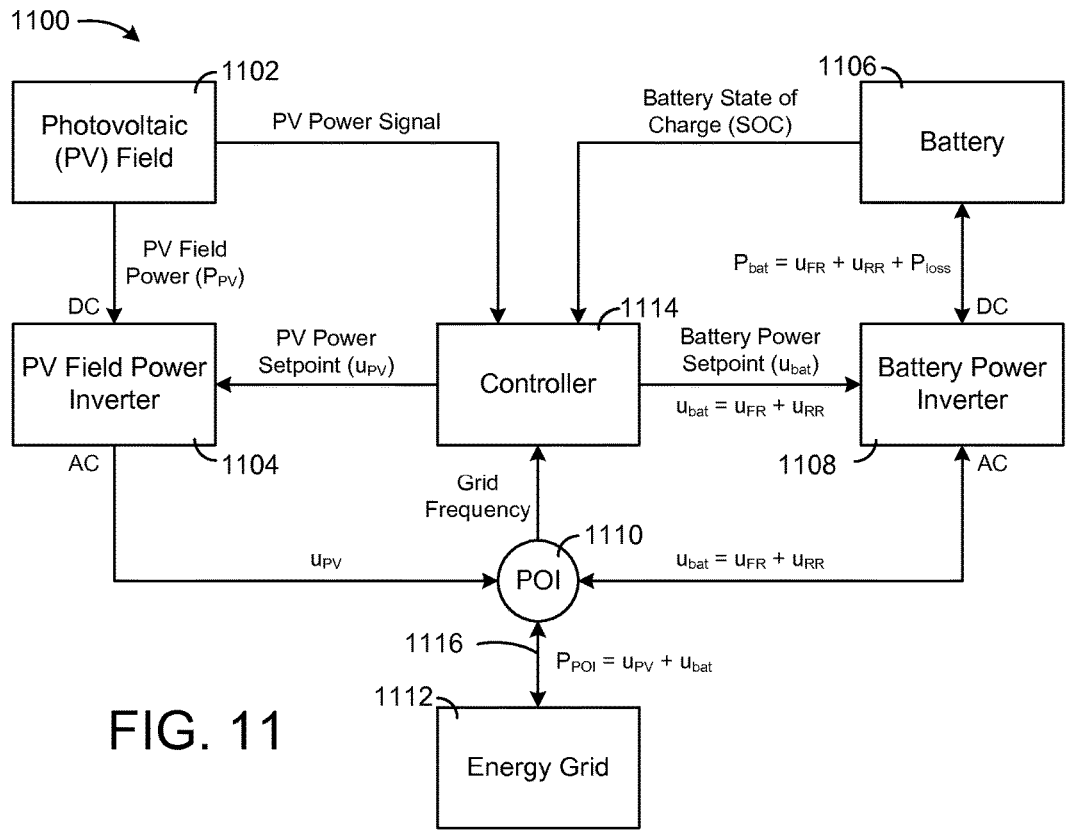
FIG. 11 is a block diagram of an electrical energy storage system that uses battery storage to perform both ramp rate control and frequency regulation, according to an exemplary embodiment.
Figure 12:
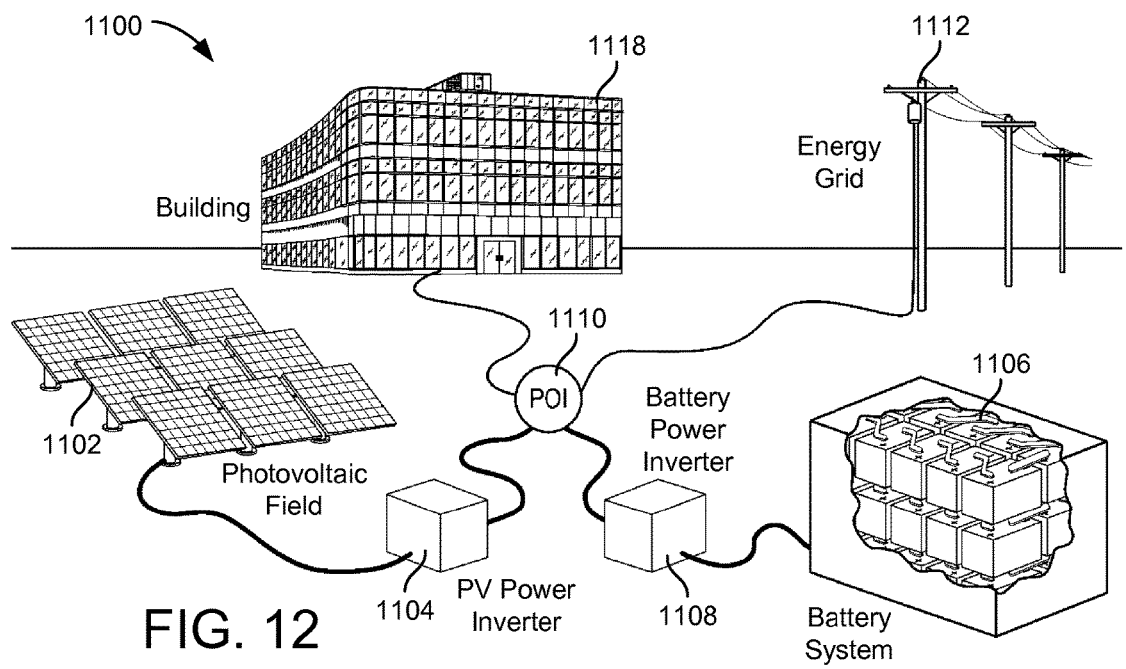
FIG. 12 is a drawing of the electrical energy storage system of FIG. 11, according to an exemplary embodiment.

Electrical Energy Storage System with Frequency Regulation and Ramp Rate Control Referring now to FIGS. 11-12, an electrical energy storage system 1100 is shown, according to an exemplary embodiment. System 1100 can use battery storage to perform both ramp rate control and frequency regulation. Ramp rate control is the process of offsetting ramp rates (i.e., increases or decreases in the power output of an energy system such as a photovoltaic energy system) that fall outside of compliance limits determined by the electric power authority overseeing the energy grid. Ramp rate control typically requires the use of an energy source that allows for offsetting ramp rates by either supplying additional power to the grid or consuming more power from the grid. In some instances, a facility is penalized for failing to comply with ramp rate requirements.

Frequency regulation is the process of maintaining the stability of the grid frequency (e.g., 60 Hz in the United States). The grid frequency may remain balanced as long as there is a balance between the demand from the energy grid and the supply to the energy grid. An increase in demand yields a decrease in grid frequency, whereas an increase in supply yields an increase in grid frequency. During a fluctuation of the grid frequency, system 1100 may offset the fluctuation by either drawing more energy from the energy grid (e.g., if the grid frequency is too high) or by providing energy to the energy grid (e.g., if the grid frequency is too low). Advantageously, system 1100 may use battery storage in combination with photovoltaic power to perform frequency regulation while simultaneously complying with ramp rate requirements and maintaining the state-of-charge of the battery storage within a predetermined desirable range.

System 1100 is shown to include a photovoltaic (PV) field 1102, a PV field power inverter 1104, a battery 1106, a battery power inverter 1108, a point of interconnection (POI) 1110, and an energy grid 1112. In some embodiments, system 1100 also includes a controller 1114 (shown in FIG. 11) and/or a building 1118 (shown in FIG. 12). In brief overview, PV field power inverter 1104 can be operated by controller 1114 to control the power output of PV field 1102. Similarly, battery power inverter 1108 can be operated by controller 1114 to control the power input and/or power output of battery 1106. The power outputs of PV field power inverter 1104 and battery power inverter 1108 combine at POI 1110 to form the power provided to energy grid 1112. In some embodiments, building 1118 is also connected to POI 1110. Building 1118 can consume a portion of the combined power at POI 1110 to satisfy the energy requirements of building 1118.

PV field 1102 may include a collection of photovoltaic cells. The photovoltaic cells are configured to convert solar energy (i.e., sunlight) into electricity using a photovoltaic material such as monocrystalline silicon, polycrystalline silicon, amorphous silicon, cadmium telluride, copper indium gallium selenide/sulfide, or other materials that exhibit the photovoltaic effect. In some embodiments, the photovoltaic cells are contained within packaged assemblies that form solar panels. Each solar panel may include a plurality of linked photovoltaic cells. The solar panels may combine to form a photovoltaic array.

PV field 1102 may have any of a variety of sizes and/or locations. In some embodiments, PV field 1102 is part of a large-scale photovoltaic power station (e.g., a solar park or farm) capable of providing an energy supply to a large number of consumers. When implemented as part of a large-scale system, PV field 1102 may cover multiple hectares and may have power outputs of tens or hundreds of megawatts. In other embodiments, PV field 1102 may cover a smaller area and may have a relatively lesser power output (e.g., between one and ten megawatts, less than one megawatt, etc.). For example, PV field 1102 may be part of a rooftop-mounted system capable of providing enough electricity to power a single home or building. It is contemplated that PV field 1102 may have any size, scale, and/or power output, as may be desirable in different implementations.

PV field 1102 may generate a direct current (DC) output that depends on the intensity and/or directness of the sunlight to which the solar panels are exposed. The directness of the sunlight may depend on the angle of incidence of the sunlight relative to the surfaces of the solar panels. The intensity of the sunlight may be affected by a variety of environmental factors such as the time of day (e.g., sunrises and sunsets) and weather variables such as clouds that cast shadows upon PV field 1102. When PV field 1102 is partially or completely covered by shadow, the power output of PV field 1102 (i.e., PV field power $P_{PV}$) may drop as a result of the decrease in solar intensity.

In some embodiments, PV field 1102 is configured to maximize solar energy collection. For example, PV field 1102 may include a solar tracker (e.g., a GPS tracker, a sunlight sensor, etc.) that adjusts the angle of the solar panels so that the solar panels are aimed directly at the sun throughout the day. The solar tracker may allow the solar panels to receive direct sunlight for a greater portion of the day and may increase the total amount of power produced by PV field 1102. In some embodiments, PV field 1102 includes a collection of mirrors, lenses, or solar concentrators configured to direct and/or concentrate sunlight on the solar panels. The energy generated by PV field 1102 may be stored in battery 1106 or provided to energy grid 1112.

Still referring to FIG. 11, system 1100 is shown to include a PV field power inverter 1104. Power inverter 1104 may be configured to convert the DC output of PV field 1102 $P_{PV}$ into an alternating current (AC) output that can be fed into energy grid 1112 or used by a local (e.g., off-grid) electrical network and/or by building 1118. For example, power inverter 1104 may be a solar inverter or grid-tie inverter configured to convert the DC output from PV field 1102 into a sinusoidal AC output synchronized to the grid frequency of energy grid 1112. In some embodiments, power inverter 1104 receives a cumulative DC output from PV field 1102. For example, power inverter 1104 may be a string inverter or a central inverter. In other embodiments, power inverter 1104 may include a collection of micro-inverters connected to each solar panel or solar cell. PV field power inverter 1104 may convert the DC power output $P_{PV}$ into an AC power output $u_{PV}$ and provide the AC power output $u_{PV}$ to POI 1110.

Power inverter 1104 may receive the DC power output $P_{PV}$ from PV field 1102 and convert the DC power output to an AC power output that can be fed into energy grid 1112. Power inverter 1104 may synchronize the frequency of the AC power output with that of energy grid 1112 (e.g., 50 Hz or 60 Hz) using a local oscillator and may limit the voltage of the AC power output to no higher than the grid voltage. In some embodiments, power inverter 1104 is a resonant inverter that includes or uses LC circuits to remove the harmonics from a simple square wave in order to achieve a sine wave matching the frequency of energy grid 1112. In various embodiments, power inverter 1104 may operate using high-frequency transformers, low-frequency transformers, or without transformers. Low-frequency transformers may convert the DC output from PV field 1102 directly to the AC output provided to energy grid 1112. High-frequency transformers may employ a multi-step process that involves converting the DC output to high-frequency AC, then back to DC, and then finally to the AC output provided to energy grid 1112.

Power inverter 1104 may be configured to perform maximum power point tracking and/or anti-islanding. Maximum power point tracking may allow power inverter 1104 to produce the maximum possible AC power from PV field 1102. For example, power inverter 1104 may sample the DC power output from PV field 1102 and apply a variable resistance to find the optimum maximum power point. Anti-islanding is a protection mechanism that immediately shuts down power inverter 1104 (i.e., preventing power inverter 1104 from generating AC power) when the connection to an electricity-consuming load no longer exists. In some embodiments, PV field power inverter 1104 performs ramp rate control by limiting the power generated by PV field 1102.

PV field power inverter 1104 can include any of a variety of circuit components (e.g., resistors, capacitors, indictors, transformers, transistors, switches, diodes, etc.) configured to perform the functions described herein. In some embodiments DC power from PV field 1102 is connected to a transformer of PV field power inverter 1104 through a center tap of a primary winding. A switch can be rapidly switched back and forth to allow current to flow back to PV field 1102 following two alternate paths through one end of the primary winding and then the other. The alternation of the direction of current in the primary winding of the transformer can produce alternating current (AC) in a secondary circuit.

In some embodiments, PV field power inverter 1104 uses an electromechanical switching device to convert DC power from PV field 1102 into AC power. The electromechanical switching device can include two stationary contacts and a spring supported moving contact. The spring can hold the movable contact against one of the stationary contacts, whereas an electromagnet can pull the movable contact to the opposite stationary contact. Electric current in the electromagnet can be interrupted by the action of the switch so that the switch continually switches rapidly back and forth. In some embodiments, PV field power inverter 1104 uses transistors, thyristors (SCRs), and/or various other types of semiconductor switches to convert DC power from PV field 1102 into AC power. SCRs provide large power handling capability in a semiconductor device and can readily be controlled over a variable firing range.

In some embodiments, PV field power inverter 1104 produces a square voltage waveform (e.g., when not coupled to an output transformer). In other embodiments, PV field power inverter 1104 produces a sinusoidal waveform that matches the sinusoidal frequency and voltage of energy grid 1112. For example, PV field power inverter 1104 can use Fourier analysis to produce periodic waveforms as the sum of an infinite series of sine waves. The sine wave that has the same frequency as the original waveform is called the fundamental component. The other sine waves, called harmonics, that are included in the series have frequencies that are integral multiples of the fundamental frequency.

In some embodiments, PV field power inverter 1104 uses inductors and/or capacitors to filter the output voltage waveform. If PV field power inverter 1104 includes a transformer, filtering can be applied to the primary or the secondary side of the transformer or to both sides. Low-pass filters can be applied to allow the fundamental component of the waveform to pass to the output while limiting the passage of the harmonic components. If PV field power inverter 1104 is designed to provide power at a fixed frequency, a resonant filter can be used. If PV field power inverter 1104 is an adjustable frequency inverter, the filter can be tuned to a frequency that is above the maximum fundamental frequency. In some embodiments, PV field power inverter 1104 includes feedback rectifiers or antiparallel diodes connected across semiconductor switches to provide a path for a peak inductive load current when the switch is turned off. The antiparallel diodes can be similar to freewheeling diodes commonly used in AC/DC converter circuits.

Still referring to FIG. 11, system 1100 is shown to include a battery power inverter 1108. Battery power inverter 1108 may be configured to draw a DC power $P_{bat}$ from battery 1106, convert the DC power $P_{bat}$ into an AC power $u_{bat}$, and provide the AC power $u_{bat}$ to POI 1110. Battery power inverter 1108 may also be configured to draw the AC power $u_{bat}$ from POI 1110, convert the AC power $u_{bat}$ into a DC battery power $P_{bat}$, and store the DC battery power $P_{bat}$ in battery 1106. As such, battery power inverter 1108 can function as both a power inverter and a rectifier to convert between DC and AC in either direction. The DC battery power $P_{bat}$ may be positive if battery 1106 is providing power to battery power inverter 1108 (i.e., if battery 1106 is discharging) or negative if battery 1106 is receiving power from battery power inverter 1108 (i.e., if battery 1106 is charging). Similarly, the AC battery power $u_{bat}$ may be positive if battery power inverter 1108 is providing power to POI 1110 or negative if battery power inverter 1108 is receiving power from POI 1110.

The AC battery power $u_{bat}$ is shown to include an amount of power used for frequency regulation (i.e., $u_{FR}$) and an amount of power used for ramp rate control (i.e., $u_{RR}$) which together form the AC battery power (i.e., $u_{bat}=u_{FR}+u_{RR}$). The DC battery power $P_{bat}$ is shown to include both $u_{FR}$ and $u_{RR}$ as well as an additional term $P_{loss}$ representing power losses in battery 1106 and/or battery power inverter 1108 (i.e., $P_{bat}=u_{FR}+u_{RR}+P_{loss}$). The PV field power $u_{PV}$ and the battery power $u_{bat}$ combine at POI 1110 to form $P_{POI}$ (i.e., $P_{POI}=u_{PV}+u_{bat}$), which represents the amount of power provided to energy grid 1112. $P_{POI}$ may be positive if POI 1110 is providing power to energy grid 1112 or negative if POI 1110 is receiving power from energy grid 1112.

Like PV field power inverter 1104, battery power inverter 1108 can include any of a variety of circuit components (e.g., resistors, capacitors, indictors, transformers, transistors, switches, diodes, etc.) configured to perform the functions described herein. Battery power inverter 1108 can include many of the same components as PV field power inverter 1104 and can operate using similar principles. For example, battery power inverter 1108 can use electromechanical switching devices, transistors, thyristors (SCRs), and/or various other types of semiconductor switches to convert between AC and DC power. Battery power inverter 1108 can operate the circuit components to adjust the amount of power stored in battery 1106 and/or discharged from battery 1106 (i.e., power throughput) based on a power control signal or power setpoint from controller 1114.

Still referring to FIG. 11, system 1100 is shown to include a controller 1114. Controller 1114 may be configured to generate a PV power setpoint $u_{PV}$ for PV field power inverter 1104 and a battery power setpoint $u_{bat}$ for battery power inverter 1108. Throughout this disclosure, the variable $u_{PV}$ is used to refer to both the PV power setpoint generated by controller 1114 and the AC power output of PV field power inverter 1104 since both quantities have the same value. Similarly, the variable $u_{bat}$ is used to refer to both the battery power setpoint generated by controller 1114 and the AC power output/input of battery power inverter 1108 since both quantities have the same value.

PV field power inverter 1104 uses the PV power setpoint $u_{PV}$ to control an amount of the PV field power $P_{PV}$ to provide to POI 1110. The magnitude of $u_{PV}$ may be the same as the magnitude of $P_{PV}$ or less than the magnitude of $P_{PV}$. For example, $u_{PV}$ may be the same as $P_{PV}$ if controller 1114 determines that PV field power inverter 1104 is to provide all of the photovoltaic power $P_{PV}$ to POI 1110. However, $u_{PV}$ may be less than $P_{PV}$ if controller 1114 determines that PV field power inverter 1104 is to provide less than all of the photovoltaic power $P_{PV}$ to POI 1110. For example, controller 1114 may determine that it is desirable for PV field power inverter 1104 to provide less than all of the photovoltaic power $P_{PV}$ to POI 1110 to prevent the ramp rate from being exceeded and/or to prevent the power at POI 1110 from exceeding a power limit.

Battery power inverter 1108 uses the battery power setpoint $u_{bat}$ to control an amount of power charged or discharged by battery 1106. The battery power setpoint $u_{bat}$ may be positive if controller 1114 determines that battery power inverter 1108 is to draw power from battery 1106 or negative if controller 1114 determines that battery power inverter 1108 is to store power in battery 1106. The magnitude of $u_{bat}$ controls the rate at which energy is charged or discharged by battery 1106.

Controller 1114 may generate $u_{PV}$ and $u_{bat}$ based on a variety of different variables including, for example, a power signal from PV field 1102 (e.g., current and previous values for $P_{PV}$), the current state-of-charge (SOC) of battery 1106, a maximum battery power limit, a maximum power limit at POI 1110, the ramp rate limit, the grid frequency of energy grid 1112, and/or other variables that can be used by controller 1114 to perform ramp rate control and/or frequency regulation. Advantageously, controller 1114 generates values for $u_{PV}$ and $u_{bat}$ that maintain the ramp rate of the PV power within the ramp rate compliance limit while participating in the regulation of grid frequency and maintaining the SOC of battery 1106 within a predetermined desirable range. An exemplary controller which can be used as controller 1114 and exemplary processes which may be performed by controller 1114 to generate the PV power setpoint $u_{PV}$ and the battery power setpoint $u_{bat}$ are described in detail in U.S. Provisional Patent Application No. 62/239,245 filed Oct. 8, 2015, the entire disclosure of which is incorporated by reference herein.

Reactive Ramp Rate Control

Controller 1114 may be configured to control a ramp rate of the power output 1116 provided to energy grid 1112.

Ramp rate may be defined as the time rate of change of power output 1116. Power output 1116 may vary depending on the magnitude of the DC output provided by PV field 1102. For example, if a cloud passes over PV field 1102, power output 1116 may rapidly and temporarily drop while PV field 1102 is within the cloud's shadow. Controller 1114 may be configured to calculate the ramp rate by sampling power output 1116 and determining a change in power output 1116 over time. For example, controller 1114 may calculate the ramp rate as the derivative or slope of power output 1116 as a function of time, as shown in the following equations:

$$\text{Ramp Rate} = \frac{dP}{dt} \text{ or Ramp Rate} = \frac{\Delta P}{\Delta t}$$

where P represents power output 1116 and t represents time.

In some embodiments, controller 1114 controls the ramp rate to comply with regulatory requirements or contractual requirements imposed by energy grid 1112. For example, system 1100 may be required to maintain the ramp rate within a predetermined range in order to deliver power to energy grid 1112. In some embodiments, system 1100 is required to maintain the absolute value of the ramp rate at less than a threshold value (e.g., less than 10% of the rated power capacity per minute). In other words, system 1100 may be required to prevent power output 1116 from increasing or decreasing too rapidly. If this requirement is not met, system 1100 may be deemed to be in non-compliance and its capacity may be de-rated, which directly impacts the revenue generation potential of system 1100.

Controller 1114 may use battery 1106 to perform ramp rate control. For example, controller 1114 may use energy from battery 1106 to smooth a sudden drop in power output 1116 so that the absolute value of the ramp rate is less than a threshold value. As previously mentioned, a sudden drop in power output 1116 may occur when a solar intensity disturbance occurs, such as a passing cloud blocking the sunlight to PV field 1102. Controller 1114 may use the energy from battery 1106 to make up the difference between the power provided by PV field 1102 (which has suddenly dropped) and the minimum required power output 1116 to maintain the required ramp rate. The energy from battery 1106 allows controller 1114 to gradually decrease power output 1116 so that the absolute value of the ramp rate does not exceed the threshold value.

Once the cloud has passed, the power output from PV field 1102 may suddenly increase as the solar intensity returns to its previous value. Controller 1114 may perform ramp rate control by gradually ramping up power output 1116. Ramping up power output 1116 may not require energy from battery 1106. For example, power inverter 1104 may use only a portion of the energy generated by PV field 1102 (which has suddenly increased) to generate power output 1116 (i.e., limiting the power output) so that the ramp rate of power output 1116 does not exceed the threshold value. The remainder of the energy generated by PV field 1102 (i.e., the excess energy) may be stored in battery 1106 and/or dissipated. Limiting the energy generated by PV field 1102 may include diverting or dissipating a portion of the energy generated by PV field 1102 (e.g., using variable resistors or other circuit elements) so that only a portion of the energy generated by PV field 1102 is provided to energy grid 1112. This allows power inverter 1104 to ramp up power output 1116 gradually without exceeding the ramp rate. The excess energy may be stored in battery 1106, used to power other components of system 1100, or dissipated.

Figure 13:
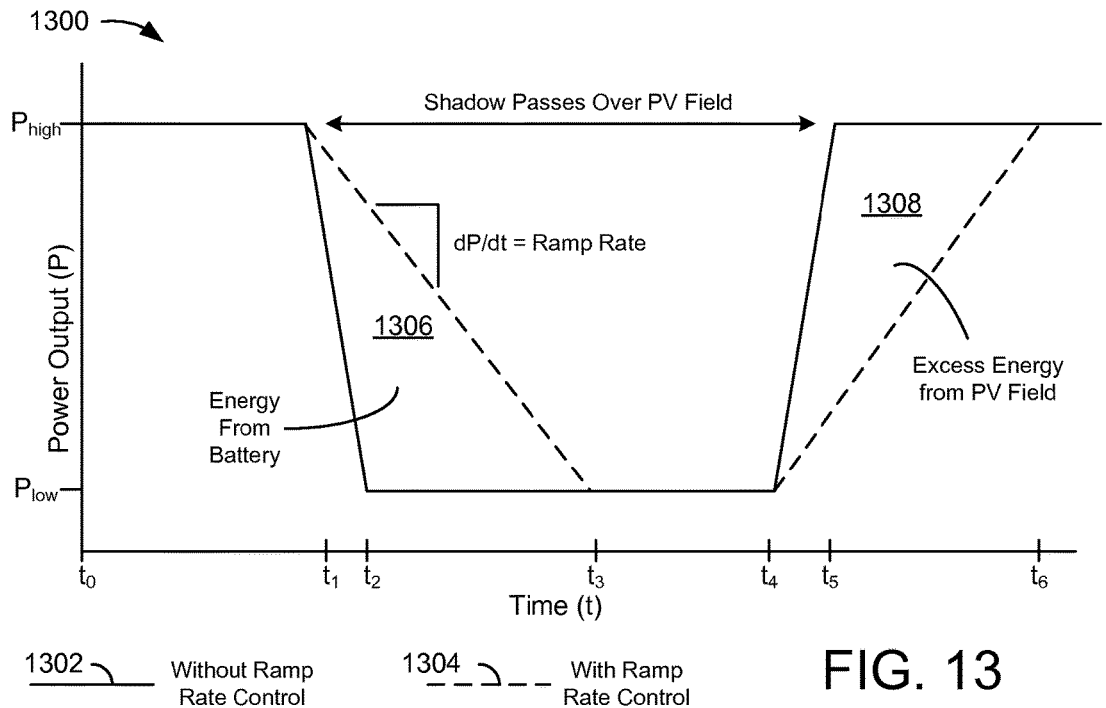
FIG. 13 is a graph illustrating a reactive ramp rate control technique which can be used by the electrical energy storage system of FIG. 11, according to an exemplary embodiment.

Referring now to FIG. 13, a graph 1300 illustrating a reactive ramp rate control technique which can be used by system 1100 is shown, according to an exemplary embodiment. Graph 1300 plots the power output P provided to energy grid 1112 as a function of time t. The solid line 1302 illustrates power output P without any ramp rate control, whereas the broken line 1304 illustrates power output P with ramp rate control.

Between times $t_0$ and $t_1$, power output P is at a high value $P_{high}$. At time $t_1$, a cloud begins to cast its shadow on PV field 1102, causing the power output of PV field 1102 to suddenly decrease, until PV field 1102 is completely in shadow at time $t_2$. Without any ramp rate control, the sudden drop in power output from PV field 1102 causes the power output P to rapidly drop to a low value $P_{low}$ at time $t_2$. However, with ramp rate control, system 1100 uses energy from battery 1106 to gradually decrease power output P to $P_{low}$ at time $t_3$. Triangular region 1306 represents the energy from battery 1106 used to gradually decrease power output P.

Between times $t_2$ and $t_4$, PV field 1102 is completely in shadow. At time $t_4$, the shadow cast by the cloud begins to move off PV field 1102, causing the power output of PV field 1102 to suddenly increase, until PV field 1102 is entirely in sunlight at time $t_5$. Without any ramp rate control, the sudden increase in power output from PV field 1102 causes the power output P to rapidly increase to the high value $P_{high}$ at time $t_5$. However, with ramp rate control, power inverter 1104 limits the energy from PV field 1102 to gradually increase power output P to $P_{high}$ at time $t_6$. Triangular region 1308 represents the energy generated by PV field 1102 in excess of the ramp rate limit. The excess energy may be stored in battery 1106 and/or dissipated in order to gradually increase power output P at a rate no greater than the maximum allowable ramp rate.

Notably, both triangular regions 1306 and 1308 begin after a change in the power output of PV field 1102 occurs. As such, both the decreasing ramp rate control and the increasing ramp rate control provided by system 1100 are reactionary processes triggered by a detected change in the power output. In some embodiments, a feedback control technique is used to perform ramp rate control in system 1100. For example, controller 1114 may monitor power output 1116 and determine the absolute value of the time rate of change of power output 1116 (e.g., dP/dt or $\Delta P/\Delta t$). Controller 1114 may initiate ramp rate control when the absolute value of the time rate of change of power output 1116 exceeds a threshold value.

Preemptive Ramp Rate Control

In some embodiments, controller 1114 is configured to predict when solar intensity disturbances will occur and may cause power inverter 1104 to ramp down the power output 1116 provided to energy grid 1112 preemptively. Instead of reacting to solar intensity disturbances after they occur, controller 1114 can actively predict solar intensity disturbances and preemptively ramp down power output 1116 before the disturbances affect PV field 1102. Advantageously, this allows system controller 1114 to perform both ramp down control and ramp up control by using only a portion of the energy provided by PV field 1102 to generate power output 1116 while the power output of PV field 1102 is still high, rather than relying on energy from a battery. The remainder of the energy generated by PV field 1102 (i.e., the excess energy) may be stored in battery 1106 and/or dissipated.

In some embodiments, controller 1114 predicts solar intensity disturbances using input from one or more cloud detectors. The cloud detectors may include an array of solar intensity sensors. The solar intensity sensors may be positioned outside PV field 1102 or within PV field 1102. Each solar intensity sensor may have a known location. In some embodiments, the locations of the solar intensity sensors are based on the geometry and orientation of PV field 1102. For example, if PV field 1102 is rectangular, more sensors may be placed along its long side than along its short side. A cloud formation moving perpendicular to the long side may cover more area of PV field 1102 per unit time than a cloud formation moving perpendicular to the short side. Therefore, it may be desirable to include more sensors along the long side to more precisely detect cloud movement perpendicular to the long side. As another example, more sensors may be placed along the west side of PV field 1102 than along the east side of PV field 1102 since cloud movement from west to east is more common than cloud movement from east to west. The placement of sensors may be selected to detect approaching cloud formations without requiring unnecessary or redundant sensors.

The solar intensity sensors may be configured to measure solar intensity at various locations outside PV field 1102. When the solar intensity measured by a particular solar intensity sensor drops below a threshold value, controller 1114 may determine that a cloud is currently casting a shadow on the solar intensity sensor. Controller 1114 may use input from multiple solar intensity sensors to determine various attributes of clouds approaching PV field 1102 and/or the shadows produced by such clouds. For example, if a shadow is cast upon two or more of the solar intensity sensors sequentially, controller 1114 may use the known positions of the solar intensity sensors and the time interval between each solar intensity sensor detecting the shadow to determine how fast the cloud/shadow is moving. If two or more of the solar intensity sensors are within the shadow simultaneously, controller 1114 may use the known positions of the solar intensity sensors to determine a position, size, and/or shape of the cloud/shadow.

Although the cloud detectors are described primarily as solar intensity sensors, it is contemplated that the cloud detectors may include any type of device configured to detect the presence of clouds or shadows cast by clouds. For example, the cloud detectors may include one or more cameras that capture visual images of cloud movement. The cameras may be upward-oriented cameras located below the clouds (e.g., attached to a structure on the Earth) or downward-oriented cameras located above the clouds (e.g., satellite cameras). Images from the cameras may be used to determine cloud size, position, velocity, and/or other cloud attributes. In some embodiments, the cloud detectors include radar or other meteorological devices configured to detect the presence of clouds, cloud density, cloud velocity, and/or other cloud attributes. In some embodiments, controller 1114 receives data from a weather service that indicates various cloud attributes.

Advantageously, controller 1114 may use the attributes of the clouds/shadows to determine when a solar intensity disturbance (e.g., a shadow) is approaching PV field 1102. For example, controller 1114 may use the attributes of the clouds/shadows to determine whether any of the clouds are expected to cast a shadow upon PV field 1102. If a cloud is expected to cast a shadow upon PV field 1102, controller 1114 may use the size, position, and/or velocity of the cloud/shadow to determine a portion of PV field 1102 that will be affected. The affected portion of PV field 1102 may include some or all of PV field 1102. Controller 1114 may use the attributes of the clouds/shadows to quantify a magnitude of the expected solar intensity disturbance (e.g., an expected decrease in power output from PV field 1102) and to determine a time at which the disturbance is expected to occur (e.g., a start time, an end time, a duration, etc.).

In some embodiments, controller 1114 predicts a magnitude of the disturbance for each of a plurality of time steps. Controller 1114 may use the predicted magnitudes of the disturbance at each of the time steps to generate a predicted disturbance profile. The predicted disturbance profile may indicate how fast power output 1116 is expected to change as a result of the disturbance. Controller 1114 may compare the expected rate of change to a ramp rate threshold to determine whether ramp rate control is required. For example, if power output 1116 is predicted to decrease at a rate in excess of the maximum compliant ramp rate, controller 1114 may preemptively implement ramp rate control to gradually decrease power output 1116.

In some embodiments, controller 1114 identifies the minimum expected value of power output 1116 and determines when the predicted power output is expected to reach the minimum value. Controller 1114 may subtract the minimum expected power output 1116 from the current power output 1116 to determine an amount by which power output 1116 is expected to decrease. Controller 1114 may apply the maximum allowable ramp rate to the amount by which power output 1116 is expected to decrease to determine a minimum time required to ramp down power output 1116 in order to comply with the maximum allowable ramp rate. For example, controller 1114 may divide the amount by which power output 1116 is expected to decrease (e.g., measured in units of power) by the maximum allowable ramp rate (e.g., measured in units of power per unit time) to identify the minimum time required to ramp down power output 1116. Controller 1114 may subtract the minimum required time from the time at which the predicted power output is expected to reach the minimum value to determine when to start preemptively ramping down power output 1116.

Advantageously, controller 1114 may preemptively act upon predicted disturbances by causing power inverter 1104 to ramp down power output 1116 before the disturbances affect PV field 1102. This allows power inverter 1104 to ramp down power output 1116 by using only a portion of the energy generated by PV field 1102 to generate power output 1116 (i.e., performing the ramp down while the power output is still high), rather than requiring additional energy from a battery (i.e., performing the ramp down after the power output has decreased). The remainder of the energy generated by PV field 1102 (i.e., the excess energy) may be stored in battery 1106 and/or dissipated.

Figure 14:
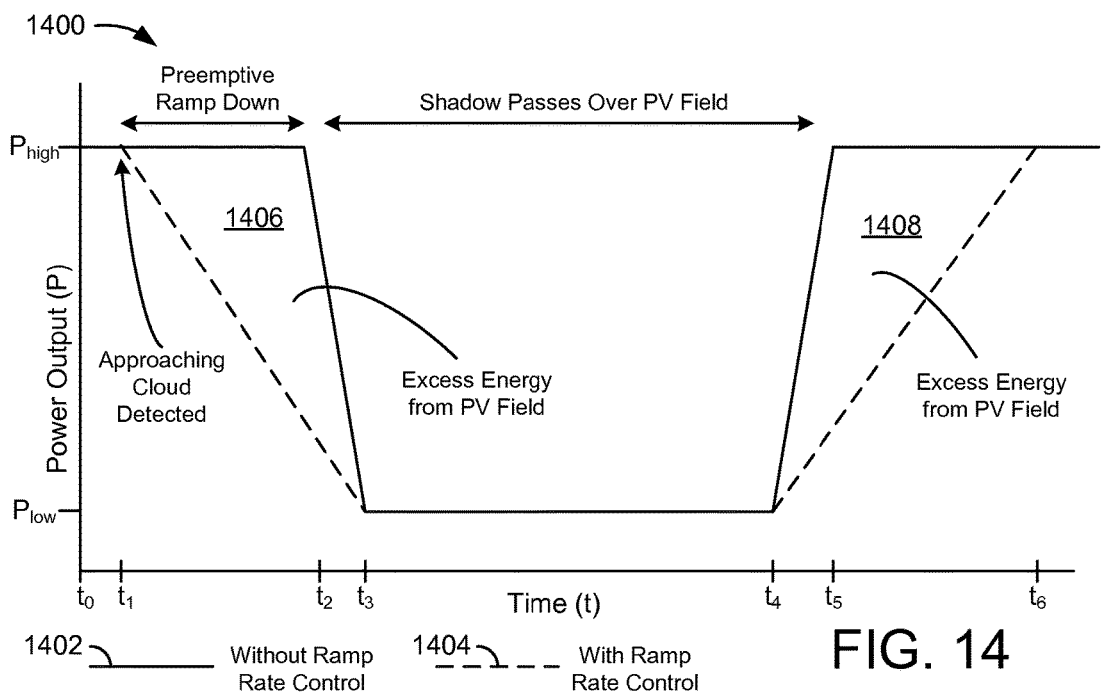
FIG. 14 is a graph illustrating a preemptive ramp rate control technique which can be used by the electrical energy storage system of FIG. 11, according to an exemplary embodiment.

Referring now to FIG. 14, a graph 1400 illustrating a preemptive ramp rate control technique which can be used by controller 1114 is shown, according to an exemplary embodiment. Graph 1400 plots the power output P provided to energy grid 1112 as a function of time t. The solid line 1402 illustrates power output P without any ramp rate control, whereas the broken line 1404 illustrates power output P with preemptive ramp rate control.

Between times $t_0$ and $t_2$, power output P is at a high value $P_{high}$. At time $t_2$, a cloud begins to cast its shadow on PV field 1102, causing the power output of PV field 1102 to suddenly decrease, until PV field 1102 is completely in shadow at time $t_3$. Without any ramp rate control, the sudden drop in power output from PV field 1102 causes the power output P to rapidly drop from $P_{high}$ to a low value $P_{low}$ between times $t_2$ and $t_3$. However, with preemptive ramp rate control, controller 1114 preemptively causes power inverter 1104 to begin ramping down power output P at time $t_1$, prior to the cloud casting a shadow on PV field 1102. The preemptive ramp down occurs between times $t_1$ and $t_3$, resulting in a ramp rate that is relatively more gradual. Triangular region 1406 represents the energy generated by PV field 1102 in excess of the ramp rate limit. The excess energy may be limited by power inverter 1104 and/or stored in battery 1106 to gradually decrease power output P at a rate no greater than the ramp rate limit.

Between times $t_3$ and $t_4$, PV field 1102 is completely in shadow. At time $t_4$, the shadow cast by the cloud begins to move off PV field 1102, causing the power output of PV field 1102 to suddenly increase, until PV field 1102 is entirely in sunlight at time $t_5$. Without any ramp rate control, the sudden increase in power output from PV field 1102 causes the power output P to rapidly increase to the high value $P_{high}$ at time $t_5$. However, with ramp rate control, power inverter 1104 uses only a portion of the energy from PV field 1102 to gradually increase power output P to $P_{high}$ at time $t_6$. Triangular region 1408 represents the energy generated by PV field 1102 in excess of the ramp rate limit. The excess energy may be limited by power inverter 1104 and/or stored in battery 1106 to gradually increase power output P at a rate no greater than the ramp rate limit.

Notably, a significant portion of triangular region 1406 occurs between times $t_1$ and $t_2$, before the disturbance affects PV field 1102. As such, the decreasing ramp rate control provided by system 1100 is a preemptive process triggered by detecting an approaching cloud, prior to the cloud casting a shadow upon PV field 1102. In some embodiments, controller 1114 uses a predictive control technique (e.g., feedforward control, model predictive control, etc.) to perform ramp down control in system 1100. For example, controller 1114 may actively monitor the positions, sizes, velocities, and/or other attributes of clouds/shadows that could potentially cause a solar intensity disturbance affecting PV field 1102. When an approaching cloud is detected at time $t_1$, controller 1114 may preemptively cause power inverter 1104 to begin ramping down power output 1116. This allows power inverter 1104 to ramp down power output 1116 by limiting the energy generated by PV field 1102 while the power output is still high, rather than requiring additional energy from a battery to perform the ramp down once the power output has dropped.

Frequency Regulation and Ramp Rate Controller

Figure 15:
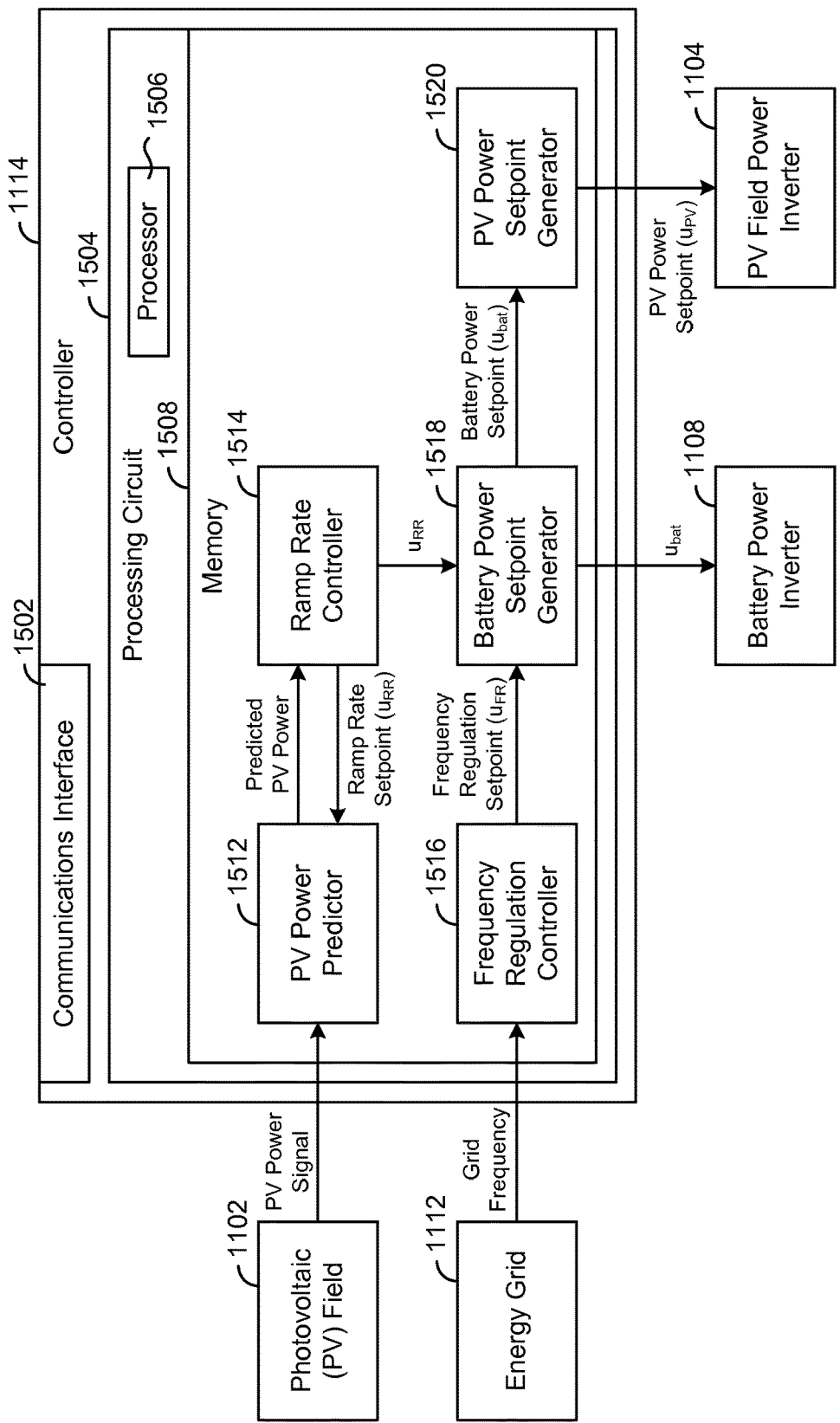
FIG. 15 is a block diagram of a frequency regulation and ramp rate controller which can be used to monitor and control the electrical energy storage system of FIG. 11, according to an exemplary embodiment.

Referring now to FIG. 15, a block diagram illustrating controller 1114 in greater detail is shown, according to an exemplary embodiment. Controller 1114 is shown to include a communications interface 1502 and a processing circuit 1504. Communications interface 1502 may include wired or wireless interfaces (e.g., jacks, antennas, transmitters, receivers, transceivers, wire terminals, etc.) for conducting data communications with various systems, devices, or networks. For example, communications interface 1102 may include an Ethernet card and port for sending and receiving data via an Ethernet-based communications network and/or a WiFi transceiver for communicating via a wireless communications network. Communications interface 1502 may be configured to communicate via local area networks or wide area networks (e.g., the Internet, a building WAN, etc.) and may use a variety of communications protocols (e.g., BACnet, IP, LON, etc.).

Communications interface 1502 may be a network interface configured to facilitate electronic data communications between controller 1114 and various external systems or devices (e.g., PV field 1102, energy grid 1112, PV field power inverter 1104, battery power inverter 1108, etc.). For example, controller 1114 may receive a PV power signal from PV field 1102 indicating the current value of the PV power $P_{PV}$ generated by PV field 1102. Controller 1114 may use the PV power signal to predict one or more future values for the PV power $P_{PV}$ and generate a ramp rate setpoint $u_{RR}$. Controller 1114 may receive a grid frequency signal from energy grid 1112 indicating the current value of the grid frequency. Controller 1114 may use the grid frequency to generate a frequency regulation setpoint $u_{FR}$. Controller 1114 may use the ramp rate setpoint $u_{RR}$ and the frequency regulation setpoint $u_{FR}$ to generate a battery power setpoint $u_{bat}$ and may provide the battery power setpoint $u_{bat}$ to battery power inverter 1108. Controller 1114 may use the battery power setpoint $u_{bat}$ to generate a PV power setpoint $u_{PV}$ and may provide the PV power setpoint $u_{PV}$ to PV field power inverter 1104.

Still referring to FIG. 15, processing circuit 1504 is shown to include a processor 1506 and memory 1508. Processor 1506 may be a general purpose or specific purpose processor, an application specific integrated circuit (ASIC), one or more field programmable gate arrays (FPGAs), a group of processing components, or other suitable processing components. Processor 1506 may be configured to execute computer code or instructions stored in memory 1508 or received from other computer readable media (e.g., CDROM, network storage, a remote server, etc.).

Memory 1508 may include one or more devices (e.g., memory units, memory devices, storage devices, etc.) for storing data and/or computer code for completing and/or facilitating the various processes described in the present disclosure. Memory 1508 may include random access memory (RAM), read-only memory (ROM), hard drive storage, temporary storage, non-volatile memory, flash memory, optical memory, or any other suitable memory for storing software objects and/or computer instructions. Memory 1508 may include database components, object code components, script components, or any other type of information structure for supporting the various activities and information structures described in the present disclosure. Memory 1508 may be communicably connected to processor 1506 via processing circuit 1504 and may include computer code for executing (e.g., by processor 1506) one or more processes described herein.

Predicting PV Power Output

Still referring to FIG. 15, controller 1114 is shown to include a PV power predictor 1512. PV power predictor 1512 may receive the PV power signal from PV field 1102 and use the PV power signal to make a short term prediction of the photovoltaic power output $P_{PV}$. In some embodiments, PV power predictor 1512 predicts the value of $P_{PV}$ for the next time step (i.e., a one step ahead prediction). For example, at each time step k, PV power predictor 1512 may predict the value of the PV power output $P_{PV}$ for the next time step k+1 (i.e., $\hat{P}_{PV}(k+1)$). Advantageously, predicting the next value for the PV power output $P_{PV}$ allows controller 1114 to predict the ramp rate and perform an appropriate control action to prevent the ramp rate from exceeding the ramp rate compliance limit.

In some embodiments, PV power predictor 1512 performs a time series analysis to predict $\hat{P}(k+1)$. A time series may be defined by an ordered sequence of values of a variable at equally spaced intervals. PV power predictor 1512 may model changes between values of $P_{PV}$ over time using an autoregressive moving average (ARMA) model or an autoregressive integrated moving average (ARIMA) model. PV power predictor 1512 may use the model to predict the next value of the PV power output $P_{PV}$ and correct the prediction using a Kalman filter each time a new measurement is acquired. The time series analysis technique is described in greater detail in the following paragraphs.

In some embodiments, PV power predictor 1512 uses a technique in the Box-Jenkins family of techniques to perform the time series analysis. These techniques are statistical tools that use past data (e.g., lags) to predict or correct new data, and other techniques to find the parameters or coefficients of the time series. A general representation of a time series from the Box-Jenkins approach is:

$$X_k - \sum_{r=1}^{p} \varphi_r X_{k-r} = \sum_{s=0}^{q} \theta_s \epsilon_{k-s}$$

which is known as an ARMA process. In this representation, the parameters p and q define the order and number of lags of the time series, $\varphi$ is an autoregressive parameter, and $\theta$ is a moving average parameter. This representation is desirable for a stationary process which has a mean, variance, and autocorrelation structure that does not change over time. However, if the original process $\{Y_k\}$ representing the time series values of $P_{PV}$ is not stationary, $X_k$ can represent the first difference (or higher order difference) of the process $\{Y_k - Y_{k-1}\}$. If the difference is stationary, PV power predictor 1512 may model the process as an ARIMA process.

PV power predictor 1512 may be configured to determine whether to use an ARMA model or an ARIMA model to model the time series of the PV power output $P_{PV}$. Determining whether to use an ARMA model or an ARIMA model may include identifying whether the process is stationary. In some embodiments, the power output $P_{PV}$ is not stationary. However, the first difference $Y_k - Y_{k-1}$ may be stationary. Accordingly, PV power predictor 1512 may select an ARIMA model to represent the time series of $P_{PV}$.

PV power predictor 1512 may find values for the parameters p and q that define the order and the number of lags of the time series. In some embodiments, PV power predictor 1512 finds values for p and q by checking the partial autocorrelation function (PACF) and selecting a number where the PACF approaches zero (e.g., p=q). For some time series data, PV power predictor 1512 may determine that a $4^{th}$ or $5^{th}$ order model is appropriate. However, it is contemplated that PV power predictor 1512 may select a different model order to represent different time series processes.

PV power predictor 1512 may find values for the autoregressive parameter $\varphi_{1 \ldots p}$ and the moving average parameter $\theta_{1 \ldots q}$. In some embodiments, PV power predictor 1512 uses an optimization algorithm to find values for $\varphi_{1 \ldots p}$ and $\theta_{1 \ldots q}$ given the time series data $\{Y_k\}$. For example, PV power predictor 1512 may generate a discrete-time ARIMA model of the form:

$$A(z)y(k) = \left[\frac{C(z)}{1-z^{-1}}\right]e(t)$$

where A(z) and C(z) are defined as follows:

$$A(z) = 1 + \varphi_1 z^{-1} + \varphi_2 z^{-2} + \varphi_3 z^{-3} + \varphi_4 z^{-4}$$

$$C(z) = 1 + \theta_1 z^{+1} + \theta_2 z^{-2} + \theta_3 z^{-3} + \theta_4 z^{-4}$$

where the values for $\varphi_{1 \ldots p}$ and $\theta_{1 \ldots q}$ are determined by fitting the model to the time series values of $P_{PV}$.

In some embodiments, PV power predictor 1512 uses the ARIMA model as an element of a Kalman filter. The Kalman filter may be used by PV power predictor 1512 to correct the estimated state and provide tighter predictions based on actual values of the PV power output $P_{PV}$. In order to use the ARIMA model with the Kalman filter, PV power predictor 1512 may generate a discrete-time state-space representation of the ARIMA model of the form:

$$x(k+1) = Ax(k) + Ke(k)$$

$$y(k) = Cx(k) + e(k)$$

where y(k) represents the values of the PV power output $P_{PV}$ and e(k) is a disturbance considered to be normal with zero mean and a variance derived from the fitted model. It is contemplated that the state-space model can be represented in a variety of different forms. For example, the ARIMA model can be rewritten as a difference equation and used to generate a different state-space model using state-space modeling techniques. In various embodiments, PV power predictor 1512 may use any of a variety of different forms of the state-space model.

The discrete Kalman filter consists of an iterative process that takes a state-space model and forwards it in time until there are available data to correct the predicted state and obtain a better estimate. The correction may be based on the evolution of the mean and covariance of an assumed white noise system. For example, PV power predictor 1512 may use a state-space model of the following form:

$$x(k+1) = Ax(k) + Bu(k) + w(k) + w(k) \sim N(0,Q)$$

$$y(k) = Cx(k) + Du(k) + v(k) + v(k) \sim N(0,R)$$

where N( ) represents a normal distribution, v(k) is the measurement error having zero mean and variance R, and w(k) is the process error having zero mean and variance Q. The values of R and Q are design choices. The variable x(k) is a state of the process and the variable y(k) represents the PV power output $P_{PV}(k)$. This representation is referred to as a stochastic state-space representation.

PV power predictor 1512 may use the Kalman filter to perform an iterative process to predict $\hat{P}_{PV}(k+1)$ based on the current and previous values of $P_{PV}$ (e.g., $P_{PV}(k)$, $P_{PV}(k-1)$, etc.). The iterative process may include a prediction step and an update step. The prediction step moves the state estimate forward in time using the following equations:

$$\hat{x}^-(k+1) = A * \hat{x}(k)$$

$$P^-(k+1) = A * P(k) * A^T + Q$$

where $\hat{x}(k)$ is the mean of the process or estimated state at time step k and P(k) is the covariance of the process at time step k. The super index "−" indicates that the estimated state $\hat{x}^-(k+1)$ is based on the information known prior to time step k+1 (i.e., information up to time step k). In other words, the measurements at time step k+1 have not yet been incorporated to generate the state estimate $\hat{x}^-(k+1)$. This is known as an a priori state estimate.

PV power predictor 1512 may predict the PV power output $\hat{P}_{PV}(k+1)$ by determining the value of the predicted measurement $\hat{y}^-(k+1)$. As previously described, the measurement y(k) and the state x(k) are related by the following equation:

$$y(k) = Cx(k) + e(k)$$

which allows PV power predictor 1512 to predict the measurement $\hat{y}^-(k+1)$ as a function of the predicted state $\hat{x}^-(k+1)$. PV power predictor 1512 may use the measurement estimate $\hat{y}^-(k+1)$ as the value for the predicted PV power output $\hat{P}_{PV}^-(k+1)$ (i.e., $\hat{P}_{PV}^-(k+1)=\hat{y}^-(k+1)$).

The update step uses the following equations to correct the a priori state estimate $\hat{x}^-(k+1)$ based on the actual (measured) value of $y(k+1)$:

$$K=P^-(k+1)*C^{T}*[R+C*P^-(k+1)*C^T]^{-1}$$

$$\hat{x}(k+1)=\hat{x}^-(k+1)+K*[y(k+1)C*\hat{x}^-(k+1)]$$

$$P(k+1)=P^-(k+1)-K*[R+C*P^-(k+1)*C^T]*K^T$$

where $y(k+1)$ corresponds to the actual measured value of $P_{PV}(k+1)$. The variable $\hat{x}(k+1)$ represents the a posteriori estimate of the state $x$ at time $k+1$ given the information known up to time step $k+1$. The update step allows PV power predictor 1512 to prepare the Kalman filter for the next iteration of the prediction step.

Although PV power predictor 1512 is primarily described as using a time series analysis to predict $\hat{P}_{PV}(k+1)$, it is contemplated that PV power predictor 1512 may use any of a variety of techniques to predict the next value of the PV power output $P_{PV}$. For example, PV power predictor 1512 may use a deterministic plus stochastic model trained from historical PV power output values (e.g., linear regression for the deterministic portion and an AR model for the stochastic portion). This technique is described in greater detail in U.S. patent application Ser. No. 14/717,593, titled "Building Management System for Forecasting Time Series Values of Building Variables" and filed May 20, 2015, the entirety of which is incorporated by reference herein.

In other embodiments, PV power predictor 1512 uses input from cloud detectors (e.g., cameras, light intensity sensors, radar, etc.) to predict when an approaching cloud will cast a shadow upon PV field 1102. When an approaching cloud is detected, PV power predictor 1512 may estimate an amount by which the solar intensity will decrease as a result of the shadow and/or increase once the shadow has passed PV field 1102. PV power predictor 1512 may use the predicted change in solar intensity to predict a corresponding change in the PV power output $P_{PV}$. This technique is described in greater detail in U.S. Provisional Patent Application No. 62/239,131 titled "Systems and Methods for Controlling Ramp Rate in a Photovoltaic Energy System" and filed Oct. 8, 2015, the entirety of which is incorporated by reference herein. PV power predictor 1512 may provide the predicted PV power output $\hat{P}_{PV}(k+1)$ to ramp rate controller 1514.

Controlling Ramp Rate

Still referring to FIG. 15, controller 1114 is shown to include a ramp rate controller 1514. Ramp rate controller 1514 may be configured to determine an amount of power to charge or discharge from battery 1106 for ramp rate control (i.e., $u_{RR}$). Advantageously, ramp rate controller 1514 may determine a value for the ramp rate power $u_{RR}$ that simultaneously maintains the ramp rate of the PV power (i.e., $u_{RR}+P_{PV}$) within compliance limits while allowing controller 1114 to regulate the frequency of energy grid 1112 and while maintaining the state-of-charge of battery 1106 within a predetermined desirable range.

In some embodiments, the ramp rate of the PV power is within compliance limits as long as the actual ramp rate evaluated over a one minute interval does not exceed ten percent of the rated capacity of PV field 1102. The actual ramp rate may be evaluated over shorter intervals (e.g., two seconds) and scaled up to a one minute interval. Therefore, a ramp rate may be within compliance limits if the ramp rate satisfies one or more of the following inequalities:

$$|rr| < \frac{0.1 P_{cap}}{30}(1 + \text{tolerance})$$

$$|RR| < 0.1 P_{cap}(1 + \text{tolerance})$$

where $rr$ is the ramp rate calculated over a two second interval, $RR$ is the ramp rate calculated over a one minute interval, $P_{cap}$ is the rated capacity of PV field 1102, and tolerance is an amount by which the actual ramp rate can exceed the compliance limit without resulting in a non-compliance violation (e.g., tolerance=10%). In this formulation, the ramp rates $rr$ and $RR$ represent a difference in the PV power (e.g., measured in kW) at the beginning and end of the ramp rate evaluation interval.

Simultaneous implementation of ramp rate control and frequency regulation can be challenging (e.g., can result in non-compliance), especially if the ramp rate is calculated as the difference in the power $P_{POI}$ at POI 1110. In some embodiments, the ramp rate over a two second interval is defined as follows:

$$rr=[P_{POI}(k)-P_{POI}(k-1)]-[u_{FR}(k)-u_{FR}(k-1)]$$

where $P_{POI}(k-1)$ and $P_{POI}(k)$ are the total powers at POI 1110 measured at the beginning and end, respectively, of a two second interval, and $u_{FR}(k-1)$ and $u_{FR}(k)$ are the powers used for frequency regulation measured at the beginning and end, respectively, of the two second interval.

The total power at POI 1110 (i.e., $P_{POI}$) is the sum of the power output of PV field power inverter 1104 (i.e., $u_{PV}$) and the power output of battery power inverter 1108 (i.e., $u_{bat}=u_{FR} u_{RR}$). Assuming that PV field power inverter 1104 is not limiting the power $P_{PV}$ generated by PV field 1102, the output of PV field power inverter 1104 $u_{PV}$ may be equal to the PV power output $P_{PV}$ (i.e., $P_{PV}=u_{PV}$) and the total power $P_{POI}$ at POI 1110 can be calculated using the following equation:

$$P_{POI}=P_{PV}+u_{FR}+u_{RR}$$

Therefore, the ramp rate $rr$ can be rewritten as:

$$rr=P_{PV}(k)-P_{PV}(k-1)+u_{RR}(k)-u_{RR}(k-1)$$

and the inequality which must be satisfied to comply with the ramp rate limit can be rewritten as:

$$|P_{PV}(k)-P_{PV}(k-1)+u_{RR}(k)-u_{RR}(k-1)| < \frac{0.1 P_{cap}}{30}(1 + \text{tolerance})$$

where $P_{PV}(k-1)$ and $P_{PV}(k)$ are the power outputs of PV field 1102 measured at the beginning and end, respectively, of the two second interval, and $u_{RR}(k-1)$ and $u_{RR}(k)$ are the powers used for ramp rate control measured at the beginning and end, respectively, of the two second interval.

In some embodiments, ramp rate controller 1514 determines the ramp rate compliance of a facility based on the number of scans (i.e., monitored intervals) in violation that occur within a predetermined time period (e.g., one week) and the total number of scans that occur during the predetermined time period. For example, the ramp rate compliance RRC may be defined as a percentage and calculated as follows:

$$RRC = 100\left(1 - \frac{n_{vscan}}{n_{tscan}}\right)$$

where $n_{vscan}$ is the number of scans over the predetermined time period where rr is in violation and $n_{tscan}$ is the total number of scans during which the facility is performing ramp rate control during the predetermined time period.

In some embodiments, the intervals that are monitored or scanned to determine ramp rate compliance are selected arbitrarily or randomly (e.g., by a power utility). Therefore, it may be impossible to predict which intervals will be monitored. Additionally, the start times and end times of the intervals may be unknown. In order to guarantee ramp rate compliance and minimize the number of scans where the ramp rate is in violation, ramp rate controller 1514 may determine the amount of power $u_{RR}$ used for ramp rate control ahead of time. In other words, ramp rate controller 1514 may determine, at each instant, the amount of power $u_{RR}$ to be used for ramp rate control at the next instant. Since the start and end times of the intervals may be unknown, ramp rate controller 1514 may perform ramp rate control at smaller time intervals (e.g., on the order of milliseconds).

Ramp rate controller 1514 may use the predicted PV power $\hat{P}_{PV}(k+1)$ at instant k+1 and the current PV power $P_{PV}(k)$ at instant k to determine the ramp rate control power $\hat{u}_{RR_T}(k)$ at instant k. Advantageously, this allows ramp rate controller 1514 to determine whether the PV power $P_{PV}$ is in an up-ramp, a down-ramp, or no-ramp at instant k. Assuming a T seconds time resolution, ramp rate controller 1514 may determine the value of the power for ramp rate control $\hat{u}_{RR_T}(k)$ at instant k based on the predicted value of the PV power $\hat{P}_{PV}(k+1)$, the current value of the PV power $P_{PV}(k)$, and the previous power used for ramp rate control $\hat{u}_{RR_T}(k-1)$. Scaling to T seconds and assuming a tolerance of zero, ramp rate compliance is guaranteed if $\hat{u}_{RR_T}(k)$ satisfies the following inequality:

$$lb_{RR_T} \leq \hat{u}_{RR_T} \leq ub_{RR_T}$$

where T is the sampling time in seconds, $lb_{RR_T}$ is the lower bound on $\hat{u}_{RR_T}(k)$, and $ub_{RR_T}$ is the upper bound on $\hat{u}_{RR_T}(k)$.

In some embodiments, the lower bound $lb_{RR_T}$ and the upper bound $ub_{RR_T}$ are defined as follows:

$$lb_{RR_T} = -(\hat{P}_{PV}(k+1) - P_{PV}(k)) + \hat{u}_{RR_T}(k-1) - \frac{0.1 P_{cap}}{60/T} + \lambda\sigma$$

$$ub_{RR_T} = -(\hat{P}_{PV}(k+1) - P_{PV}(k)) + \hat{u}_{RR_T}(k-1) + \frac{0.1 P_{cap}}{60/T} - \lambda\sigma$$

where $\sigma$ is the uncertainty on the PV power prediction and $\lambda$ is a scaling factor of the uncertainty in the PV power prediction. Advantageously, the lower bound $lb_{RR_T}$ and the upper bound $ub_{RR_T}$ provide a range of ramp rate power $\hat{u}_{RR_T}(k)$ that guarantees compliance of the rate of change in the PV power.

In some embodiments, ramp rate controller 1514 determines the ramp rate power $\hat{u}_{RR_T}(k)$ based on whether the PV power $P_{PV}$ is in an up-ramp, a down-ramp, or no-ramp (e.g., the PV power is not changing or changing at a compliant rate) at instant k. Ramp rate controller 1514 may also consider the state-of-charge (SOC) of battery 1106 when determining $\hat{u}_{RR_T}(k)$ Exemplary processes which may be performed by ramp rate controller 1514 to generate values for the ramp rate power $\hat{u}_{RR_T}(k)$ are described in detail in U.S. Patent Application No. 62/239,245. Ramp rate controller 1514 may provide the ramp rate power setpoint $\hat{u}_{RR_T}(k)$ to battery power setpoint generator 1518 for use in determining the battery power setpoint $u_{bat}$.

Controlling Frequency Regulation

Referring again to FIG. 15, controller 1114 is shown to include a frequency regulation controller 1516. Frequency regulation controller 1516 may be configured to determine an amount of power to charge or discharge from battery 1106 for frequency regulation (i.e., $u_{FR}$). Frequency regulation controller 1516 is shown receiving a grid frequency signal from energy grid 1112. The grid frequency signal may specify the current grid frequency $f_{grid}$ of energy grid 1112. In some embodiments, the grid frequency signal also includes a scheduled or desired grid frequency $f_s$ to be achieved by performing frequency regulation. Frequency regulation controller 1516 may determine the frequency regulation setpoint $u_{FR}$ based on the difference between the current grid frequency $f_{grid}$ and the scheduled frequency $f_s$.

In some embodiments, the range within which the grid frequency $f_{grid}$ is allowed to fluctuate is determined by an electric utility. Any frequencies falling outside the permissible range may be corrected by performing frequency regulation. Facilities participating in frequency regulation may be required to supply or consume a contracted power for purposes of regulating grid frequency $f_{grid}$ (e.g., up to 10% of the rated capacity of PV field 1102 per frequency regulation event).

In some embodiments, frequency regulation controller 1516 performs frequency regulation using a dead-band control technique with a gain that is dependent upon the difference $f_e$ between the scheduled grid frequency $f_s$ and the actual grid frequency $f_{grid}$ (i.e., $f_e = f_s - f_{grid}$) and an amount of power required for regulating a given deviation amount of frequency error $f_e$. Such a control technique is expressed mathematically by the following equation:

$$u_{FR}(k) = \min(\max(lb_{FR}, \alpha), ub_{FR})$$

where $lb_{FR}$ and $ub_{FR}$ are the contracted amounts of power up to which power is to be consumed or supplied by a facility. $lb_{FR}$ and $ub_{FR}$ may be based on the rated capacity $P_{cap}$ of PV field 1102 as shown in the following equations:

$$lb_{FR} = 0.1 \times P_{cap}$$

$$ub_{FR} = 0.1 \times P_{cap}$$

The variable $\alpha$ represents the required amount of power to be supplied or consumed from energy grid 1112 to offset the frequency error $f_e$. In some embodiments, frequency regulation controller 1516 calculates $\alpha$ using the following equation:

$$\alpha = K_{FR} \times \text{sign}(f_e) \times \max(|f_e| - d_{band}, 0)$$

where $d_{band}$ is the threshold beyond which a deviation in grid frequency must be regulated and $K_{FR}$ is the control gain. In some embodiments, frequency regulation controller 1516 calculates the control gain $K_{FR}$ as follows:

$$K_{FR} = \frac{P_{cap}}{0.01 \times droop \times f_s}$$

where droop is a parameter specifying a percentage that defines how much power must be supplied or consumed to offset a 1 Hz deviation in the grid frequency. Frequency regulation controller 1516 may calculate the frequency regulation setpoint $u_{FR}$ using these equations and may provide the frequency regulation setpoint to battery power setpoint generator 1518.

Generating Battery Power Setpoints

Still referring to FIG. 15, controller 1114 is shown to include a battery power setpoint generator 1518. Battery power setpoint generator 1518 may be configured to generate the battery power setpoint $u_{bat}$ for battery power inverter 1108. The battery power setpoint $u_{bat}$ is used by battery power inverter 1108 to control an amount of power drawn from battery 1106 or stored in battery 1106. For example, battery power inverter 1108 may draw power from battery 1106 in response to receiving a positive battery power setpoint $u_{bat}$ from battery power setpoint generator 1518 and may store power in battery 1106 in response to receiving a negative battery power setpoint $u_{bat}$ from battery power setpoint generator 1518.

Battery power setpoint generator 1518 is shown receiving the ramp rate power setpoint $u_{RR}$ from ramp rate controller 1514 and the frequency regulation power setpoint $u_{FR}$ from frequency regulation controller 1516. In some embodiments, battery power setpoint generator 1518 calculates a value for the battery power setpoint $u_{bat}$ by adding the ramp rate power setpoint $u_{RR}$ and the frequency response power setpoint $u_{FR}$. For example, battery power setpoint generator 1518 may calculate the battery power setpoint $u_{bat}$ using the following equation:

$$u_{bat} = u_{RR} + u_{FR}$$

In some embodiments, battery power setpoint generator 1518 adjusts the battery power setpoint $u_{bat}$ based on a battery power limit for battery 1106. For example, battery power setpoint generator 1518 may compare the battery power setpoint $u_{bat}$ with the battery power limit battPowerLimit. If the battery power setpoint is greater than the battery power limit (i.e., $u_{bat}$>battPowerLimit), battery power setpoint generator 1518 may replace the battery power setpoint $u_{bat}$ with the battery power limit. Similarly, if the battery power setpoint is less than the negative of the battery power limit (i.e., $u_{bat}$<-battPowerLimit), battery power setpoint generator 1518 may replace the battery power setpoint $u_{bat}$ with the negative of the battery power limit.

In some embodiments, battery power setpoint generator 1518 causes frequency regulation controller 1516 to update the frequency regulation setpoint $u_{FR}$ in response to replacing the battery power setpoint $u_{bat}$ with the battery power limit battPowerLimit or the negative of the battery power limit -battPowerLimit. For example, if the battery power setpoint $u_{bat}$ is replaced with the positive battery power limit battPowerLimit, frequency regulation controller 1516 may update the frequency regulation setpoint $Li_{pp}$ using the following equation:

$$u_{FR}(k) = \text{battPowerLimit} - \hat{u}_{RR_T}(k)$$

Similarly, if the battery power setpoint $u_{bat}$ is replaced with the negative battery power limit -battPowerLimit, frequency regulation controller 1516 may update the frequency regulation setpoint $u_{FR}$ using the following equation:

$$u_{FR}(k) = -\text{battPowerLimit} - \hat{u}_{RR_T}(k)$$

These updates ensure that the amount of power used for ramp rate control $u_{RR_T}(k)$ and the amount of power used for frequency regulation $u_{FR}(k)$ can be added together to calculate the battery power setpoint $u_{bat}$. Battery power setpoint generator 1518 may provide the battery power setpoint $u_{bat}$ to battery power inverter 1108 and to PV power setpoint generator 1520.

Generating PV Power Setpoints

Still referring to FIG. 15, controller 1114 is shown to include a PV power setpoint generator 1520. PV power setpoint generator 1520 may be configured to generate the PV power setpoint $u_{PV}$ for PV field power inverter 1104. The PV power setpoint $u_{PV}$ is used by PV field power inverter 1104 to control an amount of power from PV field 1102 to provide to POI 1110.

In some embodiments, PV power setpoint generator 1520 sets a default PV power setpoint $u_{PV}(k)$ for instant k based on the previous value of the PV power $P_{PV}(k-1)$ at instant k−1. For example, PV power setpoint generator 1520 may increment the previous PV power $P_{PV}(k-1)$ with the compliance limit as shown in the following equation:

$$u_{PV}(k) = P_{PV}(k-1) + \frac{0.1 P_{cap}}{60/T} - \lambda\sigma$$

This guarantees compliance with the ramp rate compliance limit and gradual ramping of the PV power output to energy grid 1112. The default PV power setpoint may be useful to guarantee ramp rate compliance when the system is turned on, for example, in the middle of a sunny day or when an up-ramp in the PV power output $P_{PV}$ is to be handled by limiting the PV power at PV power inverter 1104 instead of charging battery 1106.

In some embodiments, PV power setpoint generator 1520 updates the PV power setpoint $u_{PV}(k)$ based on the value of the battery power setpoint $u_{bat}(k)$ so that the total power provided to POI 1110 does not exceed a POI power limit. For example, PV power setpoint generator 1520 may use the PV power setpoint $u_{PV}(k)$ and the battery power setpoint $u_{bat}(k)$ to calculate the total power $P_{POI}(k)$ at point of intersection 1110 using the following equation:

$$P_{POI}(k) = u_{bat}(k) + u_{PV}(k)$$

PV power setpoint generator 1520 may compare the calculated power $P_{POI}(k)$ with a power limit for POI 1110 (i.e., POIPowerLimit). If the calculated power $P_{POI}(k)$ exceeds the POI power limit (i.e., $P_{POI}(k)$>POIPowerLimit), PV power setpoint generator 1520 may replace the calculated power $P_{POI}(k)$ with the POI power limit. PV power setpoint generator 1520 may update the PV power setpoint $u_{PV}(k)$ using the following equation:

$$u_{PV}(k) = \text{POIPowerLimit} - u_{bat}(k)$$

This ensures that the total power provided to POI 1110 does not exceed the POI power limit by causing PV field power inverter 1104 to limit the PV power. PV power setpoint generator 1520 may provide the PV power setpoint $u_{PV}$ to PV field power inverter 1104.

Frequency Response Control System

Figure 16:
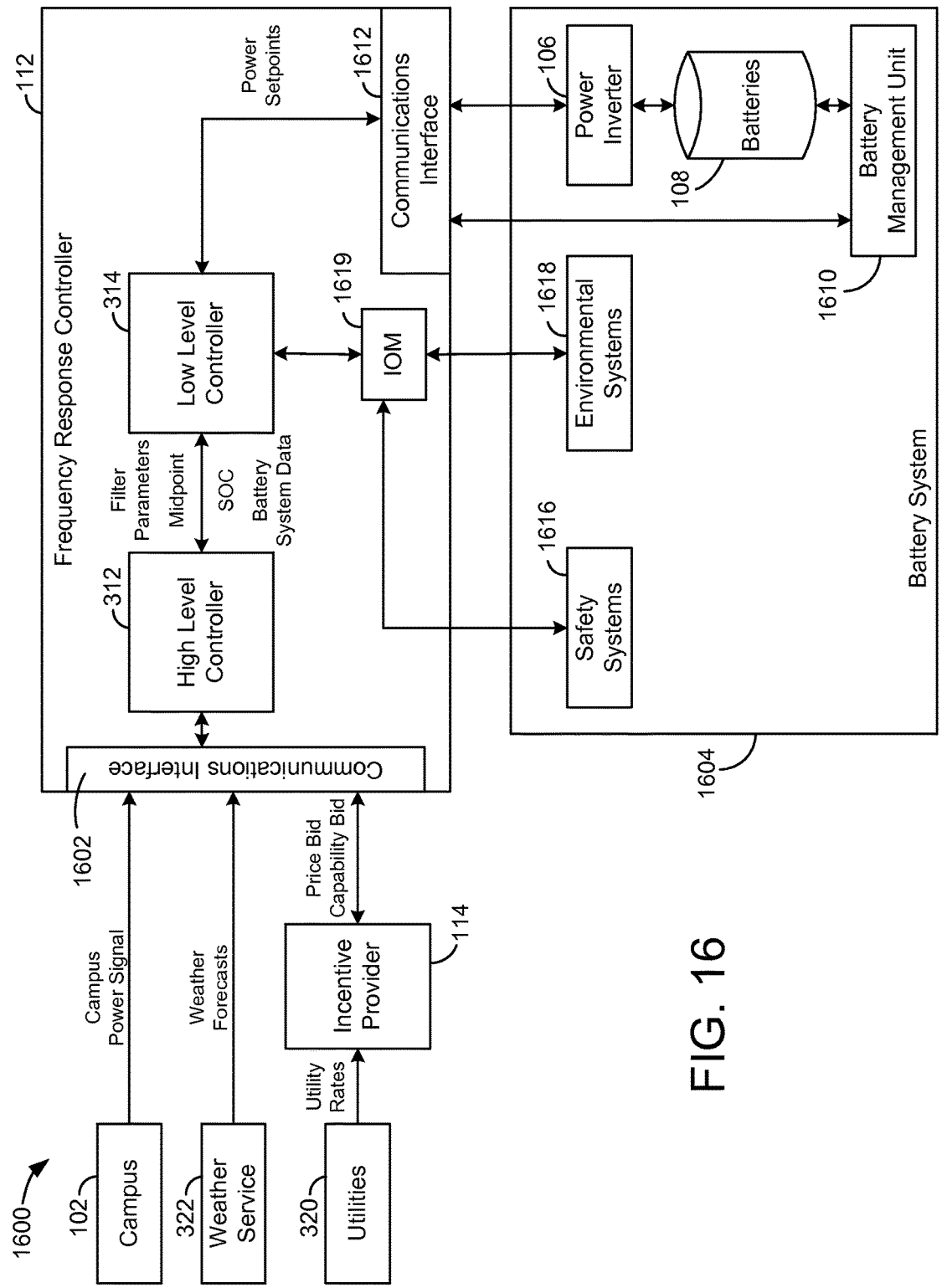
FIG. 16 is a block diagram of a frequency response control system, according to an exemplary embodiment.

Referring now to FIG. 16, a block diagram of a frequency response control system 1600 is shown, according to exemplary embodiment. Control system 1600 is shown to include frequency response controller 112, which may be the same or similar as previously described. For example, frequency response controller 112 may be configured to perform an optimization process to generate values for the bid price, the capability bid, and the midpoint b. In some embodiments, frequency response controller 112 generates values for the bids and the midpoint b periodically using a predictive optimization scheme (e.g., once every half hour, once per frequency response period, etc.). Frequency response controller 112 may also calculate and update power setpoints for power inverter 106 periodically during each frequency response period (e.g., once every two seconds). As shown in FIG. 16, frequency response controller 112 is in communication with one or more external systems via communication interface 1602. Additionally, frequency response controller 112 is also shown as being in communication with a battery system 1604.

In some embodiments, the interval at which frequency response controller 112 generates power setpoints for power inverter 106 is significantly shorter than the interval at which frequency response controller 112 generates the bids and the midpoint b. For example, frequency response controller 112 may generate values for the bids and the midpoint b every half hour, whereas frequency response controller 112 may generate a power setpoint for power inverter 106 every two seconds. The difference in these time scales allows frequency response controller 112 to use a cascaded optimization process to generate optimal bids, midpoints b, and power setpoints.

In the cascaded optimization process, high level controller 312 determines optimal values for the bid price, the capability bid, and the midpoint b by performing a high level optimization. The high level controller 312 may be a centralized server within the frequency response controller 112. The high level controller 312 may be configured to execute optimization control algorithms, such as those described herein. In one embodiment, the high level controller 312 may be configured to run an optimization engine, such as a MATLAB optimization engine.

Further, the cascaded optimization process allows for multiple controllers to process different portions of the optimization process. As will be described below, the high level controller 312 may be used to perform optimization functions based on received data, while a low level controller 314 may receive optimization data from the high level controller 312 and control the battery system 1604 accordingly. By allowing independent platforms to perform separation portions of the optimization, the individual platforms may be scaled and tuned independently. For example, the controller 112 may be able to be scaled up to accommodate a larger battery system 1604 by adding additional low level controllers to control the battery system 1604. Further, the high level controller 312 may be modified to provide additional computing power for optimizing battery system 1604 in more complex systems. Further, modifications to either the high level controller 312 or the low level controller 314 will not affect the other, thereby increasing overall system stability and availability.

In system 1600, high level controller 312 may be configured to perform some or all of the functions previously described with reference to FIGS. 3-4. For example, high level controller 312 may select midpoint b to maintain a constant state-of-charge in battery 108 (i.e., the same state-of-charge at the beginning and end of each frequency response period) or to vary the state-of-charge in order to optimize the overall value of operating system 1600 (e.g., frequency response revenue minus energy costs and battery degradation costs), as described below. High level controller 312 may also determine filter parameters for a signal filter (e.g., a low pass filter) used by a low level controller 314.

The low level controller 314 may be a standalone controller. In one embodiment, the low level controller 314 is a Network Automation Engine (NAE) controller from Johnson Controls. However, other controllers having the required capabilities are also contemplated. The required capabilities for the low level controller 314 may include having sufficient memory and computing power to run the applications, described below, at the required frequencies. For example, certain optimization control loops (described below) may require control loops running at 200 ms intervals. However, intervals of more than 200 ms and less than 200 ms may also be required. These control loops may require reading and writing data to and from the battery inverter. The low level controller 314 may also be required to support Ethernet connectivity (or other network connectivity) to connect to a network for receiving both operational data, as well as configuration data. The low level controller 314 may be configured to perform some or all of the functions previously described with reference to FIGS. 3-5.

The low level controller 314 may be capable of quickly controlling one or more devices around one or more setpoints. For example, low level controller 314 uses the midpoint b and the filter parameters from high level controller 312 to perform a low level optimization in order to generate the power setpoints for power inverter 106. Advantageously, low level controller 314 may determine how closely to track the desired power $P_{POI}^*$ at the point of interconnection 110. For example, the low level optimization performed by low level controller 314 may consider not only frequency response revenue but also the costs of the power setpoints in terms of energy costs and battery degradation. In some instances, low level controller 314 may determine that it is deleterious to battery 108 to follow the regulation exactly and may sacrifice a portion of the frequency response revenue in order to preserve the life of battery 108.

Low level controller 314 may also be configured to interface with one or more other devises or systems. For example, the low level controller 314 may communicate with the power inverter 106 and/or the battery management unit 1610 via a low level controller communication interface 1612. Communications interface 1612 may include wired or wireless interfaces (e.g., jacks, antennas, transmitters, receivers, transceivers, wire terminals, etc.) for conducting data communications with various systems, devices, or networks. For example, communications interface 1612 may include an Ethernet card and port for sending and receiving data via an Ethernet-based communications network and/or a WiFi transceiver for communicating via a wireless communications network. Communications interface 1612 may be configured to communicate via local area networks or wide area networks (e.g., the Internet, a building WAN, etc.) and may use a variety of communications protocols (e.g., BACnet, MODBUS, CAN, IP, LON, etc.).

As described above, the low level controller 314 may communicate setpoints to the power inverter 106. Furthermore, the low level controller 314 may receive data from the battery management unit 1610 via the communication interface 1612. The battery management unit 1610 may provide data relating to a state of charge (SOC) of the batteries 108. The battery management unit 1610 may further provide data relating to other parameters of the batteries 108, such as temperature, real time or historical voltage level values, real time or historical current values, etc. The low level controller 314 may be configured to perform time critical functions of the frequency response controller 112. For example, the low level controller 314 may be able to perform fast loop (PID, PD, PI, etc.) controls in real time.

The low level controller 314 may further control a number of other systems or devices associated with the battery system 1604. For example, the low level controller may control safety systems 1616 and/or environmental systems 1618. In one embodiment, the low level controller 314 may communicate with and control the safety systems 1616 and/or the environmental systems 1618 through an input/output module (TOM) 1619. In one example, the IOM may be an TOM controller from Johnson Controls. The IOM may be configured to receive data from the low level controller and then output discrete control signals to the safety systems 1616 and/or environmental systems 1618. Further, the IOM 1619 may receive discrete outputs from the safety systems 1616 and/or environmental systems 320, and report those values to the low level controller 314. For example, the TOM 1619 may provide binary outputs to the environmental system 1618, such as a temperature setpoint; and in return may receive one or more analog inputs corresponding to temperatures or other parameters associated with the environmental systems 1618. Similarly, the safety systems 1616 may provide binary inputs to the TOM 1619 indicating the status of one or more safety systems or devices within the battery system 1604. The IOM 1619 may be able to process multiple data points from devices within the battery system 1604. Further, the TOM may be configured to receive and output a variety of analog signals (4-20 mA, 0-5V, etc.) as well as binary signals.

The environmental systems 1618 may include HVAC devices such as roof-top units (RTUs), air handling units (AHUs), etc. The environmental systems 1618 may be coupled to the battery system 1604 to provide environmental regulation of the battery system 1604. For example, the environmental systems 1618 may provide cooling for the battery system 1604. In one example, the battery system 1604 may be contained within an environmentally sealed container. The environmental systems 1618 may then be used to not only provide airflow through the battery system 1604, but also to condition the air to provide additional cooling to the batteries 108 and/or the power inverter 106. The environmental systems 1618 may also provide environmental services such as air filtration, liquid cooling, heating, etc. The safety systems 1616 may provide various safety controls and interlocks associated with the battery system 1604. For example, the safety systems 1616 may monitor one or more contacts associated with access points on the battery system. Where a contact indicates that an access point is being accessed, the safety systems 1616 may communicate the associated data to the low level controller 314 via the TOM 1619. The low level controller may then generate and alarm and/or shut down the battery system 1604 to prevent any injury to a person accessing the battery system 1604 during operation. Further examples of safety systems can include air quality monitors, smoke detectors, fire suppression systems, etc.

Still referring to FIG. 16, the frequency response controller 112 is shown to include the high level controller communications interface 1602. Communications interface 1602 may include wired or wireless interfaces (e.g., jacks, antennas, transmitters, receivers, transceivers, wire terminals, etc.) for conducting data communications with various systems, devices, or networks. For example, communications interface 1602 may include an Ethernet card and port for sending and receiving data via an Ethernet-based communications network and/or a WiFi transceiver for communicating via a wireless communications network. Communications interface 1602 may be configured to communicate via local area networks or wide area networks (e.g., the Internet, a building WAN, etc.) and may use a variety of communications protocols (e.g., BACnet, IP, LON, etc.).

Communications interface 1602 may be a network interface configured to facilitate electronic data communications between frequency response controller 112 and various external systems or devices (e.g., campus 102, energy grid 104, incentive provider 114, utilities 320, weather service 322, etc.). For example, frequency response controller 112 may receive inputs from incentive provider 114 indicating an incentive event history (e.g., past clearing prices, mileage ratios, participation requirements, etc.) and a regulation signal. Further, the incentive provider 114 may communicate utility rates provided by utilities 320. Frequency response controller 112 may receive a campus power signal from campus 102, and weather forecasts from weather service 322 via communications interface 1602. Frequency response controller 112 may provide a price bid and a capability bid to incentive provider 114 and may provide power setpoints to power inverter 106 via communications interface 1602.

Data Fusion

Turning now to FIG. 17, a block diagram illustrating data flow into the data fusion module 428 is shown, according to some embodiments. As shown in FIG. 17, the data fusion module 428 may receive data from multiple devices and/or systems. In one embodiment, the data fusion module 428 may receive all data received by the high level controller 312. For example, the data fusion module 428 may receive campus data from the campus 102. Campus data may include campus power requirements, campus power requests, occupancy planning, historical use data, lighting schedules, HVAC schedules, etc. In a further embodiment, the data fusion module 428 may receive weather data from the weather service 322. The weather service 322 may include current weather data (temperature, humidity, barometric pressure, etc.), weather forecasts, historical weather data, etc. In a still further embodiment, the data fusion module 428 may receive utility data from the utilities 320. In some examples, the data fusion module 428 may receive some or all of the utility data via the incentive provider 114. Examples of utility data may include utility rates, future pricing schedules, anticipated loading, historical data, etc. Further, the incentive provider 114 may further add data such as capability bid requests, price bid requests, incentive data, etc.

The data fusion module 428 may further receive data from the low level controller 314. In some embodiments, the low level controller may receive data from multiple sources, which may be referred to collectively as battery system data. For example, the low level controller 314 may receive inverter data from power inverter 106. Example inverter data may include inverter status, feedback points, inverter voltage and current, power consumption, etc. The low level controller 314 may further receive battery data from the battery management unit 1610. Example battery data may include battery SOC, depth of discharge data, battery temperature, battery cell temperatures, battery voltage, historical battery use data, battery health data, etc. In other embodiment, the low level controller 314 may receive environmental data from the environmental systems 1618. Examples of environmental data may include battery system temperature, battery system humidity, current HVAC settings, setpoint temperatures, historical HVAC data, etc. Further, the low level controller 314 may receive safety system data from the safety systems 1616. Safety system data may include access contact information (e.g. open or closed indications), access data (e.g. who has accessed the battery system 1604 over time), alarm data, etc. In some embodiments, some or all of the data provided to the low level controller 314 is via an input/output module, such as TOM 1619. For example, the safety system data and the environmental system data may be provided to the low level controller 314 via an input/output module, as described in detail in regards to FIG. 16.

The low level controller 314 may then communicate the battery system data to the data fusion module 428 within the high level controller 312. Additionally, the low level controller 314 may provide additional data to the data fusion module 428, such as setpoint data, control parameters, etc.

The data fusion module 428 may further receive data from other stationary power systems, such as a photovoltaic system 1702. For example, the photovoltaic system 1702 may include one or more photovoltaic arrays and one or more photovoltaic array power inverters. The photovoltaic system 1702 may provide data to the data fusion module 428 such as photovoltaic array efficiency, photovoltaic array voltage, photovoltaic array inverter output voltage, photovoltaic array inverter output current, photovoltaic array inverter temperature, etc. In some embodiments, the photovoltaic system 1702 may provide data directly to the data fusion module 428 within the high level controller 312. In other embodiments, the photovoltaic system 1702 may transmit the data to the low level controller 314, which may then provide the data to the data fusion module 428 within the high level controller 312.

The data fusion module 428 may receive some or all of the data described above, and aggregate the data for use by the high level controller 312. In one embodiment, the data fusion module 428 is configured to receive and aggregate all data received by the high level controller 312, and to subsequently parse and distribute the data to one or more modules of the high level controller 312, as described above. Further, the data fusion module 428 may be configured to combine disparate heterogeneous data from the multiple sources described above, into a homogeneous data collection for use by the high level controller 312. As described above, data from multiple inputs is required to optimize the battery system 1604, and the data fusion module 428 can gather and process the data such that it can be provided to the modules of the high level controller 312 efficiently and accurately. For example, extending battery lifespan is critical for ensuring proper utilization of the battery system 1604. By combining battery data such as temperature and voltage, along with external data such as weather forecasts, remaining battery life may be more accurately determined by the battery degradation estimator 418, described above. Similarly, multiple data points from both external sources and the battery system 1604 may allow for more accurate midpoint estimations, revenue loss estimations, battery power loss estimation, or other optimization determination, as described above.

Figure 18:
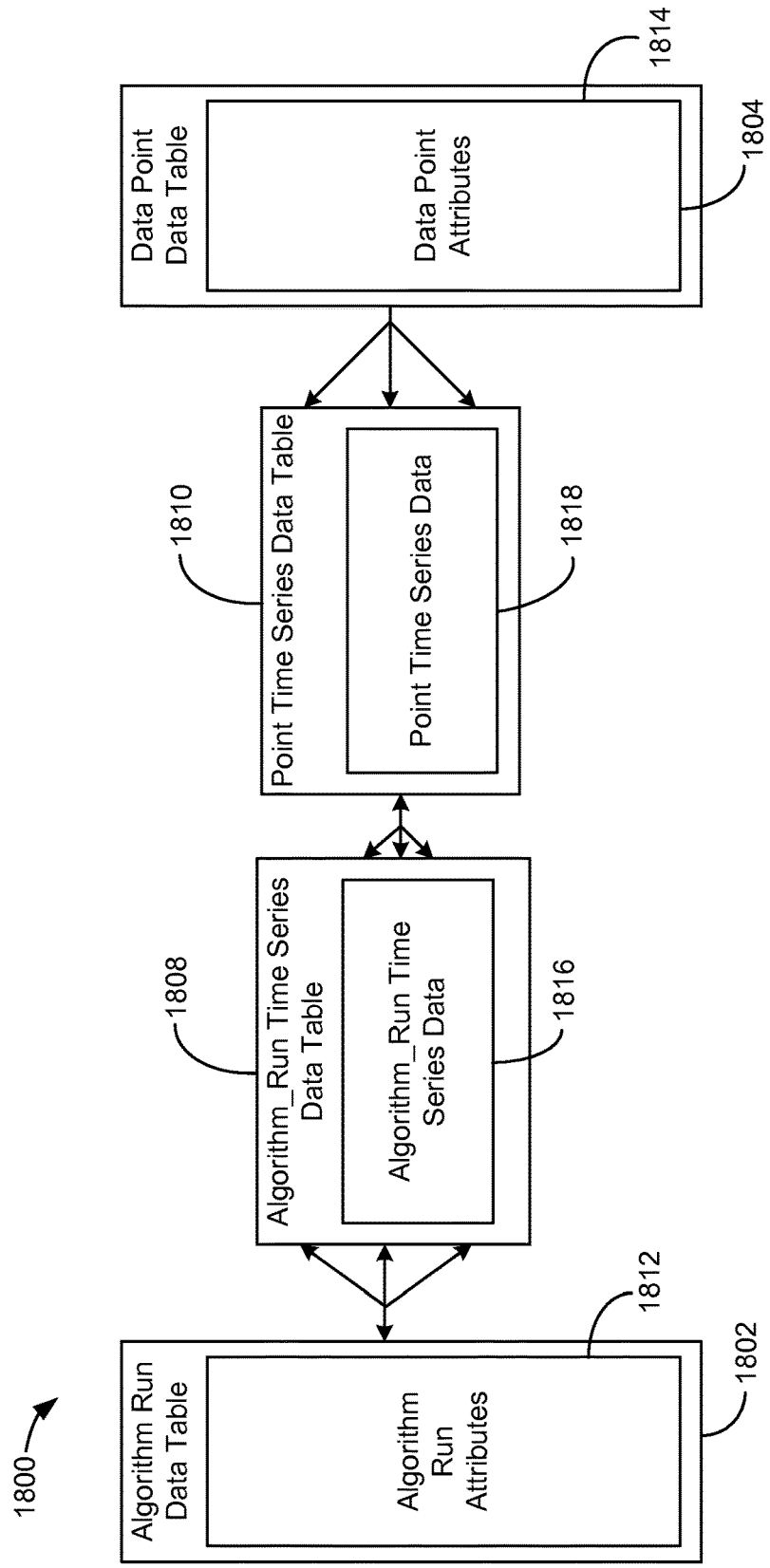
FIG. 18 is a block diagram illustrating a database schema which can be used in the frequency response control system of FIG. 16, according to an exemplary embodiment.

Turning now to FIG. 18, a block diagram showing a database schema 1800 of the system 1600 is shown, according to some embodiments. The schema 1800 is shown to include an algorithm run data table 1802, a data point data table 1804, an algorithm_run time series data table 1808 and a point time series data table 1810. The data tables 1802, 1804, 1808, 1810 may be stored on the memory of the high level controller 312. In other embodiments, the data tables 1802, 1804, 1808, 1810 may be stored on an external storage device and accessed by the high level controller as required.

As described above, the high level controller performs calculation to generate optimization data for the battery optimization system 1600. These calculation operations (e.g. executed algorithms) may be referred to as "runs." As described above, one such run is the generation of a midpoint b which can subsequently be provided to the low level controller 314 to control the battery system 1604. However, other types of runs are contemplated. Thus, for the above described run, the midpoint b is the output of the run. The detailed operation of a run, and specifically a run to generate midpoint b is described in detail above.

The algorithm run data table 1802 may include a number of algorithm run attributes 1812. Algorithm run attributes 1812 are those attributes associated with the high level controller 312 executing an algorithm, or "run", to produce an output. The runs can be performed at selected intervals of time. For example, the run may be performed once every hour. However, in other examples, the run may be performed more than once every hour, or less than once every hour. The run is then performed and by the high level controller 312 and a data point is output, for example a midpoint b, as described above. The midpoint b may be provided to the low level controller 314 to control the battery system 1604, described above in the description of the high level controller 1604 calculating the midpoint b.

In one embodiment, the algorithm run attributes contain all the information necessary to perform the algorithm or run. In a further embodiment, the algorithm run attributes 1812 are associated with the high level controller executing an algorithm to generate a midpoint, such as midpoint b described in detail above. Example algorithm run attributes may include an algorithm run key, an algorithm run ID (e.g. "midpoint," "endpoint," "temperature_setpoint," etc.), Associated Run ID (e.g. name of the run), run start time, run stop time, target run time (e.g. when is the next run desired to start), run status, run reason, fail reason, plant object ID (e.g. name of system), customer ID, run creator ID, run creation date, run update ID, and run update date. However, this list is for example only, as it is contemplated that the algorithm run attributes may contain multiple other attributes associated with a given run.

As stated above, the algorithm run data table 1802 contains attributes associated with a run to be performed by the high level controller 312. In some embodiments, the output of a run, is one or more "points," such as a midpoint. The data point data table 1804 contains data point attributes 1814 associated with various points that may be generated by a run. These data point attributes 1814 are used to describe the characteristics of the data points. For example, the data point attributes may contain information associated with a midpoint data point. However, other data point types are contemplated. Example attributes may include point name, default precision (e.g. number of significant digits), default unit (e.g. cm, degrees Celsius, voltage, etc.), unit type, category, fully qualified reference (yes or no), attribute reference ID, etc. However, other attributes are further considered.

The algorithm_run time series data table 1808 may contain time series data 1816 associated with a run. In one embodiment, the algorithm_run time series data 1816 includes time series data associated with a particular algorithm_run ID. For example, a run associated with determining the midpoint b described above, may have an algorithm_run ID of Midpoint_Run. The algorithm_run time series data table 1808 may therefore include algorithm_run time series data 1816 for all runs performed under the algorithm ID Midpoint_Run. Additionally, the algorithm_run time series data table 1808 may also contain run time series data associated with other algorithm IDs as well. The run time series data 1816 may include past data associated with a run, as well as expected future information. Example run time series data 1816 may include final values of previous runs, the unit of measure in the previous runs, previous final value reliability values, etc. As an example, a "midpoint" run may be run every hour, as described above. The algorithm_run time series data 1816 may include data related to the previously performed runs, such as energy prices over time, system data, etc. Additionally, the algorithm_run time series data 1816 may include point time series data associated with a given point, as described below.

The point time series data table 1810 may include the point time series data 1818. The point time series data 1818 may include time series data associated with a given data "point." For example, the above described midpoint b may have a point ID of "Midpoint." The point time series data table 1810 may contain point time series data 1818 associated with the "midpoint" ID, generated over time. For example, previous midpoint values may be stored in the point time series data table 1818 for each performed run. The point time series data table 1810 may identify the previous midpoint values by time (e.g. when the midpoint was used by the low level controller 314), and may include information such as the midpoint value, reliability information associated with the midpoint, etc. In one embodiment, the point time series data table 1818 may be updated with new values each time a new "midpoint" is generated via a run. Further, the point time series data 1816 for a given point may include information independent of a given run. For example, the high level controller 312 may monitor other data associated with the midpoint, such as regulation information from the low level controller, optimization data, etc., which may further be stored in the point time series data table 1810 as point time series data 1818.

The above described data tables may be configured to have an association or relational connection between them. For example, as shown in FIG. 18, the algorithm_run data table 1802 may have a one-to-many association or relational relationship with the algorithm_run time series association table 1808, as there may be many algorithm_run time series data points 1816 for each individual algorithm_run ID. Further, the data point data table 1804 may have a one-to many relationship with the point time series data table 1810, as there may be many point time series data points 1818 associated with an individual point. Further, the point time series data table 1810 may have a one to many relationship with the algorithm_run time series data table 1808, as there may be multiple different point time series data 1818 associated with a run. Accordingly, the algorithm_run data table 1802 has a many-to-many relationship with the data point data table 1804, as there may be many points, and/or point time series data 1818, associated with may run types; and, there may be multiple run types associated with many points By using the above mentioned association data tables 1802, 1804, 1808, 1810, optimization of storage space required for storing time series data may be achieved. With the addition of additional data used in a battery optimization system, such as battery optimization system 1600 described above, vast amounts of time series data related to data provided by external sources (weather data, utility data, campus data, building automation systems (BAS) or building management systems (BMS)), and internal sources (battery systems, photovoltaic systems, etc.) is generated. By utilizing association data tables, such as those described above, the data may be optimally stored and accessed.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A frequency response optimization system comprising:
   a battery configured to store and discharge electric power;
   a power inverter configured to use battery power setpoints to control an amount of the electric power stored or discharged from the battery; and
   a frequency response controller configured to:
   receive a regulation signal from an incentive provider in a frequency response (FR) program, wherein the regulation signal indicates a proportion of a regulation award power amount to add to or remove from an electric grid relative to a frequency response midpoint,
   predict future values of the regulation signal for each time within an optimization time period,
   use the predicted values of the regulation signal to generate the battery power setpoints for the power inverter for each time within the optimization time period; and operate the power inverter using the generated battery power setpoints to cause the battery to store or discharge the electric power.

2. The system of claim 1, wherein the frequency response controller is configured to use an autoregressive model to predict the future values of the regulation signal based on a history of past values of the regulation signal.

3. The system of claim 1, wherein the frequency response controller comprises a low pass filter configured to filter the predicted values of the regulation signal;
wherein the frequency response controller is configured to use the filtered values of the regulation signal to generate the battery power setpoints.

4. The system of claim 1, wherein the frequency response controller is configured to generate an objective function comprising:
an estimated amount of frequency response revenue that will result from the battery power setpoints; and
an estimated cost of battery degradation that will result from the battery power setpoints.

5. The system of claim 4, wherein the frequency response controller is configured to:
use dynamic programming to select scaling coefficients for the regulation signal; and
adjust the scaling coefficients to achieve an optimal value for the objective function.

6. The system of claim 1, wherein the frequency response controller is configured to:
calculate a frequency response performance score that will result from the battery power setpoints; and
use the frequency response performance score to estimate an amount of frequency response revenue that will result from the battery power setpoints.

7. The system of claim 1, wherein the frequency response controller is configured to:
use a battery life model to estimate an amount of battery degradation that will result from the battery power setpoints; and
use the estimated amount of battery degradation to determine a cost of the battery degradation.

8. The system of claim 7, wherein the battery life model comprises a plurality of variables that depend on the battery power setpoints, the variables comprising at least one of:
a temperature of the battery;
a state of charge of the battery;
a depth of discharge of the battery;
a power ratio of the battery; and
an effort ratio of the battery.

9. The system of claim 1, wherein the frequency response controller comprises:
a high level controller configured to generate filter parameters based on the predicted values of the regulation signal; and
a low level controller configured to use the filter parameters to filter the predicted regulation signal and generate the battery power setpoints using the filtered regulation signal.

10. The system of claim 1, further comprising a campus having a campus power usage and a point of intersection at which the campus power usage combines with the electric power discharged from the battery;
wherein the frequency response controller is configured to generate the battery power setpoints based on both the campus power usage and the predicted future values of the regulation signal.

11. A method for generating battery power setpoints in a frequency response optimization system, the method comprising:
receiving a frequency regulation signal from an incentive provider in a frequency response (FR) program, wherein the frequency regulation signal indicates a proportion of a regulation award power amount to add to or remove from an electric grid relative to a frequency response midpoint;
predicting future values of the frequency regulation signal for each time within an optimization time period;
using the predicted values of the frequency regulation signal to generate battery power setpoints for each time within the optimization time period;
providing the battery power setpoints to a power inverter; and
using the battery power setpoints to control an amount of electric power stored or discharged by the battery in response to the frequency response signal.

12. The method of claim 11, wherein predicting the future values of the frequency regulation signal comprises using an autoregressive model to predict the future values of the frequency regulation signal based on a history of past values of the frequency regulation signal.

13. The method of claim 11, further comprising:
filtering the predicted values of the regulation signal using a low pass filter; and
using the filtered values of the frequency regulation signal to generate the battery power setpoints.

14. The method of claim 11, further comprising generating an objective function comprising:
an estimated amount of frequency response revenue that will result from the battery power setpoints; and
an estimated cost of battery degradation that will result from the battery power setpoints.

15. The method of claim 14, further comprising using dynamic programming to select scaling coefficients for the regulation signal and adjust the scaling coefficients to achieve an optimal value for the objective function.

16. The method of claim 11, further comprising:
calculating a frequency response performance score that will result from the battery power setpoints; and
using the frequency response performance score to estimate an amount of frequency response revenue that will result from the battery power setpoints.

17. The method of claim 11, further comprising:
using a battery life model to estimate an amount of battery degradation that will result from the battery power setpoints; and
using the estimated amount of battery degradation to determine a cost of the battery degradation.

18. The method of claim 17, wherein the battery life model comprises a plurality of variables that depend on the battery power setpoints, the variables comprising at least one of:
a temperature of the battery;
a state of charge of the battery;
a depth of discharge of the battery;
a power ratio of the battery; and
an effort ratio of the battery.

19. The method of claim 11, further comprising:
using a high level controller to generate filter parameters based on the predicted values of the frequency regulation signal; and
using a low level controller to filter the predicted future values of the frequency regulation signal based on the filter parameters and determine the optimal battery power setpoints using the filtered predicted future values of the frequency regulation signal.

20. The method of claim 11, wherein the frequency regulation system comprises a campus having a campus power usage and a point of intersection at which the campus power usage combines with the electric power discharged from the battery;

the method further comprising determining the optimal battery power setpoints based on both the campus power usage and the predicted future values of the frequency response signal.

* * * * *